United States Patent [19]
Anami et al.

[11] Patent Number: 5,694,354
[45] Date of Patent: Dec. 2, 1997

[54] STATIC RANDOM ACCESS MEMORY DEVICE HAVING A SINGLE BIT LINE CONFIGURATION

[75] Inventors: Kenji Anami; Toshihiko Hirose; Shuji Murakami; Kojiro Yuzuriha, all of Hyogo-ken, Japan

[73] Assignee: Mitsubishi Denki Kabushiki Kaisha, Tokyo, Japan

[21] Appl. No.: 708,063

[22] Filed: Aug. 12, 1996

Related U.S. Application Data

[62] Division of Ser. No. 467,632, Jun. 6, 1995, Pat. No. 5,572,469, which is a division of Ser. No. 25,470, Mar. 3, 1993.

[30] Foreign Application Priority Data

Apr. 30, 1992 [JP] Japan ................................. 4-111408
Jul. 29, 1992 [JP] Japan ................................. 4-202603

[51] Int. Cl.⁶ ........................................ G11C 11/00
[52] U.S. Cl. ........................................ 365/154; 365/156
[58] Field of Search ........................ 365/154, 156, 365/189.01

[56] References Cited

U.S. PATENT DOCUMENTS 3,539,839  11/1970  Igarashi .................................. 365/154
4,984,201  1/1991  Sato et al. ............................. 365/156

FOREIGN PATENT DOCUMENTS 56-107394  8/1981  Japan .

OTHER PUBLICATIONS

"16K CMOS/SOS Asynchronous Static RAM", Roger G. Stewart et al., Digest of Technical Papers, 1979, IEEE International Solid–State Circuits Conference, pp. 104–104, 286.

"A Dynamic Three–State Memory Cell for High–Density Associative Processors", Federick P. Herrmann et al., 1990 Symposium on BLSI Circuits, p. 73–74.

"A Novel Cell Structure for 4M Bit Full Feature EEPROM and Beyond", N. Ajika et al., Technical Digest, International Electron Devices Meeting 1991, pp. 11.1.1–11.1.4.

"Non–Inverting Conditions of a Flipflop Circuit", Institute of Electronics, Information and Communication Engineers of Japan, Showa 54, vol. 2, pp. 2–185.

Primary Examiner—Son T. Dinh
Attorney, Agent, or Firm—Lowe, Price, LeBlanc & Becker

[57] ABSTRACT

A static random access memory (SRAM) is disclosed having a single bit line configuration. One memory cell includes access gate transistors Q5, Q6 connected in series between a data storage circuit 1 and a single bit line BL. In a writing operation, the gate electrodes of the transistors Q5, Q6 are boosted to a level exceeding the supply voltage by a X word line boosting circuit 7 and a Y word line boosting circuit 8 to bring the data storage circuit to an unstable data storage state in a memory cell selected by a row address signal and a column address signal. Data writing is carried out only in a desired memory cell, and erroneous data writing to other memory cells is prevented.

2 Claims, 39 Drawing Sheets

STATIC RANDOM ACCESS MEMORY DEVICE HAVING A SINGLE BIT LINE CONFIGURATION

This application is a division of application Ser. No. 08/467,632, filed Jun. 6, 1995, now U.S. Pat. No. 5,572,469 which is a division of application Ser. No. 08/025,470, filed Mar. 3, 1993.

BACKGROUND OF THE INVENTION

1. Field of the Invention

The present invention relates to static random access memory devices, and more particularly, to a static random access memory device having a single bit line configuration.

2. Description of the Background Art

A static random access memory (referred to as "SRAM" hereinafter) is used in various electronic devices such as computers. There is a strong demand for lower power consumption and increase in integration density in semiconductor memories as the functions of such electronic devices attain a higher level. Under such requirements, an SRAM having a single bit line configuration is conventionally known.

FIG. 55 is a circuit diagram of a memory cell for an SRAM having a single bit line configuration. The circuit of FIG. 55 is disclosed in a literature titled "16K CMOS/SOS Asynchronous Static RAM" (Digest of Technical Papers, pp. 104–105, 1979, IEEE, ISSCC). Referring to FIG. 55, the memory cell includes PMOS transistors Q21 and Q22, NMOS transistors Q23, Q24, and Q25, and diodes D1 and D2. A data storage circuit, i.e. a latch circuit is implemented by transistors Q21–Q24, and diodes D1 and D2. The data storage circuit is connected to a single bit line BL via an access gate transistor Q25. The gate of the transistors Q25 is connected to a word line WL.

In writing operation, the gate voltage of the transistor Q25 is boosted via the word line WL. Therefore, the transistor Q25 is turned on, whereby data determined by the potential on the bit line BL is stored in the data storage circuit.

The memory cell of FIG. 55 is formed of five MOS transistors, whereby the occupying area on a semiconductor substrate can be reduced. However, the power consumption was great. For the purpose of reducing power consumption, the applicant of the present application has proposed the circuit configuration shown in FIG. 56.

FIG. 56 is a circuit diagram of a memory cell for a SRAM proposed previously by the applicant of the present invention. Referring to FIG. 56, the memory cell MC includes PMOS transistors Q31 and Q32 and NMOS transistors, Q33 and Q34 forming a data storage circuit, and an NMOS transistor Q35 serving as an access gate. The data storage circuit 1 is connected to a single bit line BLj via the transistor Q35. The ground side of the data storage circuit 1 is connected to a source line SLj.

In writing operation, the word line WL1 is boosted by a word line boosting circuit 307, whereby the gate voltage of the transistor Q35 is boosted. The transistor Q35 is turned on by a lower conductance, whereby data determined by the potential of the bit line BLj is stored in the data storage circuit 1.

When a column including a memory cell MC is not accessed, a source line potential control circuit 308 brings the source line SLj to an intermediate potential Vm (=VDD/2) in response to column address signals CA0–CAn. As a result, the supply voltage applied to the data storage circuit 1 is reduced to a half, so that the power consumed in the memory cell MC can be reduced.

Although the circuit configuration shown in FIG. 56 has the power consumption of the memory cell MC reduced by the function of the source line potential control circuit 308, it is necessary to charge/discharge the source line SLj according to whether the memory cell is accessed or not. Therefore, the power consumed by the charge/discharge of the source line SLj cannot be neglected.

Because the SRAMs shown in FIGS. 55 and 56 have the word line boosted in the writing operation, data writing may be carried out in other memory cells connected to the boosted word line even when not required. More specifically, the access gate transistors of the memory cells in other columns which should be not accessed have the gate voltage boosted, whereby the stored data is rewritten by the data (indefinite) determined by the potential of the bit line of that column.

SUMMARY OF THE INVENTION

An object of the present invention is to prevent data from being written into a memory cell not desired at the time of data writing operation in a static random access memory device having a single bit line configuration.

Another object of the present invention is to improve the data readout speed of a static random access memory having a single bit line configuration.

A further object of the present invention is to improve the data writing speed of a static random access memory device having a single bit line configuration.

Still another object of the present invention is to reduce the occupying area of the memory cell on a semiconductor substrate in a static random access memory device having a single bit line configuration.

A static random access memory device according to the present invention includes a memory cell array having a plurality of memory cells arranged in a plurality of rows and columns, and a plurality of bit lines each connected to a memory cell of a corresponding column. Each memory cell includes a data storage circuit for storing a data signal provided via a single input/output node, and a switching circuit connected between a bit line of a corresponding column and an input/output node for conducting in response to row and Column address signals. The static random access memory device further includes a status control circuit responsive to an externally applied write control signal for stabilizing or instabilizing the data storage state of the data storage circuit in the memory cell selected by row and column address signals.

In operation, the status control circuit instabilizes the data storage state of only the memory cell selected by row and column address signals, so that data writing is carried out only to a desired memory cell. Therefore, erroneous data writing into an unnecessary memory cell can be prevented.

A static random access memory device according to another aspect of the present invention includes a memory cell array having a plurality of memory cells arranged in a plurality of rows and columns, and a plurality of bit lines each connected to a memory cell of a corresponding column. Each memory cell includes a data storage circuit for storing a data signal provided via a single input/output node, and first and second field effect transistors connected in series between the bit line in the corresponding column and the input/output node. The static random access memory device further includes a first boosting circuit responsive to an externally applied write control signal for boosting the gate voltage of the respective first field effect transistors in the memory cells of a row selected by a row address signal to a voltage level exceeding the supply voltage applied to the data storage circuit, and a second boosting circuit responsive to an externally applied write control signal for boosting the gate voltage of the respective second field effect transistors in the memory cells of a column selected by a column address signal to a voltage level exceeding the supply voltage.

In operation, the gate voltages of the first and second field effect transistors are boosted only in the memory cell which should carry out data writing, so that erroneous data writing to an undesired memory cell is prevented.

A static random access memory device according to a further aspect of the present invention includes two memory cells connected via a common connection node, a shared bit line shared by two memory cells, and a first field effect transistor connected between the shared bit line and the common connection node. Each memory cell includes a data storage circuit for storing a data signal provided via a single input/output node, and a second field effect transistor connected between the input/output node and the common connection node. The static random access memory device further includes a first boosting circuit for boosting the gate voltage of the first field effect transistor to a level exceeding the supply voltage applied to the data storage circuit in response to an externally applied write control signal when the two memory cells are selected by a row address signal, and a second boosting circuit for boosting the gate voltage of a corresponding second field effect transistor in a selected one memory cell to a level exceeding the supply voltage in response to a write control signal when one of the two memory cells is selected by a column address signal.

In operation, the data storage circuit of only the memory cell to be accessed is connected to the shared bit line via the boosted first and second field effect transistors, so that erroneous data writing into an undesired memory cell is prevented.

A static random access memory device according to still another aspect of the present invention includes a memory cell array having a plurality of memory cells arranged in a plurality of rows and columns, and a plurality of bit lines each connected to a memory cell in a corresponding one column. Each memory cell includes a data storage circuit for storing a data signal applied via a single input/output node, and a switching circuit connected between the bit line of a corresponding column and the input/output node for conducting in response to row and column address signals. The static random access memory device further includes a plurality of dummy cells each connected to a corresponding one of the plurality of bit lines; a plurality of differential sense amplifiers, each provided in every two adjacent columns in the memory cell array and connected between two corresponding bit lines, and a plurality of dummy cell enabling circuits, each provided for every two adjacent columns in the memory cell array and responsive to a column address signal selecting one of the two corresponding bit lines for enabling the dummy cell connected to the other of the corresponding two bit lines.

In operation, the data signal stored in the data storage circuit is provided to one of the corresponding two bit lines when data is read out from a memory cell. The dummy cell connected to the other of the corresponding two bit lines is enabled in response to a column address signal selecting that memory cell. The corresponding differential sense amplifier amplifies differentially the potential between the two bit lines, so that data read out operation can be carried out at a high speed.

According to a still further aspect of the present invention, the data storage circuit includes a first field effect transistor of a first conductivity type and a second field effect transistor of a second conductivity type which is opposite to the first conductivity type, connected in series between first and second supply potentials, and a third field effect transistor of the first conductivity type and a fourth field effect transistor of the second conductivity type connected in series between the first and second supply potentials with the input/output node. The first and second field effect transistors have the gate electrodes connected to the input/output node. The third and fourth field effect transistors have the gate electrodes connected to the common connection node of the first and second field effect transistors. The first field effect transistor has a mutual conductance higher than that of third field effect transistor.

In operation, the first field effect transistor has a mutual conductance higher than that of the third field effect transistor, so that the charge/discharge of the common connection node of the first and second field effect transistors is carried out rapidly. Therefore, the data writing operation can be carried out at a high speed.

According to yet a further aspect of the present invention, the data storage circuit includes a first field effect transistor of a first conductivity type and a second field effect transistor of a second conductivity type opposite to the first conductivity type, connected in series between first and second supply potentials, and a third field effect transistor of the first conductivity type and a fourth field effect transistor of the second conductivity type connected in series between the first and second supply potentials with the input/output node. The first and second field effect transistors have the gate electrodes connected to the input/output node. The third and fourth field effect transistors have the gate electrodes connected to the common connection node of the first and second field effect transistors. The fourth field effect transistor has a threshold voltage lower than that of the second field effect transistor.

In operation, the fourth field effect transistor has a threshold voltage lower than that of the second field effect transistor, so that the fourth field effect transistor responds to the potential of the common connection node of the first and second field effect transistors to conduct rapidly Therefore, the input/output node of the data storage circuit is charged/discharged rapidly, so that the data writing operation can be carried out at a high speed.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

Figure 1:
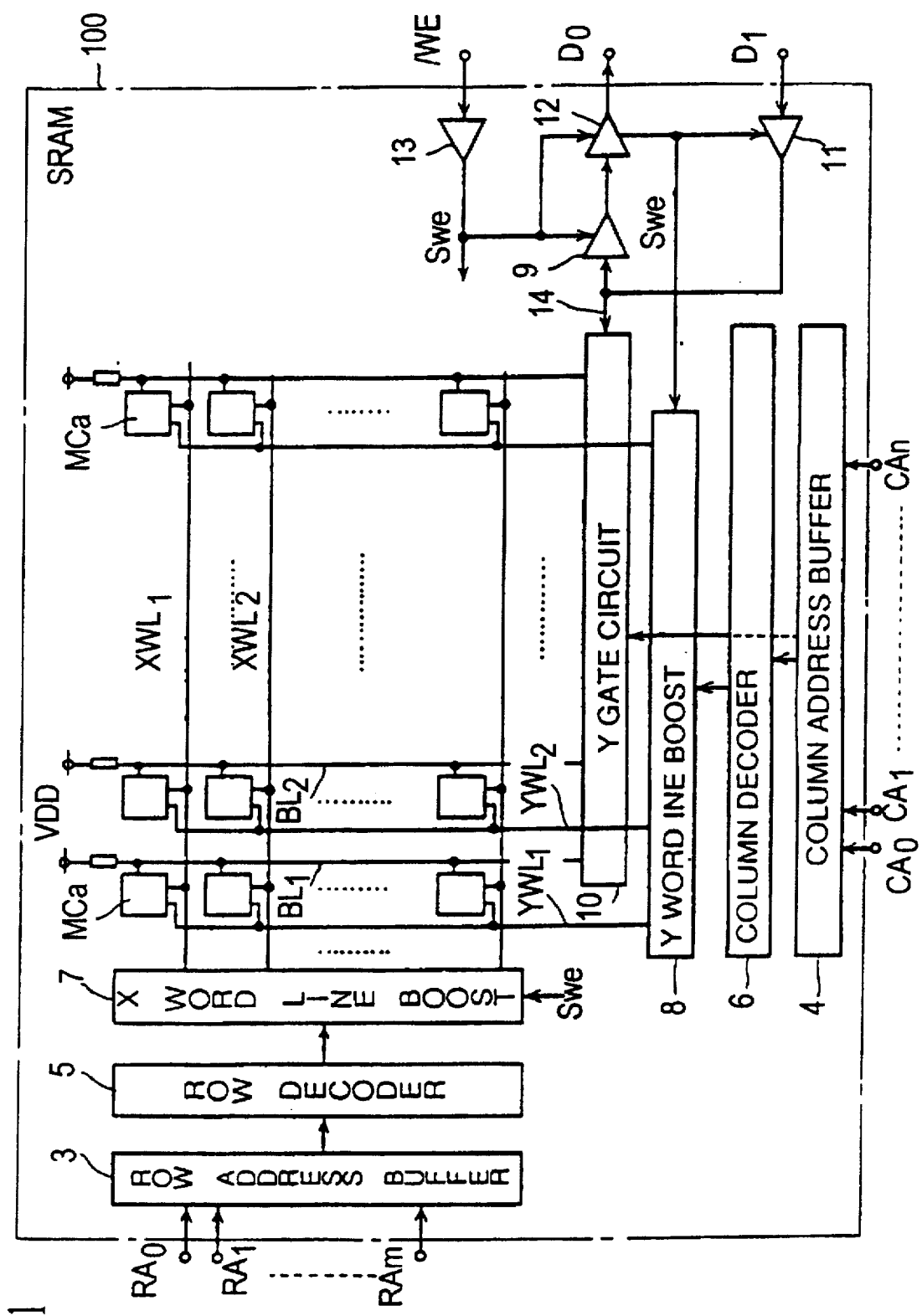
FIG. 1 is a block diagram of a SRAM according to an embodiment of the present invention.

Referring to FIG. 1, a SRAM 100 includes a row address buffer 3 receiving an externally applied row address signal RA0-RAm, a column address buffer 4 receiving an externally applied column address signal CA0-CAn, a row decoder 5 for decoding a row address signal, a column decoder 6 for decoding a column address signal, an X word line boosting circuit 7 for boosting an X word line selected by the row decoder 5, a Y word line boosting circuit 8 for boosting a Y word line selected by the column decoder 6, and a Y gate circuit 10 responsive to an output signal from the column decoder 6 for selecting a bit line.

The SRAM 100 includes a memory cell array having a plurality of memory cells MCa arranged in a plurality of rows and columns. In each row, a memory cell MCa is connected to a corresponding word line XWL1, XWL2, ... . In each column, the memory cell MCa is connected to a corresponding bit line BL1, BL2, ..., and to a corresponding Y word line YWL1, YWL2, ... . The X word lines XWL1, XWL2, ... are connected to the X word line boosting circuit 7. The Y word lines YWL1, YWL2, ... are connected to the Y word line boosting circuit 8. The bit lines BL1, BL2, ... are connected to the Y gate circuit 10.

Bit lines BL1, BL2, ... are connected to a sense amplifier 9 via the Y gate circuit 10 and an IO line 14. The Y gate circuit 10 responds to a column selecting signal provided from the column decoder 6 to selectively connect one of bit lines BL1, BL2, ... to the IO line 14. The sense amplifier 9 is activated in response to a write enable signal /WE provided via, the write control buffer 13. The data signal read out from a memory cell is amplified by the sense amplifier 9 to be provided via the output buffer 12 as an output data Do. The data signal Di to be written is applied to the one bit line selected by the Y gate circuit 10 via the input buffer 11, the IO line 14 and the Y gate circuit 10.

Figure 2:
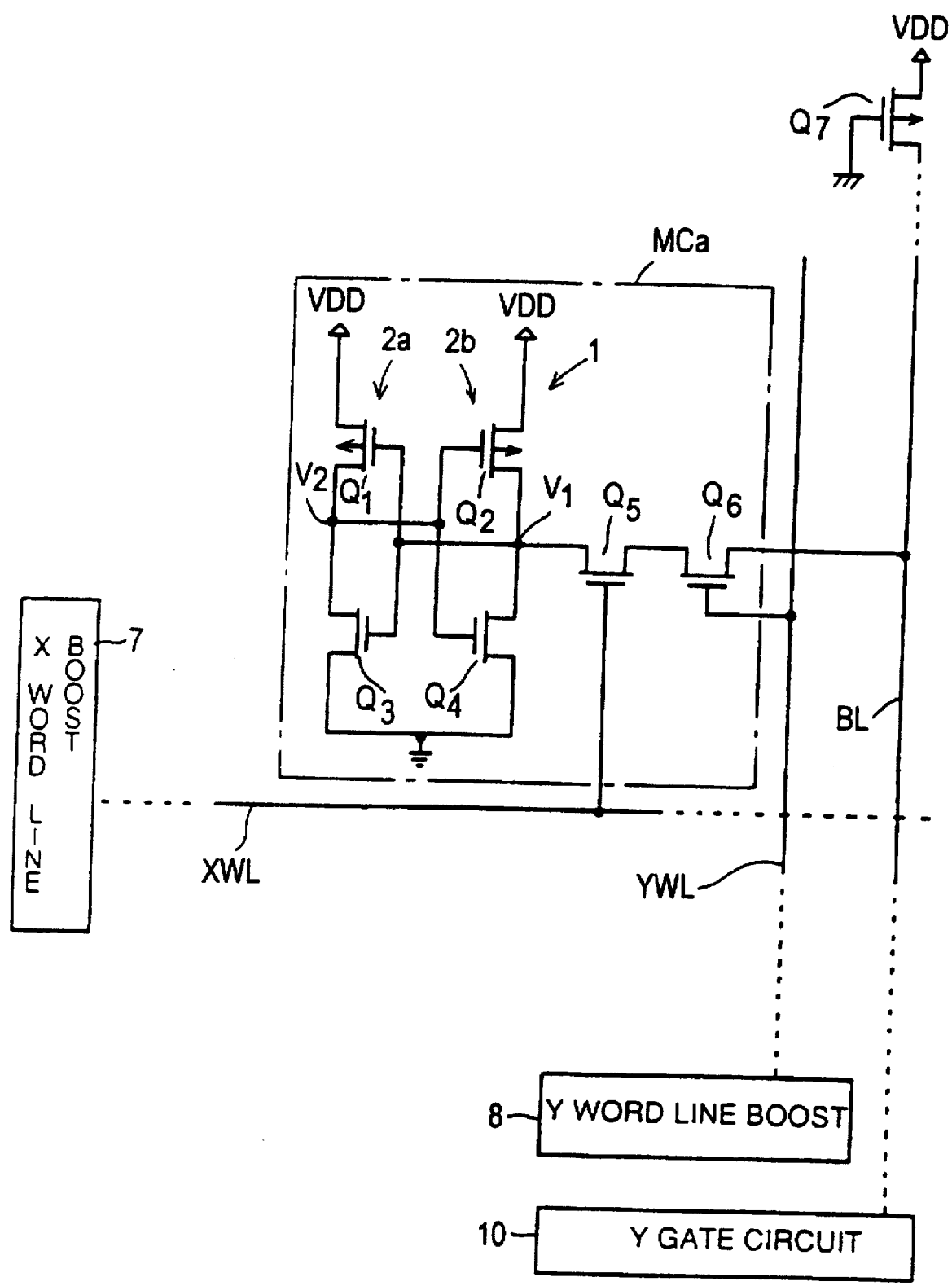
FIG. 2 is a circuit diagram of a memory cell applied to the SRAM of FIG. 1.

FIG. 2 is a circuit diagram of one memory cell MCa employed in the SRAM 100 of FIG. 1. Referring to FIG. 2, the memory cell MCa includes a data storage circuit 1 implemented by PMOS transistors Q1 and Q2 realized by a thin film transistor (referred to as "TFT" hereinafter), and NMOS transistors Q3 and Q4 serving as driver transistors. More specifically, the data storage circuit includes two cross-coupled CMOS inverters 2a and 2b. The inverter 2a is formed of transistors Q1 and Q3. The inverter 2b is formed of transistors Q2 and Q4.

The data storage circuit 1 is connected to a single bit line BL via NMOS transistors Q5 and Q6 serving as access gates. The transistor Q5 has the gate connected to the X word line XWL. The transistor Q6 has the gate connected to the Y word line YWL. Word lines XWL and YWL are connected to the X word line boosting circuit 7 and the Y word line boosting circuit 8, respectively. A PMOS transistor Q7 is connected between the single bit line BL and the supply voltage VDD as a load. Although only one memory cell MCa is shown in FIG. 2, the other memory cells of FIG. 1 have the same circuit configuration.

The operation will be described hereinafter with reference to FIGS. 1 and 2. In writing operation, an externally applied write enable signal /WE is pulled down. The write control buffer 13 shown in FIG. 1 responds to the fall of the signal /WE to provide an internal write control signal Swe. The row decoder 5 decodes externally applied row address signals RA0–RAm to select one of the X word lines. The X word line boosting circuit 7 responds to the internal write control signal Swe to boost the selected X word line XWL. Similarly, the column decoder 6 decodes externally applied column address signals CA0–CAn to select a Y word line. The Y word line boosting circuit 8 responds to the internal write control signal Swe to boost the selected Y word line XWL.

In writing operation, the input data Di to be written is provided to the Y gate circuit 10 via the input buffer 11. The Y gate circuit 10 responds to a column selecting signal provided from the column decoder 6 to provide the input data signal to the selected bit line.

Referring to FIG. 2, the word lines XWL and YWL are boosted by the X word line boosting circuit 7 and the Y word line boosting circuit 8, respectively, whereby the gate voltages of the transistors Q5 and Q6 are boosted. In response to the boost of the gate voltages, transistors Q5 and Q6 are turned on at a lower conductance, whereby the data determined by the potential on the single bit line BL is stored in the data storage circuit 1.

In the reading operation, the boosting operations by the word line boosting circuits 7 and 8 are not carried out, and the word line boosting circuits 7 and 8 provide an output voltage of the level of the supply voltage VDD, instead. More specifically, when the memory cell MCa of FIG. 2 is accessed, the word line boosting circuits 7 and 8 provide an output voltage of the supply voltage VDD level to word lines XWL and YWL. As a result, transistors Q5 and Q6 are turned on at the ordinary conductance, whereby the data signal stored in the data stored circuit 1 is provided on the single bit line BL.

The data signal provided to the bit line BL is supplied to the sense amplifier 9 via the Y gate circuit 10 of FIG. 1. The signal amplified by the sense amplifier 9 is provided via the output buffer 12 as the output data Do.

The operation of the memory cell MCa shown in FIG. 2 is schematically described as set forth in the foregoing. The operation principle of the memory cell MCa will be described in details hereinafter.

Referring to FIG. 2 again, the inverter 2a forming the data storage circuit 1 is implemented by the PMOS transistor Q1 realized by TFT and the NMOS transistor Q3. It is assumed that an input voltage of the inverter 2a is V1, and the output voltage is V2. Because the transistor Q1 is formed of a TFT, the drain current y of the transistor Q is obtained by the following equation assuming that the gate voltage of the transistor Q1 is x.

$$y = 10^{-13} e^{\frac{1}{3} \log_{2.7183}(1 \times 10^{-7})(x-3)} \tag{1}$$

Figure 3:
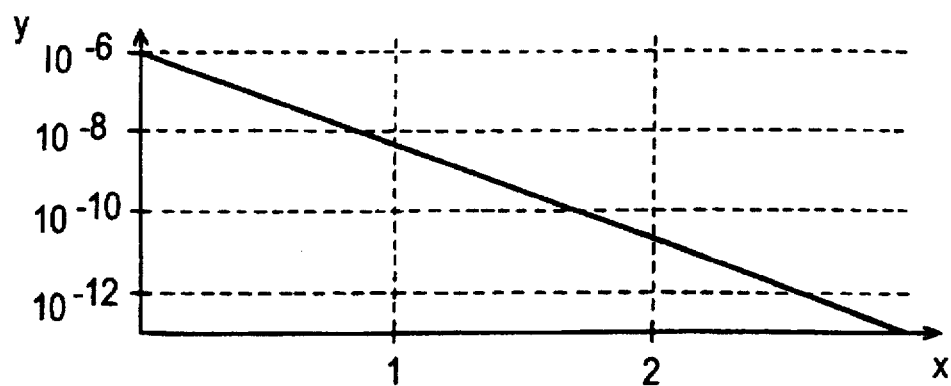
FIG. 3 is a diagram showing the gate voltage-drain current characteristics of a transistor Q1 of FIG. 2.

From equation (1), the gate voltage-drain current characteristics of the transistor Q1 of FIG. 3 are obtained. It can be appreciated from FIG. 3 that the transistor Q1 shows sub-threshold characteristics in the region when the gate voltage x is less than 3 volts.

It can be appreciated from FIG. 3 that a current not more than 1 μA flows via the transistor Q1. In the current region not more than 1 μA, the driver transistor Q3 also indicates sub-threshold characteristics. The drain current z of the driver transistor Q3 in the sub-threshold region is expressed by the following equation using the gate voltage x.

$$z = 10^{-18} e^{\frac{1}{1} \log_{2.7183}(1 \times 10^{10})x} \tag{2}$$

Figure 4:
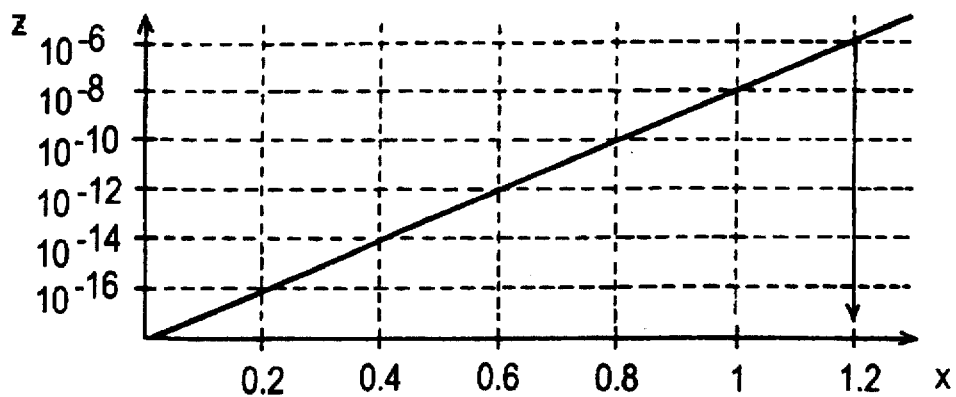
FIG. 4 is a diagram showing the gate voltage-drain current characteristics of a transistor Q3 of FIG. 2.

Therefore, the gate voltage-drain current characteristics of the driver transistor Q3 is shown in FIG. 4.

It can be appreciated from the characteristics diagrams of 3 and 4 that transistors Q1 and Q3 both operate in the sub-threshold region, and the output voltage V2 of the inverter 2a is determined by the current flowing via transistors Q1 and Q3.

Figure 5:
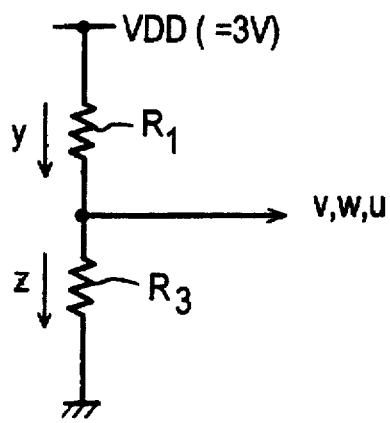
FIG. 5 is an equivalent circuit diagram of an inverter 2a of FIG. 2.

For the sake of simplicity, the inverter 2a is indicated by the equivalent circuit diagram of FIG. 5. Specifically, it is presumed that the transistor Q1 is substituted by a resistor R1 conducting a current flow of y, and the transistor Q3 is substituted by a resistor R3 conducting a current flow of z. The output voltage v of the equivalent circuit of FIG. 5 is represented by the following equation assuming that the supply voltage VDD is 3 volts.

$$v = \frac{y}{y+z} \cdot 3 \tag{3}$$

Assuming that a drain current of a certain value flows via the transistor Q1, the output voltage v of the inverter 2a indicated by the equivalent circuit of FIG. 5 is obtained by the following equation.

$$v = 3 \frac{e^{\frac{1}{3} \log_{2.7183}(1 \times 10^{-7})(x-3)}}{10^{13} \left( \frac{e^{\frac{1}{3} \log_{2.7183}(1 \times 10^{-7})(x-3)}}{10^{13}} + \frac{e^{\log_{2.7183}(1 \times 10^{10})x}}{10^{18}} \right)} \tag{4}$$

In the case the drain current of the transistor Q1 is decreased by one order of magnitude and the drain current of the driver transistor Q3 is increased by one order of magnitude from the case of equation (4), the output voltage w of the inverter 2a is obtained by the following equation.

$$\omega = 3 \frac{e^{\frac{1}{3} \log_{2.7183}(1 \times 10^{-7})(x-3)}}{10^{14} \left( \frac{e^{\frac{1}{3} \log_{2.7183}(1 \times 10^{-7})(x-3)}}{10^{14}} + \frac{e^{\log_{2.7183}(1 \times 10^{10})x}}{10^{17}} \right)} \tag{5}$$

In the case where the drain current of the transistor Q1 is increased by one order of magnitude and the drain current of the driver transistor Q3 is decreased by one order of magnitude from the case of equation (4), the output voltage u of the inverter 2a is obtained by the following equation.

$$u = 3 \frac{e^{\frac{1}{3} \log 2.7183 (1 \times 10^{-7})(x-3)}}{10^{12} \left( \frac{e^{\frac{1}{3} \log 2.7183 [1 \times 10^{-7}](x-3)}}{10^{12}} + \frac{e^{\log 2.7183 (1 \times 10^{10})x}}{10^{19}} \right)} \quad (6)$$

Figure 6:
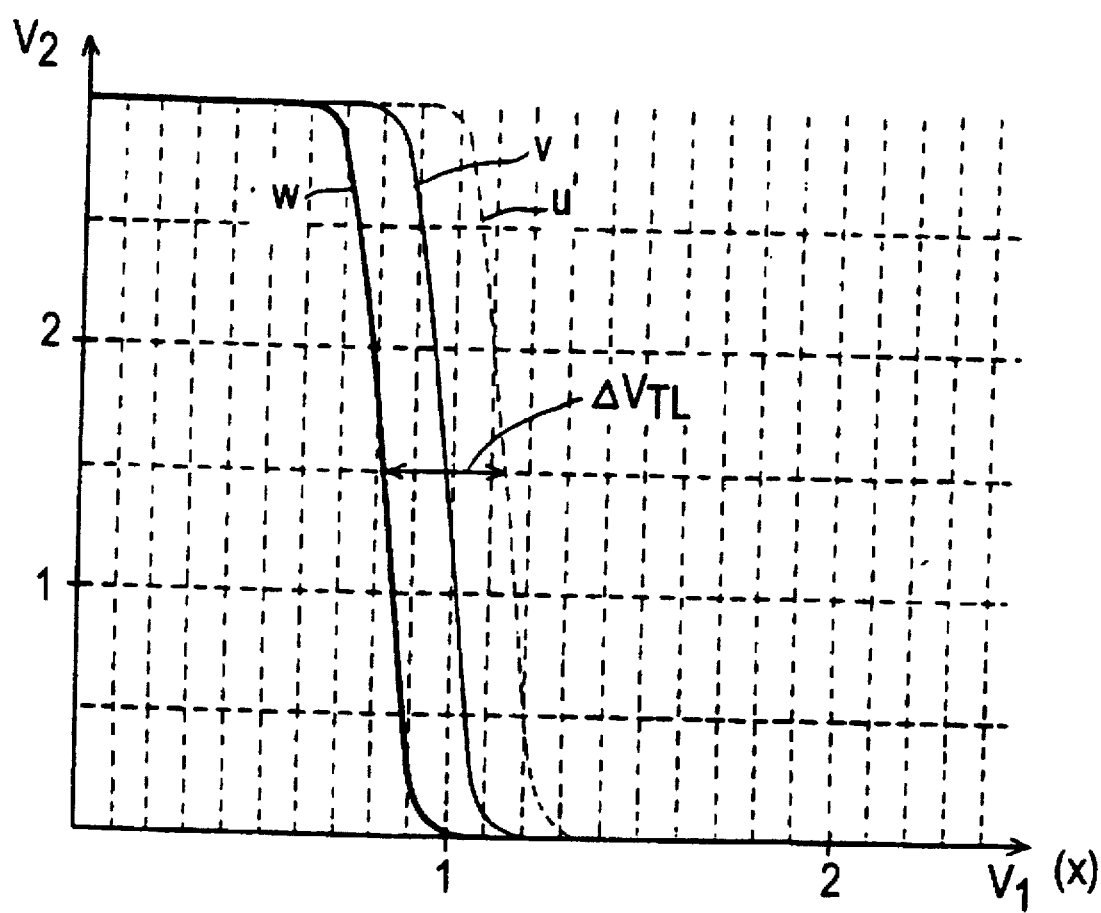
FIG. 6 is a diagram of the input/output characteristics of the inverter 2a of FIG. 2.

The relationship between the output voltages of v, w and u of the inverter 2a and the gate voltage x in the various cases of the above-described equations (4)–(6) is shown in FIG. 6.

FIG. 5 is a diagram of the input/output characteristics showing the relationship between the input voltage V1 and the output voltage V2 of the inverter 2a. Referring to FIG. 6, the abscissa indicates the input voltage V1 (equivalent to the gate voltage x of transistors Q1 and Q3), and the ordinate indicates the output voltage V2 (corresponds to the aforementioned output voltages of v, w, and u). Curves v, w and u show the output voltages obtained by equations (4), (5) and (6), respectively.

Figure 7:
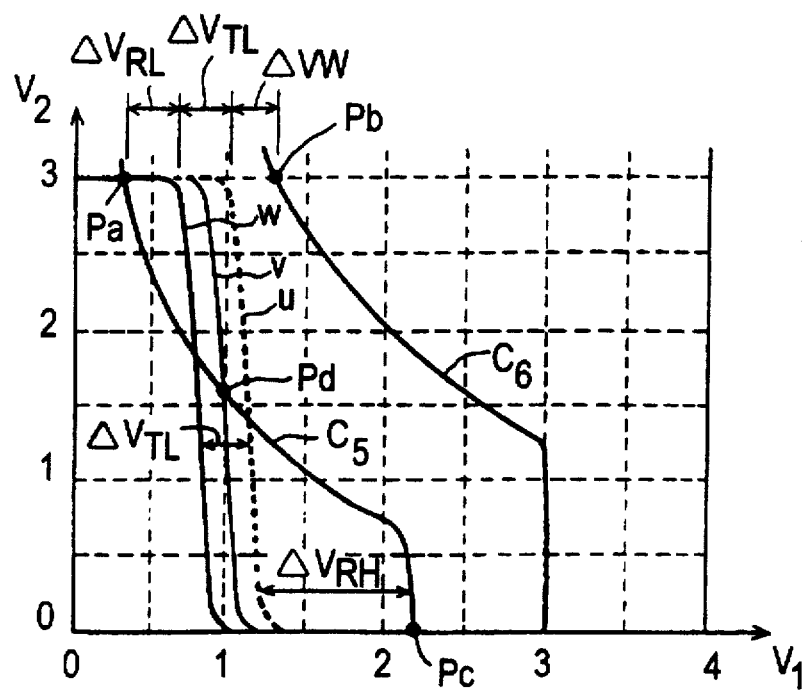
FIG. 7 is a diagram of the input/output characteristics of inverters 2a and 2b forming the data storage circuit of FIG. 2.

The other inverter 2b forming the data storage circuit 1 shown in FIG. 1 will be described hereinafter. By carrying out an analysis similar to that of the inverter 2a for the inverter 2b, the input/output characteristics C5 and C6 shown in FIG. 7 can be obtained. Referring to FIG. 7, the abscissa indicates the voltage V1, and the ordinate indicates the voltage V2. The voltage V2 corresponds to the input voltage of the inverter 2b, and the voltage V1 corresponds to the output voltage of the inverter 2b. When the gate voltages of the access gate transistors Q5 and Q6 shown in FIG. 2 are not boosted (that is, when gate voltages of the level of the supply voltage VDD are applied), the input/output characteristics of the inverter 2b is represented by the curve C5. When the gate voltages of transistors Q5 and Q6 are boosted (i.e. when gate voltages exceeding the level of the supply voltage VDD are applied), the input/output characteristics of the inverter 2b is represented by the curve C6. That is to say, the input/output characteristics of the inverter 2b is shifted depending whether the gate voltages of transistors Q5 and Q6 are boosted or not.

It is assumed that the inverter 2a has the characteristics represented by the curve v, and the inverter 2d has the characteristics represented by curves C5 and C6. In the reading operation, the input/output characteristics of the inverter 2b is represented by the curve C5 because the gate voltages of transistors Q5 and Q6 are not boosted. Therefore, curves v and C5 cross at the crossing points of Pa and Pc (the intermediate crossing point of Pd is neglected since it is unstable). In other words, the data storage circuit i has two stable states, i.e. the crossing points of Pa and Pc when boosting of transistors Q5 and Q6 are not carried out. Therefore, the stored data is maintained at either of the two states of the data storage circuit 1.

In writing operation, the gate voltages of the transistors Q5 and Q6 are boosted, whereby the input/output characteristics of the inverter 2b is shifted as shown by the curve C6. There is no crossing between curves v and C6, so that the data storage circuit 1 is brought to an unstable state. During this unstable state, the data signal determined by the potential of the single bit line BL is transmitted to the data storage circuit 1 via transistors Q5 and Q6. In other words, the data storage state is easily changed due to the fact that the data storage circuit 1 is unstable. As a result, data writing can be carried out easily.

The conditions required for providing the characteristics of the relation shown in FIG. 7 for inverters 2a and 2b will be described hereinafter. It is assumed that the β of the transistor Q4 is designated by $\beta_{Q4}$. Furthermore, it is assumed that access gate transistors Q5 and Q6 are equivalently represented by one transistor, and the value of β of that equivalent transistor is represented as $\beta_{Q56}$.

The beta ratio βr is defined as represented by the following equation.

$$\beta r = \beta_{Q4}/\beta_{Q56} \quad (7)$$

Figure 8:
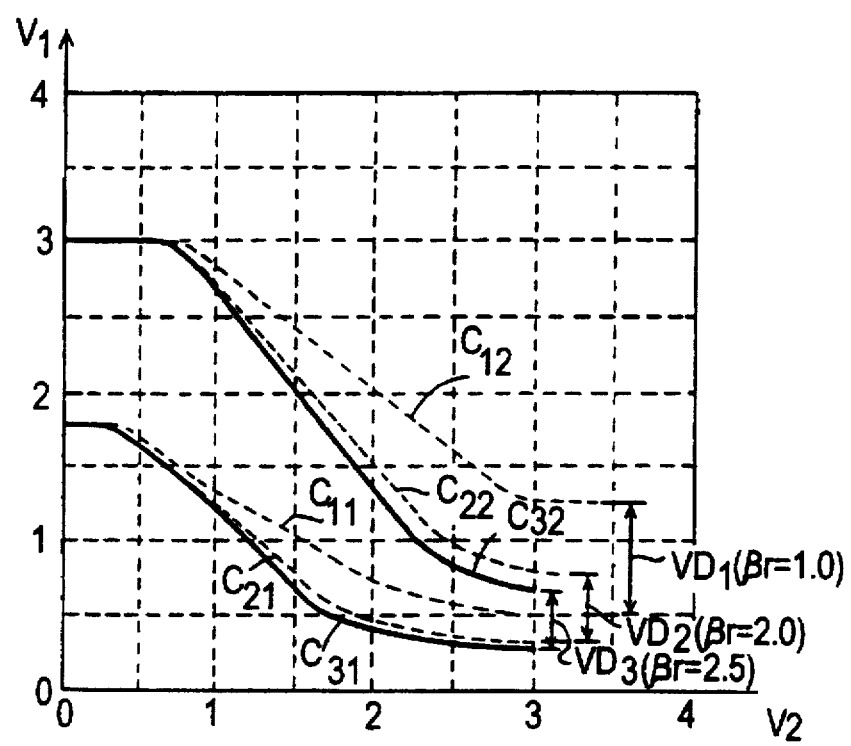
FIG. 8 is a diagram of the input/output characteristics of the inverter 2b of FIG. 2 of various beta ratios.

FIG. 8 is a diagram of the input/output characteristics of the inverter 2b of FIG. 2 under various beta ratios βr. Referring to FIG. 8, the abscissa indicates the input voltage V2 and the ordinate indicates the output voltage V1 of the inverter 2b. The curves C11 and C12 represent the characteristics when βr=1.0. The curves C21 and C22 show the characteristics when βr=2.0. The curves C31 and C32 show the characteristics when βr=2.5. The curves C11, C21, and C31 show the characteristics when the gate voltages of the access gate transistors Q5 and Q6 are not boosted (=VDD=3 volts). The curves C12, C22 and C32 respectively show the characteristics when the gate voltages of transistors Q5 and Q6 are boosted (=5 volts).

It can be appreciated from FIG. 8 that the voltage difference VD1–VD3 is gradually reduced as the beta ratio βr increases.

Referring to FIG. 7 again, the preferable range of a preferable beta ratio βr will be described hereinafter. The curves w and u of FIG. 7 take into consideration the variations of the characteristics of transistors Q1 and Q3 forming the inverter 2a. That is to say, the actual characteristics of the inverter 2a exists in the region surrounded by the curves w and u. From FIG. 7, the difference $\Delta V_{TL}$ of the logic threshold value is approximately 0.35 volts.

In the embodiment shown in FIG. 7, the supply voltage VDD is three volts. Therefore, the voltage of the word line activated during the reading operation is three volts. The voltage of the boosted word line during the writing operation is five volts.

The voltage differences of $\Delta V_{RL}$ and $\Delta V_{RH}$ shown in FIG. 7 must take a sufficient great value for the curve C5 to cross at the two crossing points of Pa and Pc with the curve w or u at a data read out state, i.e. at a stable state. Assuming that the voltage difference $\Delta V_{RL}=\Delta V_{RH}=0.2$ volts, the following equation is obtained.

$$\begin{aligned} V1\,(Pc) - V1\,(Pa) &= \Delta V_{RL} + \Delta V_{TL} + \Delta V_{RH} \quad (8) \\ &= 0.2 + 0.35 + 0.2 \\ &= 0.75\,(V) \end{aligned}$$

In a writing operation, it is required that the point Pb does not cross the curve u. Therefore, assuming that $\Delta V_W$ exceeds 0.2 volts, the following relationship can be obtained.

$$\begin{aligned} V1\,(Pb) - V1\,(Pa) &= \Delta V_{RL} + \Delta V_{TL} + \Delta V_W \quad (9) \\ &= 0.75\,(V) \end{aligned}$$

It can be appreciated from equations (8) and (9) that the design must be established so that the voltage difference V1 (Pc)–V1 (Pa) and the voltage difference V1 (Pb)–V1 (Pa) take a value of not less than approximately 0.8 volts.

Figure 9:
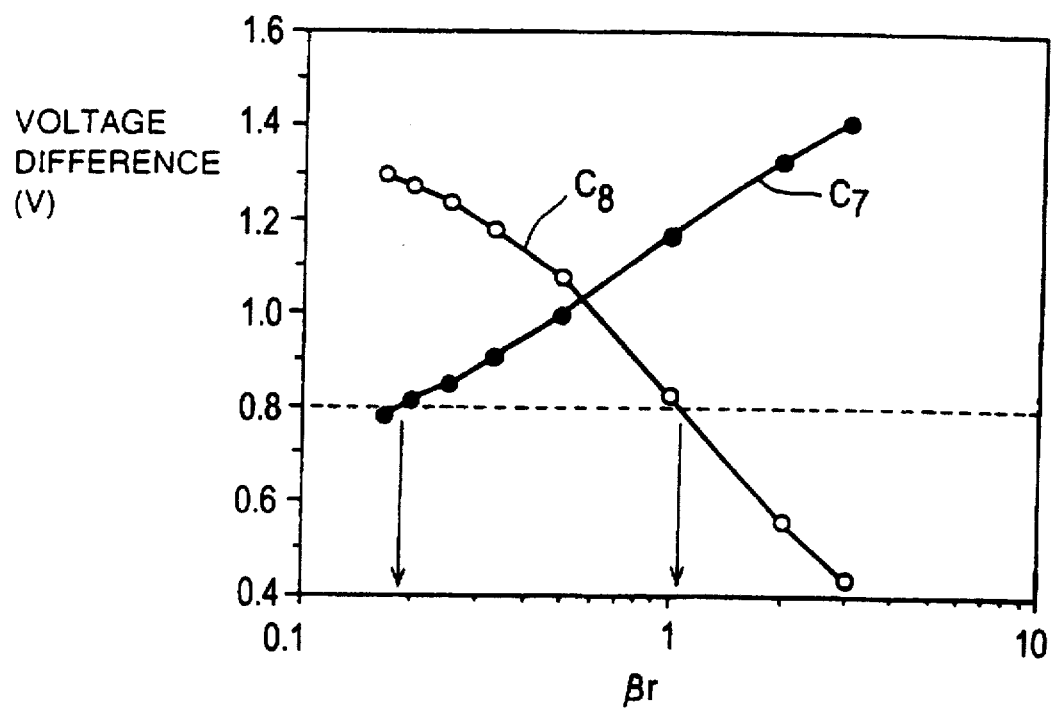
FIG. 9 is a graph for describing the preferable range of a beta ratio.

FIG. 9 is a graph showing the relationship between the beta ratio βr and the aforementioned voltage difference. Referring to FIG. 9, the abscissa indicates the beta ratio βr, and the ordinate indicates the voltage difference (V). The curve C7 indicates the change of voltage difference V1 (Pc)–V1 (Pa), and the curve C8 indicates the change in the voltage difference V1 (Pb)–V1 (Pa). The voltage difference V1 (Pc)–V1 (Pa) is gradually decreased as the beta ratio βr decreases. This is because the voltage (V1) of the crossing point Pa becomes greater as the beta ratio βr decreases.

The voltage difference V1 (Pb)–V1 (Pa) decreases as the beta ratio βr increases. This is because the crossing points of Pa and Pb both are suppressed at a low value as the beta ratio βr increases. As a result, the preferable range of the beta ratio βr can be obtained by the following inequality.

$$0.2 \leq \beta r \leq 1.0 \quad (10)$$

Therefore, the transistors Q4, Q5, and Q6 in the memory cell MCa of FIG. 2 are designed to obtain a beta ratio βr that satisfies the inequality of (10). An example of preferable input/output characteristics of the two inverters 2a and 2b are shown in FIG. 10.

Figure 10:
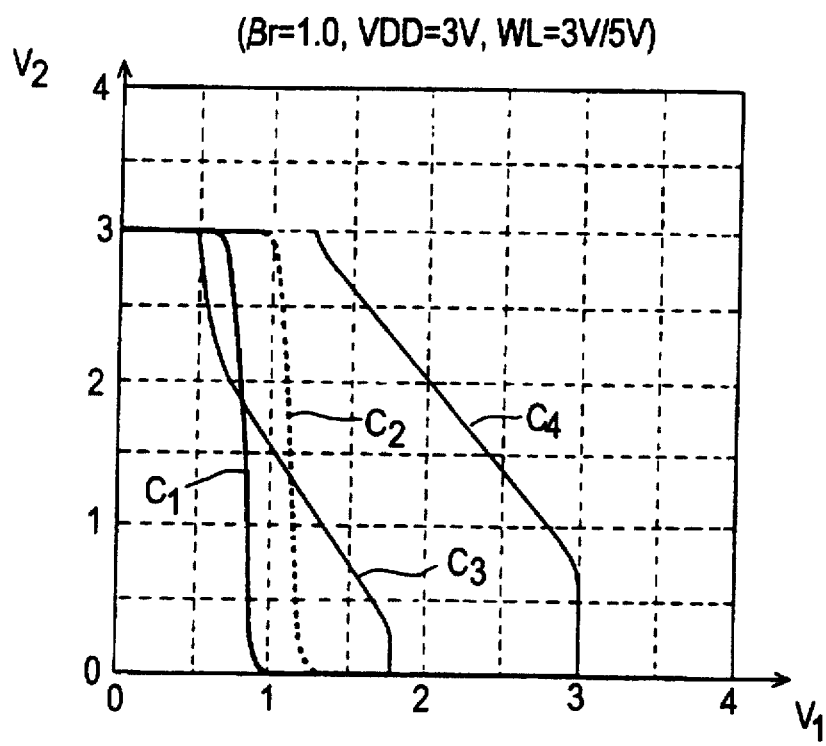
FIG. 10 is a diagram showing the characteristics of the input/output characteristics of two inverters forming the data storage circuit of a memory cell.

Referring to FIG. 10, the curves C1 and C2 indicate the input/output characteristics of the inverter 2a taking into consideration variation of the characteristics of the transistors Q1 and Q3. The curves C3 and C4 respectively show the input/output characteristics of the reading operation and the writing operation, respectively of the inverter 2b. In the example of FIG. 10, the beta ratio βr is 1.0, the supply voltage VDD is 3 volts, the boosted word line voltage is 5 volts, and the not-boosted word line voltage is 3 volts.

Figure 56:
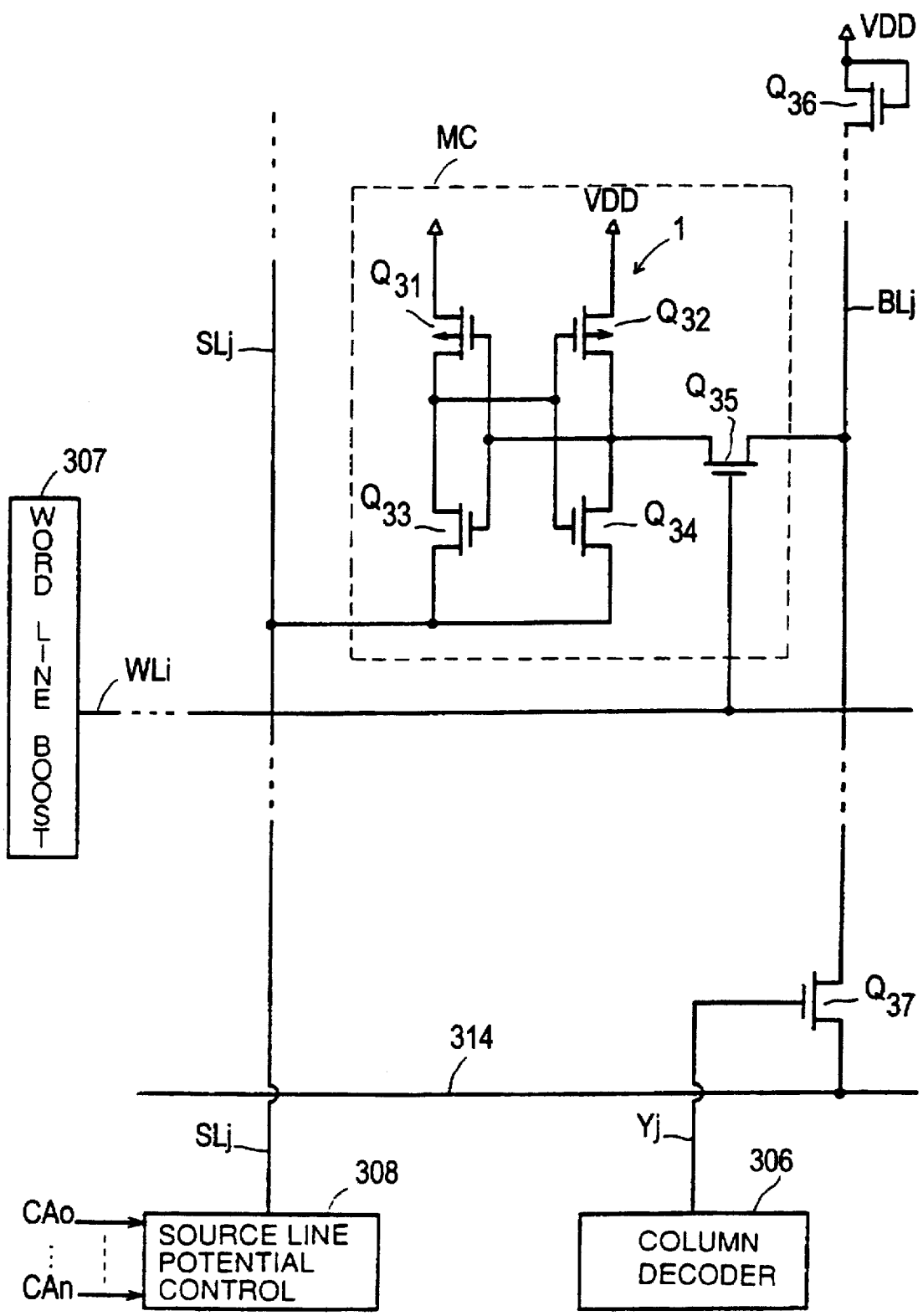
FIG. 56 is a circuit diagram of a memory cell of a SRAM already proposed by the applicant of the present application.

By applying inverters 2a and 2b having the input/output characteristics shown in FIG. 7 to the data storage circuit 1 of the memory cell MCa shown in FIG. 2, a preferable SRAM having a single bit line configuration is obtained. More specifically, in each memory cell MCa shown in FIG. 1, access gate transistors Q5 and Q6 boosted via the X word line XWL and the Y word line YWL in the writing operation are provided in each memory cell MCa shown in FIG. 1, so that data writing can be carried out only in the desired memory cell Mca. Furthermore, because the source line potential control circuit 308 shown in FIG. 56 is not provided, the power consumption due to the charge/discharge of the source line does not occur.

Another embodiment according to the present invention will be described hereinafter.

Figure 11:
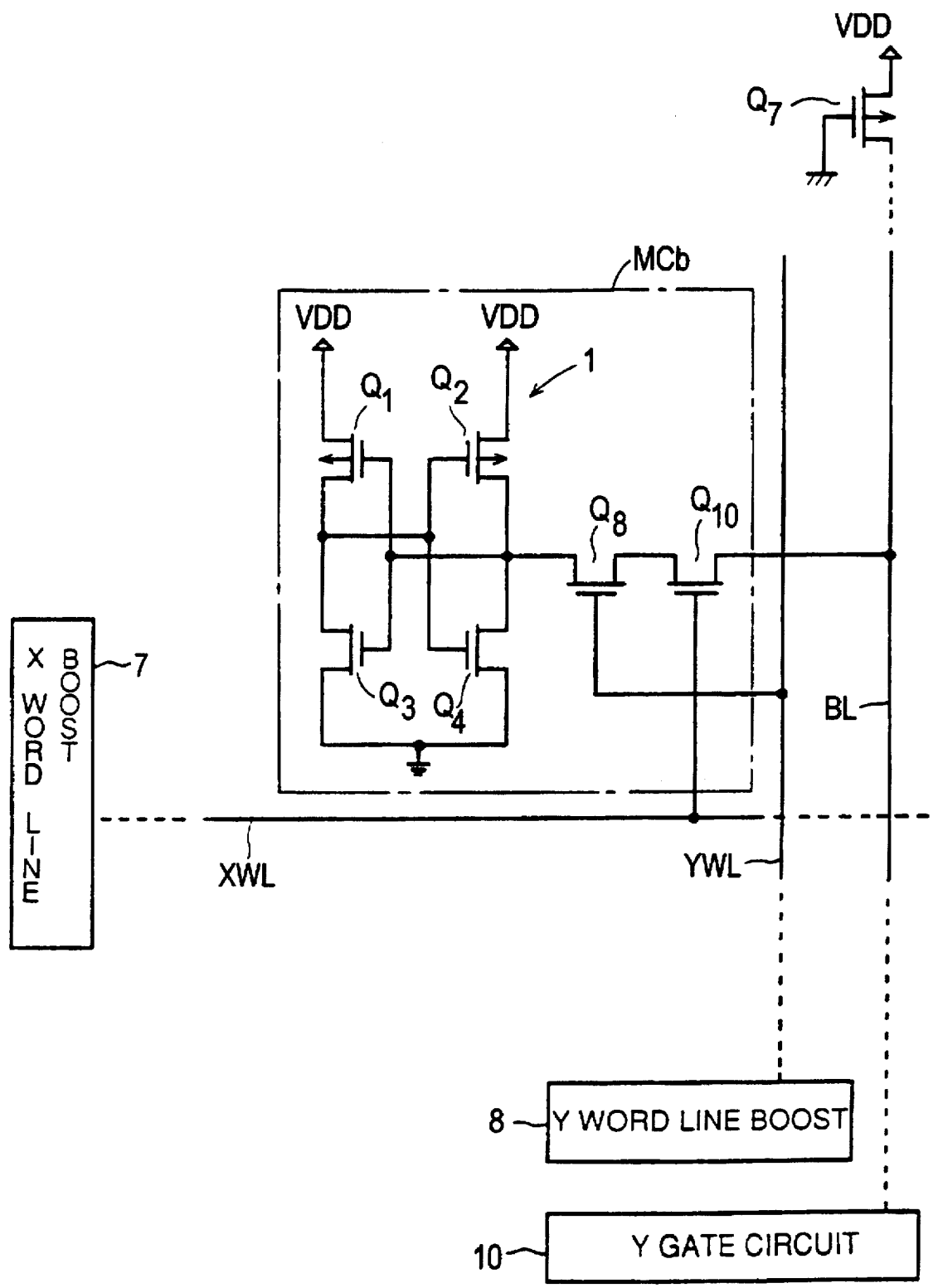
FIG. 11 is a circuit diagram of a memory cell showing another embodiment of the present invention.

FIG. 11 is a circuit diagram of a memory cell showing another embodiment of the present invention. The memory cell MCb shown in FIG. 11 is applicable instead of the memory cell Mca in the SRAM 100 of FIG. 1. Referring to FIG. 11, the memory cell Mcb differs from the memory cell Mca of FIG. 2 in that the connection manner of the gate electrodes of the access gate transistors Q8 and Q10 differ. More specifically, the NMOS transistor Q8 has the gate connected to the Y word line YWL. The NMOS transistor Q10 has the gate connected to the X word line XWL. By applying this memory cell Mcb, the advantages similar to the case of the memory cell MCa of FIG. 2 can be obtained.

Figure 12:
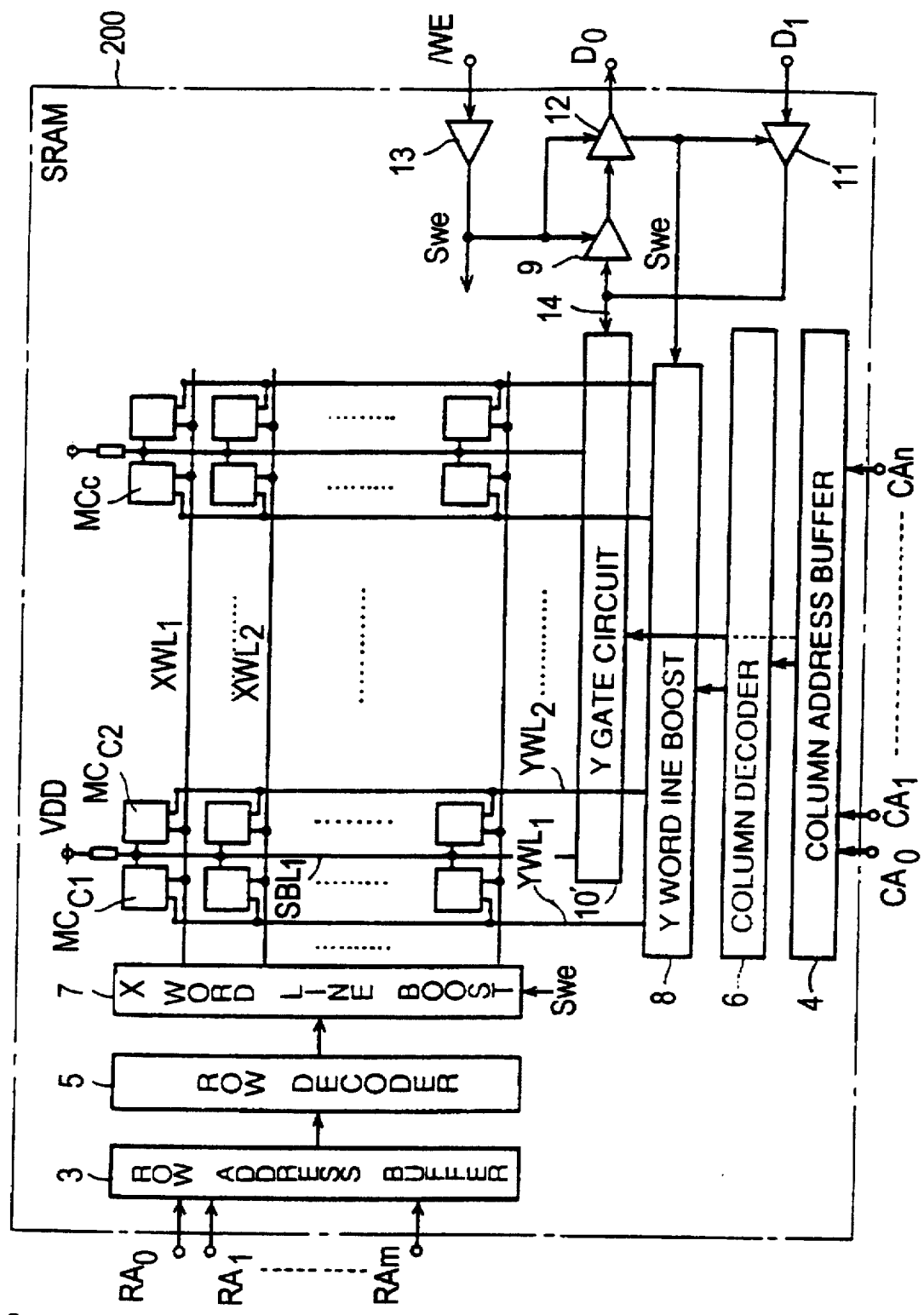
FIG. 12 is a block diagram of a SRAM showing another embodiment of the present invention.

FIG. 12 is a block diagram of a SRAM showing a further embodiment of the present invention. Referring to FIG. 12, the SRAM 200 has a circuit configuration similar to that of the SRAM 100 of FIG. 1, except for a difference in the connection manner of the bit line. More specifically, one shared bit line SBL is provided for every two columns. Therefore, the SRAM 200 of FIG. 12 has the number of bit lines reduced to a half of that provided in the SRAM 100 of FIG. 1. For example, the two adjacent memory cells MCc1 and MCc2 in the first column are connected to one shared bit line SBL1. The shared bit line SBL1 is connected to a Y gate circuit 10'.

Figure 13:
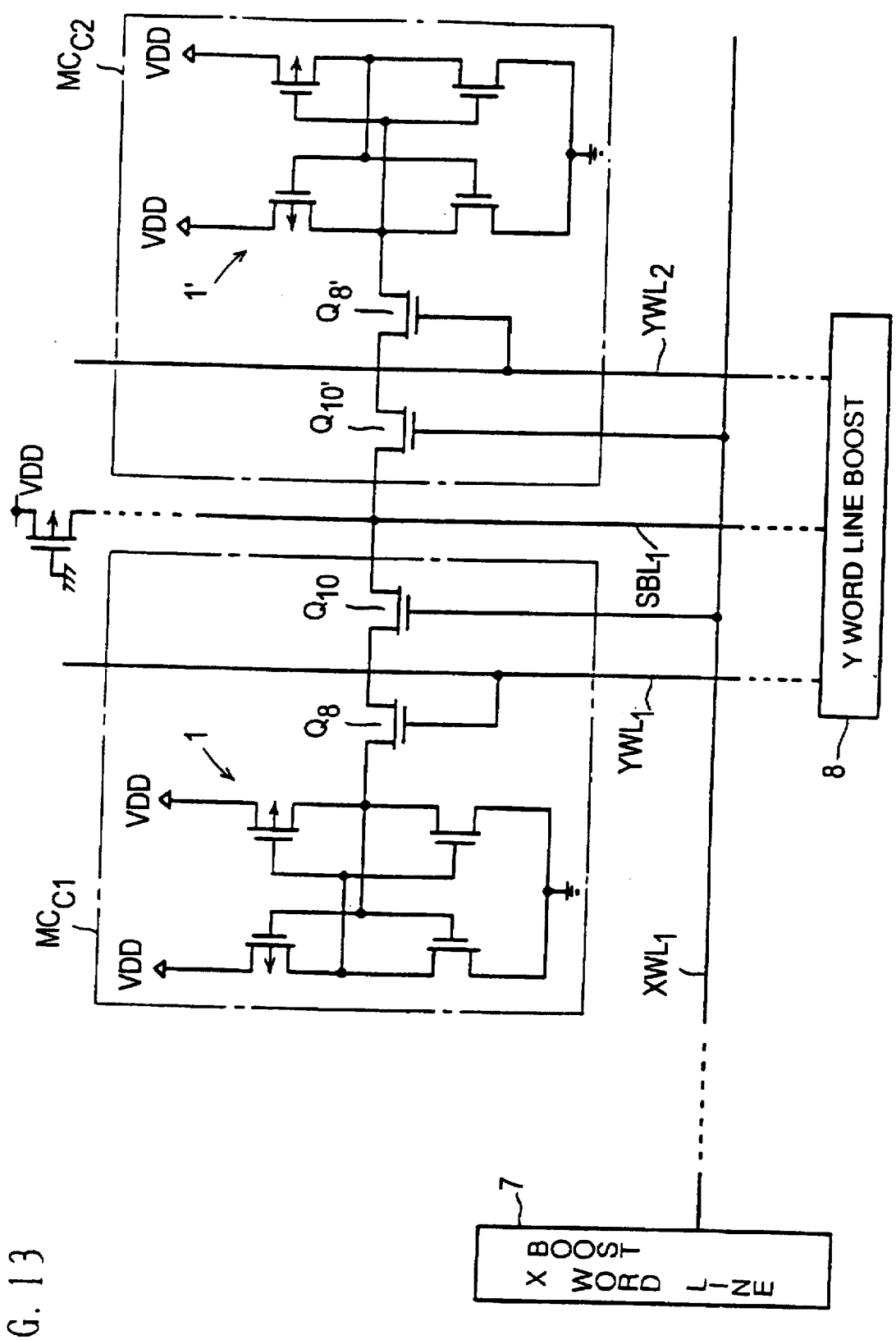
FIG. 13 is a circuit diagram of two adjacent memory cells of FIG. 12.

FIG. 13 is a circuit diagram of two adjacent memory cells MCc1 and MCc2 of FIG. 12. Referring to FIG. 13, memory cells MCc1 and MCc2 have a circuit configuration identical in function and symmetrical in configuration. The memory cell MCc1 includes a data storage circuit 1, and NMOS transistors Q8 and Q10 connected in series between the data storage circuit 1 and the shared bit line SBL1. Similarly, the memory cell MCc2 includes a data storage circuit 1', and NMOS transistors Q8' and Q10' connected in series between the data storage circuit 1' and the shared bit line SBL1. The transistors Q10 and Q10' have the gates connected to the X word line XWL1. The transistor Q8 has the gate connected to the Y word line YWL1. The transistor Q8' has the gate connected to the Y word line YWL2. Each of memory cells MCc1 and MCc2 shown in FIG. 13 has the circuit characteristics satisfying the relationship shown in FIG. 7, as the memory cell MCa shown in FIG. 2.

Although one shared bit line SBL1 is shared by two memory cells MCc1 and MCc2 in two adjacent columns, no problem will occur by sharing the bit line because transistors Q8 and Q8' will not be turned on at the same time.

More specifically, when data writing is carried out with respect to the memory cell MCc1, the gates of the transistors Q10 and Q8 are boosted by the X word line boosting circuit 7 and the Y word line boosting circuit 8, respectively. Therefore, a data signal determined by the potential of the shared bit line SBL1 is applied to the data storage circuit 1 via the transistors Q8 and Q10. In the memory cell MCc2 which should not be accessed, the gate voltage of the transistor Q10' is boosted by the X word line boosting circuit 7, and the gate voltage of the transistor Q8' is maintained at a low level. Therefore, the transistor Q8' is turned off, so that erroneous data writing to memory cell MCc2 will not be carried out.

In data read out operation, the boosting operations of word line boosting circuits 7 and 8 are suppressed, and the voltage of the level of the supply voltage VDD is applied to the gates of the transistors of the memory cells to be accessed, for example, to the gates of transistors Q8 and Q10. Therefore, the normal data reading operation is carried out.

Figure 14:
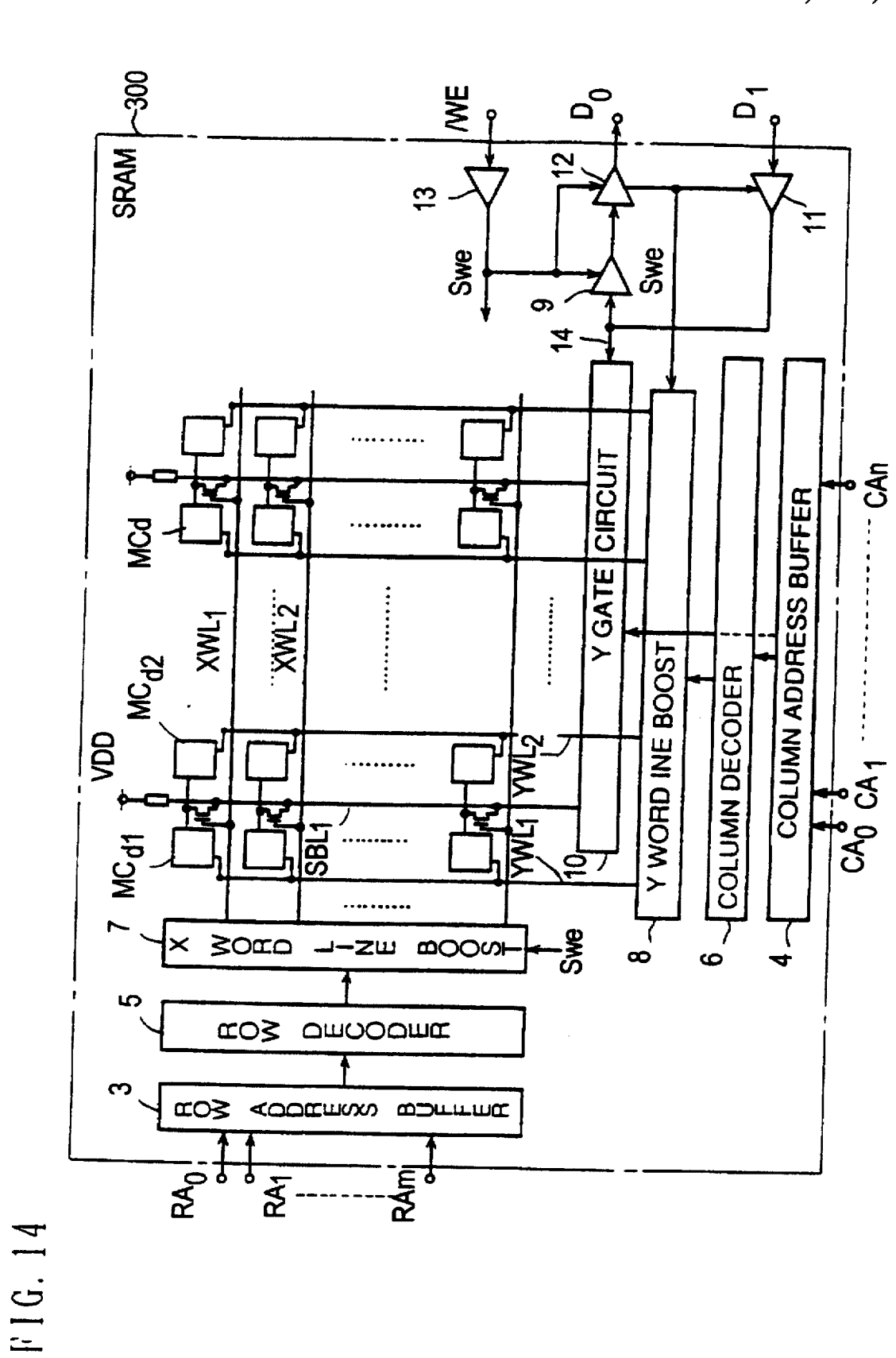
FIG. 14 is a block diagram of a SRAM showing another embodiment of the present invention.

FIG. 14 is a block diagram of a SRAM showing still another embodiment of the present invention. Referring to FIG. 14, the SRAM 300 is similar to the SRAM 200 of FIG. 12 in that a shared bit line is used for two adjacent columns. However, the number of transistors forming each memory cell is reduced by 1, resulting in a SRAM increased in integration density.

Figure 15:
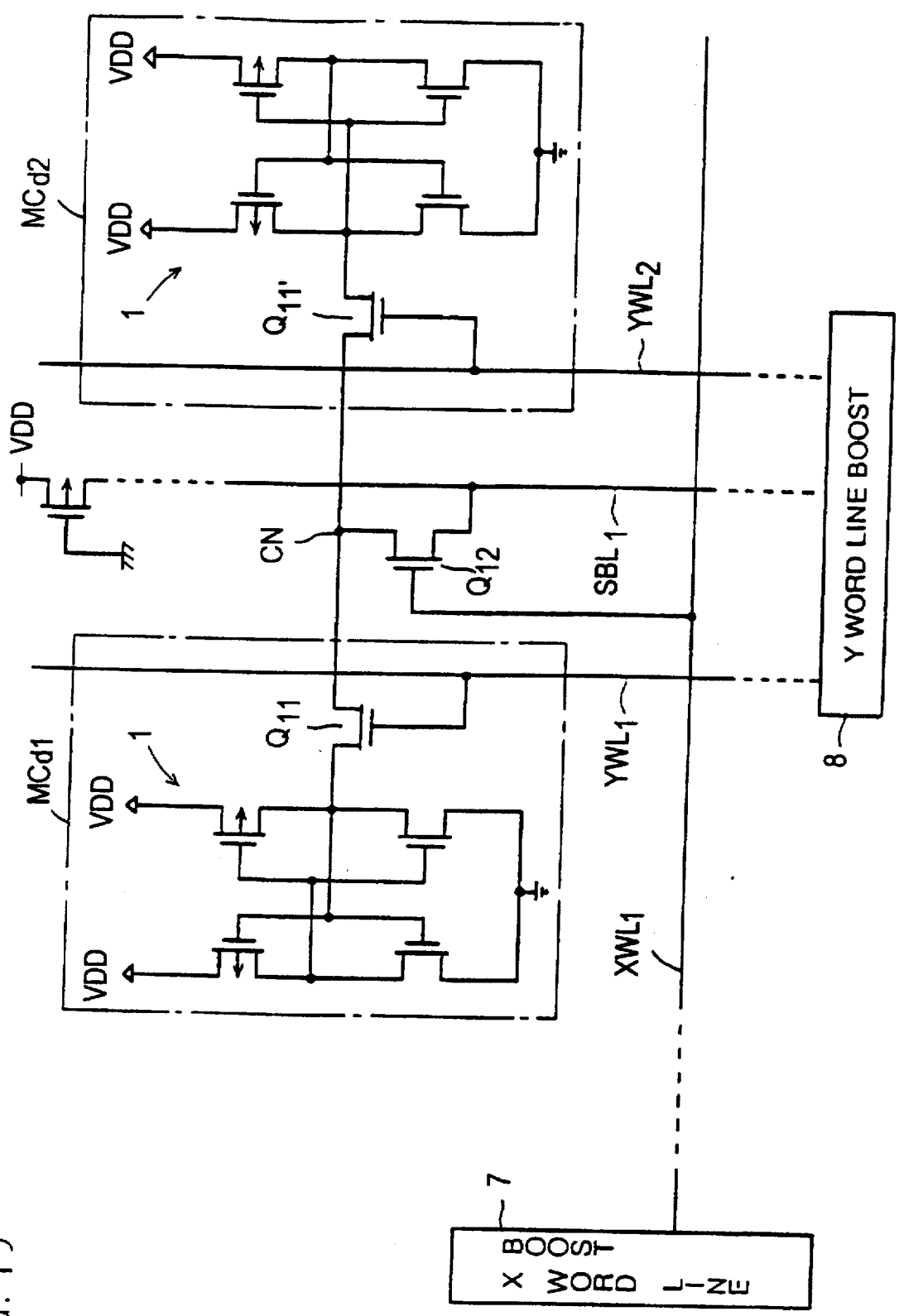
FIG. 15 is a circuit diagram of two adjacent memory cells of FIG. 14.

FIG. 15 is a circuit diagram of two adjacent memory cells of FIG. 14. Referring to FIG. 15, memory cells MCd1 and MCd2 of two adjacent columns are connected to the shared bit line SBL1. Each of memory cells MCd1 and MCd2 is formed of five MOS transistors. For example, the memory cell MCd1 includes a data storage circuit 1, and an NMOS transistor Q11 as an access gate. An NMOS transistor Q12 is connected between the common connection node CN of memory cells MCd1 and MCd2 and the shared bit line SBL1. The transistor Q12 is connected to the X word line boosting circuit 7 via the X word line XWL1. The access gate transistor Q11 in the memory cell MCd1 is connected to the Y word line boosting circuit 8 via the Y word line YWL1. The access gate transistor Q11' in the memory cell MCd2 has the gate connected to the Y word line boosting circuit 8 via the Y word line YWL2. Each of memory cells MCd1 and MCd2 shown in FIG. 15 has circuit characteristics satisfying the relationship shown in FIG. 7, as the memory cell MCa of FIG. 2.

The transistor Q12 functions as a shared access gate transistor. More specifically, when the memory cell MCd1 is accessed, the transistor Q12 is turned on as well as the transistor Q11. Therefore, the data storage circuit 1 of the memory cell MCd1 is connected to the shared bit line SBL1 via transistors Q11 and Q12. Particularly, in the writing operation, the gate voltage of the transistor Q11 is boosted by the Y word line boosting circuit 8, and the gate voltage of the transistor Q12 is boosted by the X word line boosting circuit 7. Therefore, at the time of writing operation, a circuit is formed equivalent to the case of the memory cell MCa already described with reference to FIG. 2, so that the same advantages can be obtained. More specifically, at the time of writing operation, both the gate voltages of transistors Q11 and Q12 are boosted with respect to only the memory cell to be accessed, for example with respect to only memory cell MCd1, so that the data signal provided from the shared bit line SBL1 can be written only to the memory cell MCd1.

Thus, by applying any of the memory cell circuits shown in FIGS. 2, 11, 13 and 15, desired data can be written into only the required memory cells at the time of data writing operation. This means that erroneous data writing into an unrequired memory cell is prevented.

The memory cells adapted in the above-described embodiments, i.e. the memory cell MCa of FIG. 2, the memory cell MCb of FIG. 11, and the memory cell MCc1 of FIG. 13, have the two access gate transistors connected in series. Because a SRAM generally includes a plurality of memory cells, reduction of the occupying area of each memory cell in a semiconductor substrate is required. In order to reduce the occupying area on a semiconductor substrate by the access gate transistors connected in series, a structure of an access gate transistor is proposed which will be described hereinafter. The description will be carried out with reference to the drawings of manufacturing steps.

Figure 16:
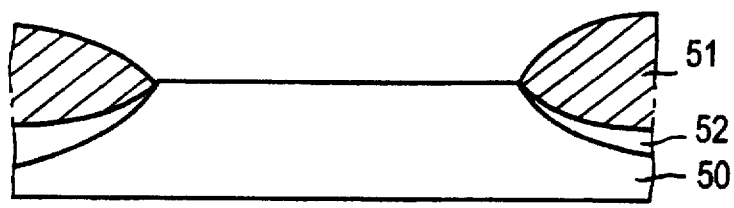
FIGS. 16-20 are sectional views of an access gate transistor showing the first-fifth steps of a first manufacturing method.
Figure 17:
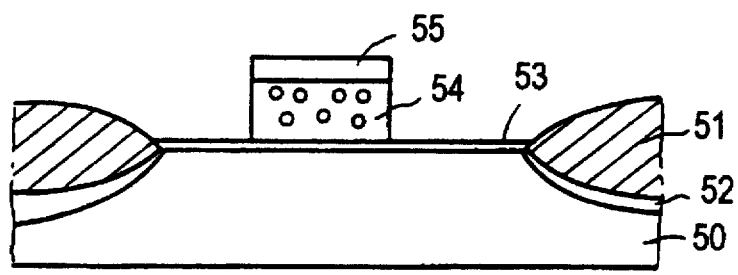

Referring to FIG. 16, a field oxide film 51 and a $p^+$ isolation layer 52 are formed in an element isolation region on a p type semiconductor substrate 50. Referring to FIG. 17, a gate oxide film 53 is formed on the main surface of the substrate 50, followed by the formation of a first polycrystalline silicon film 54. A silicon oxide film 55 is formed on the first polycrystalline silicon film 54 by CVD.

Figure 18:
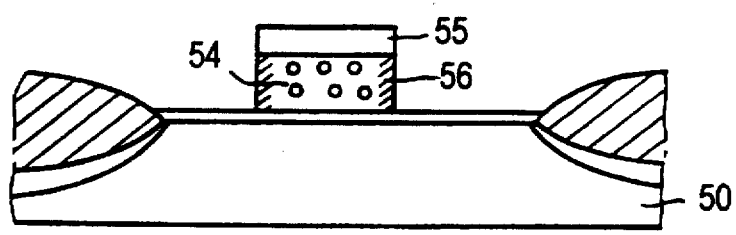
Figure 19:
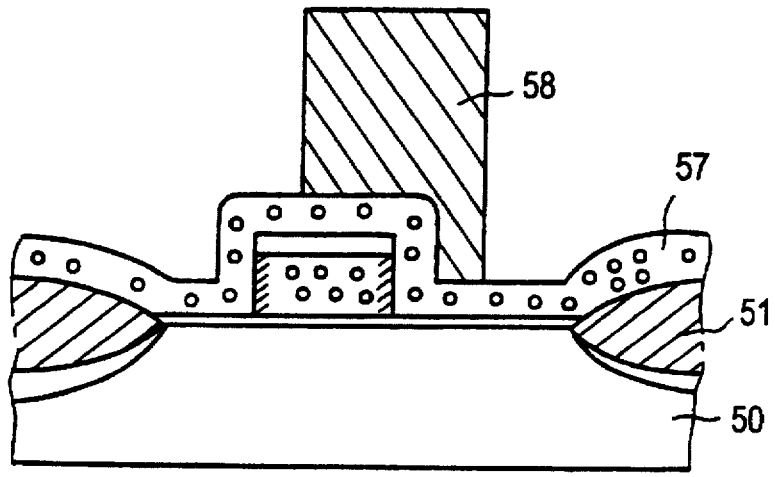

Referring to FIG. 18, an oxide film 56 not more than 10 nm is formed by thermal oxidation at the sidewall of the first polycrystalline silicon film 54. Because the oxidation rate of the polycrystalline silicon layer 54 is greater by several to ten and several times with respect to the silicon substrate 50, the oxidized amount of the silicon substrate 50 by this thermal oxidation process is considerably modest. Referring to FIG. 19, following the formation of a second polycrystalline silicon film 57, a photoresist film 58 is formed on a desired portion on the polycrystalline silicon film 57 by photolithography. Using the photoresist film 58 as a mask, the second polycrystalline silicon film 57 is etched by plasma etching using a freon-based or chlorine-based gas to form a gate electrode of the access gate transistor Q6.

Figure 20:
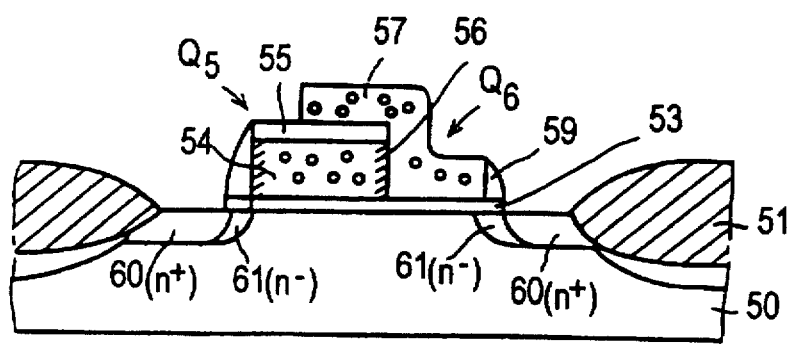

Then, by the so-called LDD method, an $n^-$ layer 61 on the order of $10^{18}$ cm$^{-3}$, for example, and an $n^-$ layer 60 on the order of $10^{20}$ cm$^{-3}$ are formed at one side of the access gate transistor Q5 and at one side of the access transistor Q6, as shown in FIG. 20. As a result, a structure suitable for high integration applicable to the access gate transistors Q5 and Q6 shown in FIG. 2 can be obtained. Other insulation films, for example a silicon nitride film may be used instead of the silicon oxide film 55.

Figure 21:
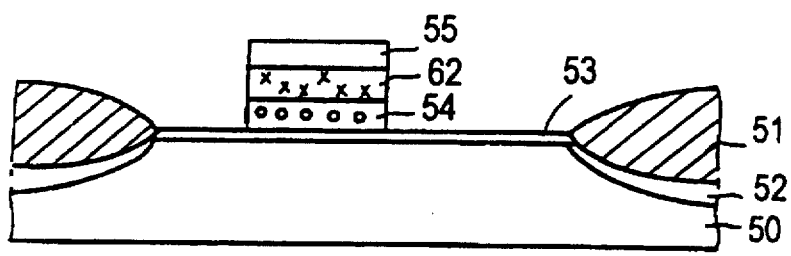
FIGS. 21-23 are sectional views of an access gate transistor showing the first-third manufacturing steps of a second manufacturing method.
Figure 22:
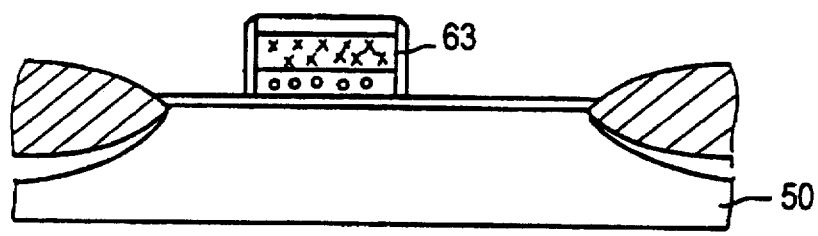
Figure 23:
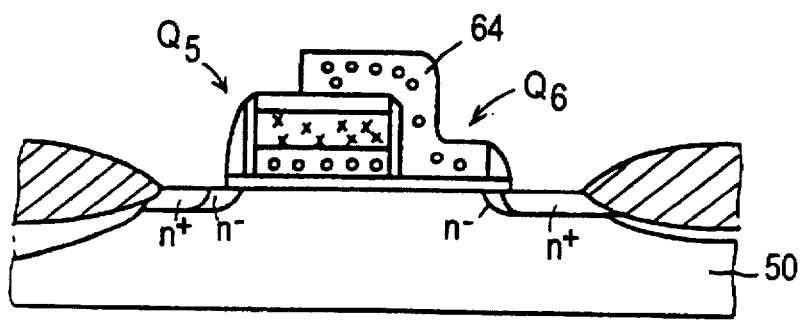

FIGS. 21 to 23 show another manufacturing method for forming the access gate transistors Q5 and Q6. Referring to FIG. 21, a polycrystalline silicon film 54 and an tungsten silicide film 62 are formed to form the gate electrodes of the access gate transistors Q5 and Q6. More specifically, not only one layer of the polycrystalline silicon film 54, but also a composite film of refractory silicide film such as of WSix, MoSix, TiSix and a polycrystalline silicon film, i.e. a polycide film is used for the gate electrode of the transistor Q5. An insulation film 55 such as of a silicon oxide film or a silicon nitride film is formed on the tungsten silicide film 62 by a CVD method to a thickness of several tens of nm.

Referring to FIG. 22, a protection film 63 is formed only on the sidewall of the gate electrode by carrying out plasma etching having a strong directivity. By carrying out a manufacturing process similar to that of the first manufacturing method (FIGS. 19 and 20) thereafter, access gate transistors Q5 and Q6 are formed as shown in FIG. 23. The protection film 63 of FIG. 22 may be used also in the first manufacturing method instead of the thermal oxide film 56 of FIG. 18.

Figure 24:
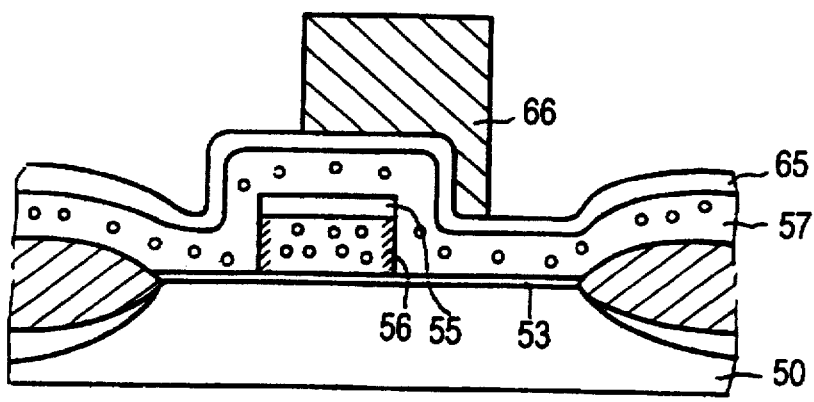
FIGS. 24 and 25 are sectional views of an access gate transistor showing the first and second step of a third manufacturing method.
Figure 25:
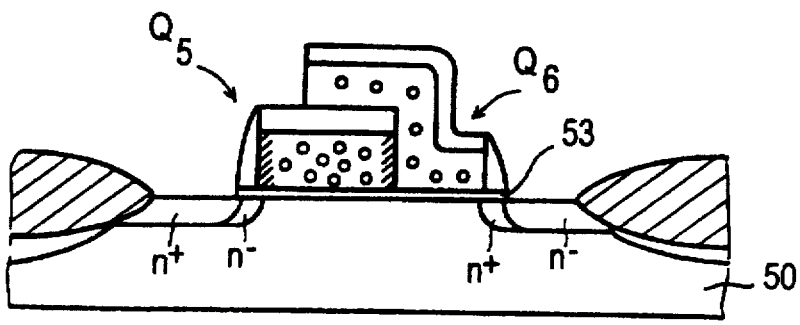

A third manufacturing method will be described hereinafter with reference to FIGS. 24 and 25. Following the manufacturing steps already described with reference to FIGS. 16-18, a second polycrystalline silicon film 57 is formed as shown in FIG. 24. Then, a second silicon oxide film 65 is formed having a thickness of, for example, several tens to several hundreds of nm on the second polycrystalline silicon film 57 by a CVD method. Using a photoresist film 66 as a mask, the second silicon oxide film 65 is etched by photolithography to remove the photoresist film 66. Using the second silicon oxide film 65 as a mask, the second polycrystalline silicon film 57 is etched.

According to this manufacturing method, a great difference in the etching rate of the silicon oxide film 65 can be provided in etching the polycrystalline silicon film 57. In other words, improvement in the etching selectivity will prevent reduction in the thinness of the gate oxide film 53 and further prevents excessive etching of the gate oxide film 53 to breakthrough to the silicon substrate 50. Then, by carrying out the process similar to those of the first and second manufacturing methods, access gate transistors Q5 and Q6 having the structure shown in FIG. 25 are obtained.

Figure 26:
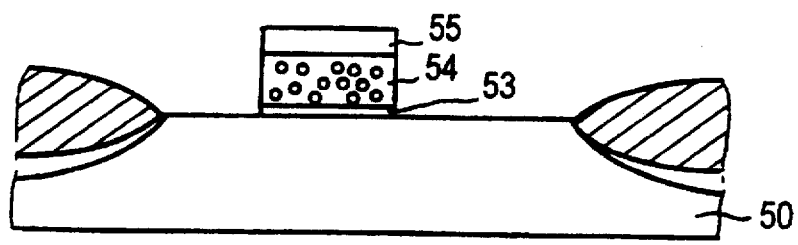
FIGS. 26-28 are sectional views of an access gate transistor showing the first-third steps of a fourth manufacturing method.
Figure 27:
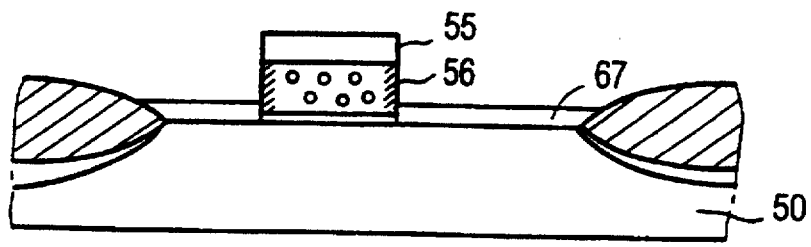
Figure 28:
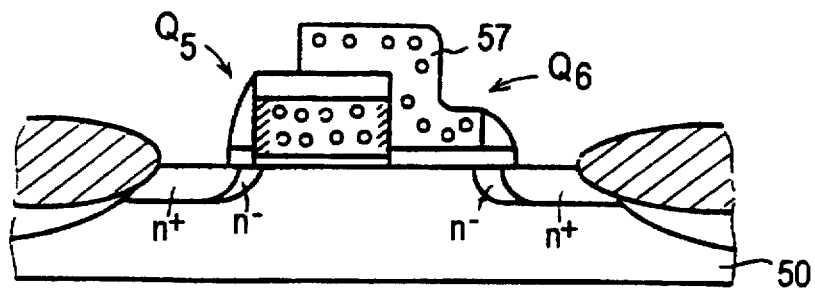

Referring to FIGS. 26-28, a fourth manufacturing method for access gate transistors Q5 and Q6 will be described. After a first polycrystalline silicon film 54 is etched as show in FIG. 17 similar to the first manufacturing method, the gate oxide film 53 is removed by HF based wet etching or plasma etching using etching gas such as CHF$_3$ (FIG. 26). Referring to FIG. 27, a second gate oxide film 67 is newly formed on the substrate 50. At the same time, the sidewall of the first polycrystalline silicon film 54 is oxidized to form an oxide film 56.

After carrying out a process similar to that of the first manufacturing method, access gate transistors Q5 and Q6 having a structure shown in FIG. 28 are obtained. According to this fourth manufacturing method, contamination of the gate oxide film caused by impurities from the etching gas and/or etching chamber is prevented to suppress degradation in the characteristics of the access gate transistor Q6 in the etching step of the first polycrystalline silicon film 54.

Figure 29:
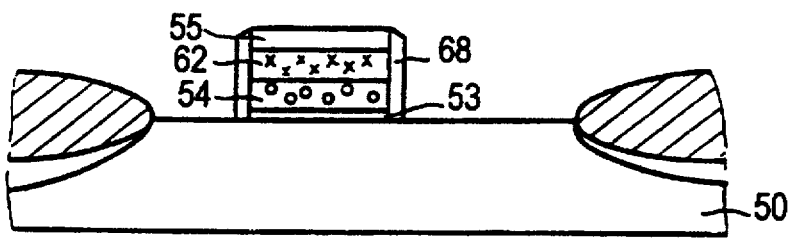
FIGS. 29-31 are sectional views of an access gate transistor showing the first-third steps of a fifth manufacturing method.
Figure 30:
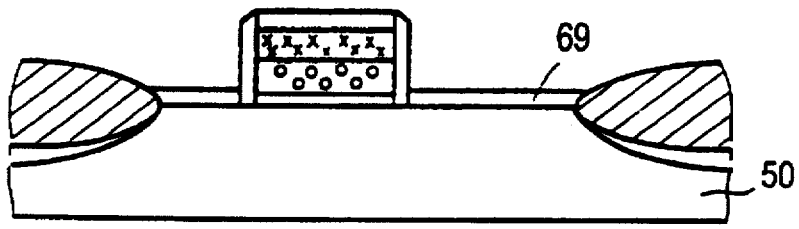
Figure 31:
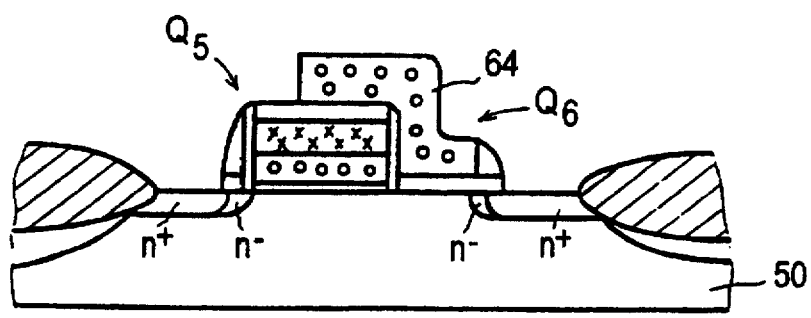

A fifth manufacturing method will be described hereinafter with reference to FIGS. 29–31. The fifth manufacturing method is equivalent to a combination of the second and fourth manufacturing methods. After a gate electrode is formed for the transistor Q5 having the structure shown in FIG. 21, the gate oxide film 53 is removed by an HF-based wet etching or etching using gas such as CHF$_3$. Then, a protection film 68 of a silicon nitride film or a silicon oxide film is formed on the sidewall of the gate electrode, as shown in FIG. 29. Referring to FIG. 30, after a second gate oxide film 69 is formed, a process similar to that already described is carried out to obtain access gate transistors Q5 and Q6 having the structure shown in FIG. 31.

Although the first gate oxide film 53 was removed in the above-described fourth and fifth manufacturing methods, contamination due to impurities is most significant in the surface of the gate oxide film 53. Therefore, it is effective to remove only the surface of the gate oxide film 53 by etching. In this case, after the surface of the gate oxide film 53 is etched away, the second gate oxide film 69 is formed thereupon. An effect similar to that of the fourth and fifth manufacturing methods can be obtained.

In using the above-described first to sixth manufacturing methods, a slight change in the positions of the gate electrodes of the access gate transistors Q5 and Q6 is expected, resulting in a problem that the channel lengths of the two transistors Q5 and Q6 are modified. However, in practice, the deviation in the position of the two gate electrodes is within the range of ±0.10 μm. This does not adversely affect the current characteristics of transistors Q5 and Q6.

In the following description, a manufacturing method of substantially completely preventing an offset in the position of the gate electrodes of the access transistors Q5 and Q6, i.e. deviation in the channel lengths of these transistors will be described hereinafter.

Figure 32:
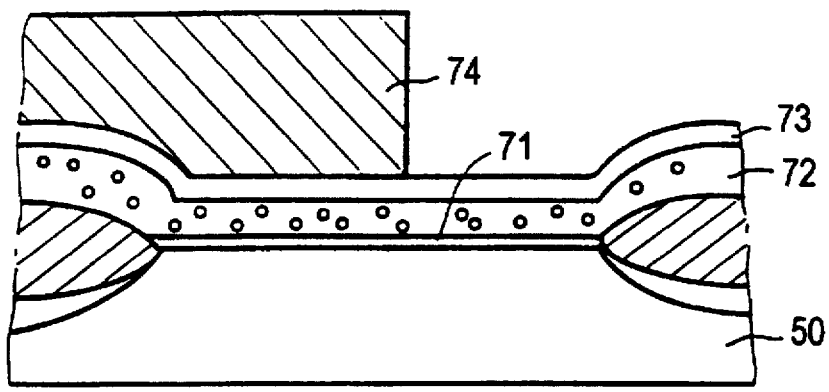
FIGS. 32-35 are sectional views of an access gate transistor showing the first-fourth steps of a sixth manufacturing method.
Figure 33:
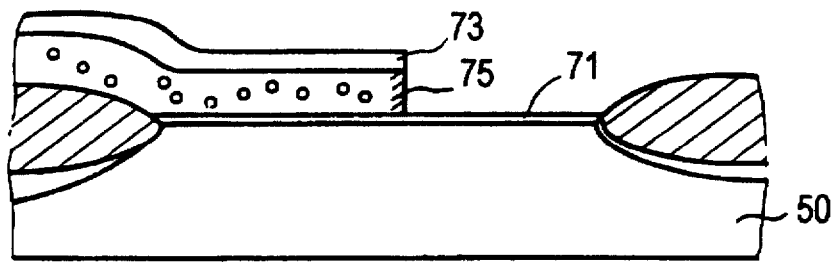

FIGS. 32–35 show a sixth manufacturing method. As in the case of the first manufacturing method, a gate oxide film 71, a first polycrystalline silicon film 72, and a silicon oxide film 73 are formed on a substrate 50. Then, a photoresist film 74 is formed by photolithography for determining one end of the gate electrode of the access gate transistor Q5 (FIG. 32). Using the photoresist film 74 as a mask as shown in FIG. 33, etching is carried out to remove the resist film 74, followed by oxidation of the sidewall of the polycrystalline silicon film 75 to form a silicon oxide film 75.

Figure 34:
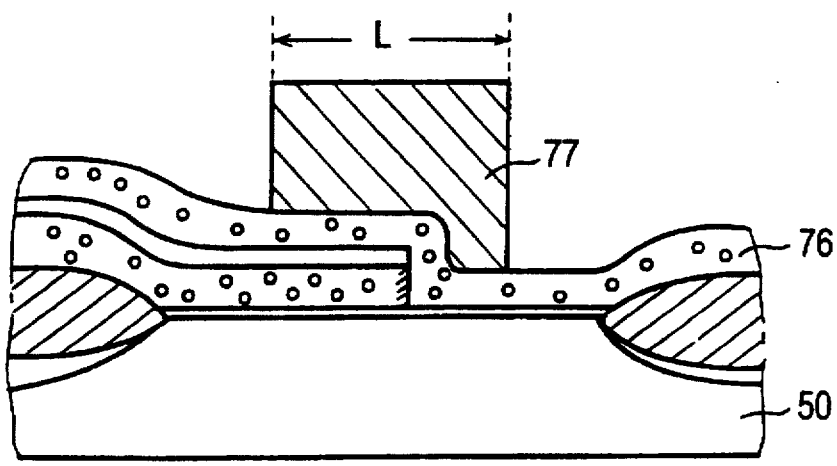
Figure 35:
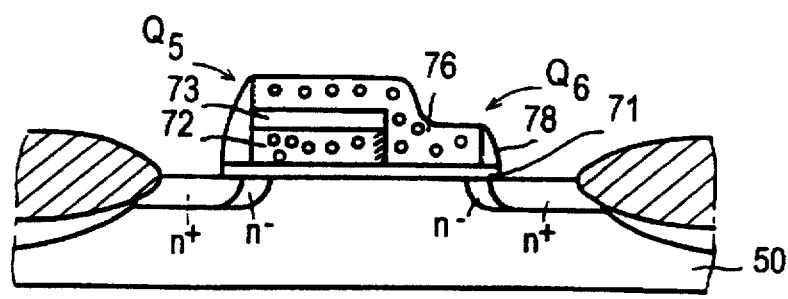

Referring to FIG. 34, following the formation of a second polycrystalline silicon film 76, a photoresist film 77 is formed on a desired portion on the second polycrystalline silicon film 76 by photolithography. The shape and dimension of the photoresist film 77 determines the gate lengths (or the channel lengths) of the two access gate transistors Q5 and Q6, i.e. the length L shown in FIG. 34.

Using the photoresist film 77 as a mask, first the second polycrystalline silicon film 76, then the silicon oxide film 73, and finally the first polycrystalline silicon film 71 are etched away. Then, as in the other manufacturing methods, a LDD structure is formed in the substrate 50 to result in the access gate transistors Q5 and Q6 having the structure shown in FIG. 35.

Figure 36:
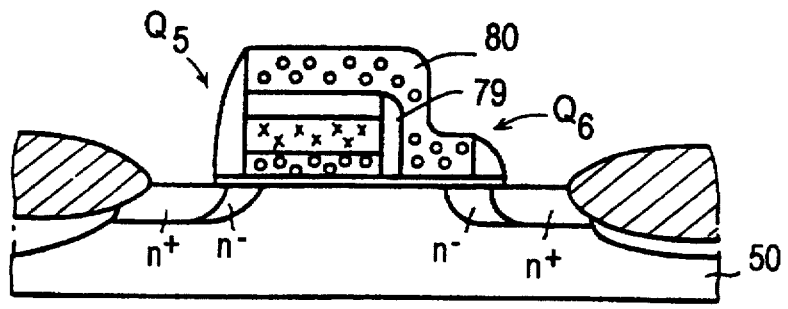
FIG. 36 is a sectional view of an access gate transistor showing the last step of a seventh manufacturing method.

Access gate transistors Q5 and Q6 having the structure shown in FIG. 36 can be obtained by a combination of the second and sixth manufacturing methods. That is to say, according to a seventh manufacturing method, a silicon nitride film 79 is formed on the sidewall of the gate electrode of the transistor Q5.

Figure 37:
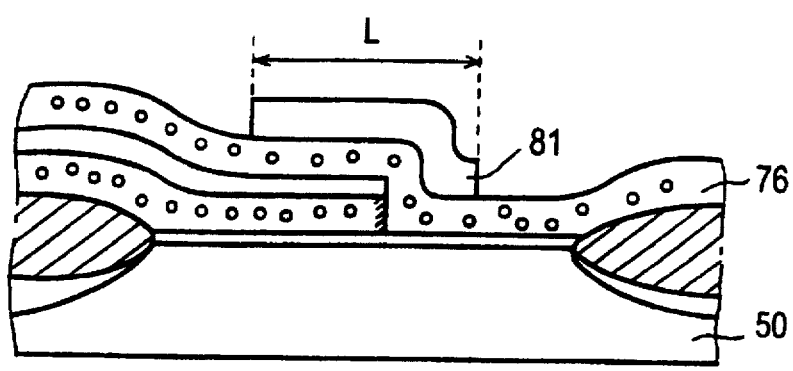
FIGS. 37 and 38 are sectional views of an access gate transistor showing the first and second steps of an eighth manufacturing method.
Figure 38:
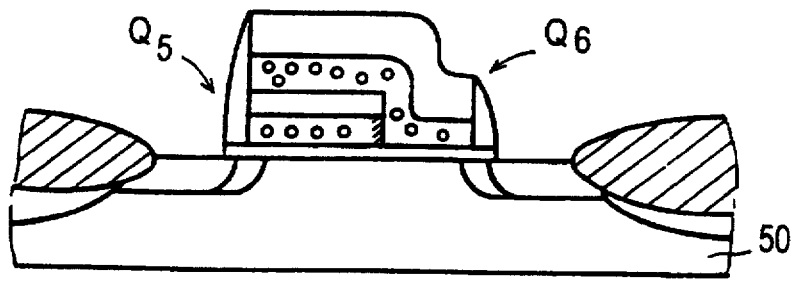

An eighth manufacturing method will be described with reference to FIGS. 37 and 38. After the process shown in FIGS. 32 and 33 of the sixth manufacturing method is carried out, a second polycrystalline silicon film 76 is formed as shown in FIG. 37. Then, a silicon oxide film 81 is formed on the second polycrystalline silicon film 76. The silicon oxide film 81 is etched using a photoresist film (not shown) determining the gate length L of transistors Q5 and Q6 to form the silicon oxide film 81 shown in FIG. 37 on the second polycrystalline silicon film 76.

Using the silicon oxide film 81 as a mask, the films including the second polycrystalline silicon film 76 and the underlying films are etched. By carrying out a process similar to that of the already described manufacturing methods, transistors Q5 and Q6 having the structure shown in FIG. 38 can be obtained.

According to the above-described eighth manufacturing method, a great selectivity can be obtained with the relationship of the gate oxide film not only in the etching of the second polycrystalline silicon film, but also in the etching of the first polycrystalline silicon film.

Figure 39:
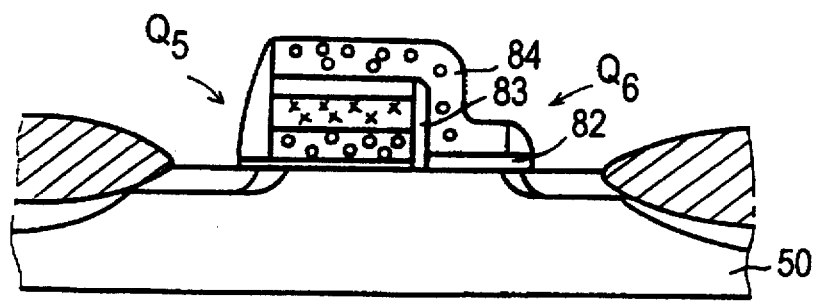
FIG. 39 is a sectional view of an access gate transistor showing the final step of a ninth manufacturing method.

FIG. 39 shows the structure of transistors Q5 and Q6 formed by a ninth manufacturing method. As in the cases of the fourth, fifth, and sixth manufacturing methods, degradation in the characteristics of the transistor Q6 can be prevented by removing all or at least the surface of the gate oxide film of the access gate transistor Q5.

All the above-described first–ninth manufacturing methods have the gate electrode of the transistor Q5 covered by an insulation film such as a silicon oxide film or a silicon nitride film, and the sidewall portion covered by a protection film having insulation such as a silicon oxide film or a silicon nitride film for the purpose of preventing shorting between the two access gate transistors Q5 and Q6. Assuming that an ideal film is formed, the thicknesses of the insulation film and the protection film are at least several tens of nm, and preferably at least 100 nm accounting for the stabilization of the operation of a SRAM.

It is not easy to form a channel in the silicon substrate region in contact with the protection film formed on the sidewall portion of the gate electrode of the access gate transistor Q5 when a gate voltage is applied. For example, in the case a silicon oxide film of 100 nm in thickness is formed on a silicon substrate, the current driving capability (or mutual conductance) of the transistor Q5 is reduced by approximately 30%.

As already described, because the beta ratio βr in the memory cell MCa of FIG. 2, for example, must satisfy the relationship of $0.2 \leq \beta r \leq 1.0$, the current driving capability (or mutual conductance) of the driver transistor (transistor Q4 shown in FIG. 2) must be reduced according to the reduction of the current driving capability (or mutual conductance) of access transistors Q5 and Q6. This allows a smaller gate width of the driver transistor Q5 to be designed to contribute to reducing the occupying area of the memory cell on the semiconductor substrate.

Complete insulation between the two transistors Q5 and Q6 may not be ensured even when the access gate transistors Q5 and Q6 are formed according to the above-described manufacturing methods. More specifically, the thermal oxide film 56 shown in FIG. 18 or the protection film 63 shown in FIG. 22 formed between the gate electrodes of the two transistors Q5 and Q6 may not be established at a constant thickness. This will cause a change in the characteristics of the two transistors Q5 and Q6, so that a stable value of the above-described beta ratio βr cannot be obtained. This means that there is a possibility of erroneous operation in data reading or writing in the memory cells using such access gate transistors Q5 and Q6. A manufacturing method will be described hereinafter that is effective for preventing such erroneous operation.

Figure 40:
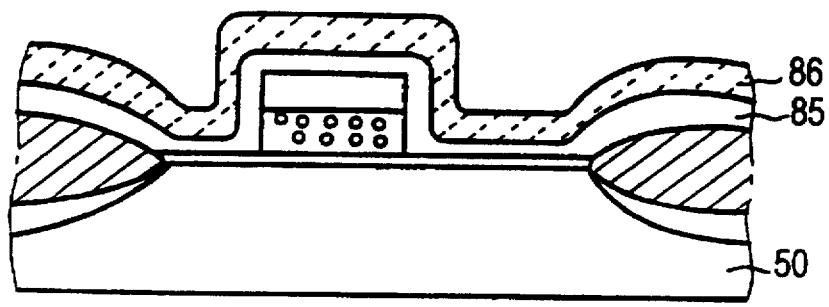
FIGS. 40-45 are sectional views of an access gate transistor showing the first-sixth steps of a tenth manufacturing method.

FIGS. 40–43 show a tenth manufacturing method of forming access gate transistors Q5 and Q6. Referring to FIG. 40, as in the case of the other manufacturing methods, a gate electrode of the transistor Q5 is formed, followed by the formation of a silicon nitride film 85 by a CVD method. A silicon oxide film 86 is formed thereupon. The thicknesses of the silicon nitride film 85 and the silicon oxide film 86 are, for example, 50 nm and 100 nm, respectively.

Following the step of FIG. 40, a thick photoresist film, the so-called bottom resist film 87 is formed on the silicon oxide film 86. A solution obtained by dissolving silicon oxide into an organic solvent is applied on the bottom resist film 87. By a baking process of the applied solution, a silicon oxide film 88 is formed. More specifically, a silicon oxide film 88 is formed by the so called spin-on-glass method. After a thin photoresist film, i.e. a top resist film 89 is applied on the silicon oxide film 88, the top resist film 89 is patterned by photolithography (FIG. 41).

Figure 41:
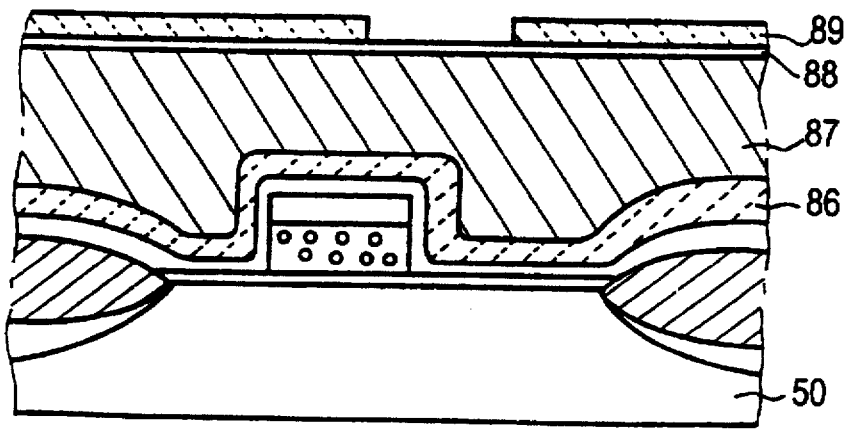

Following the step of FIG. 41, the intermediate silicon oxide film 88 is etched by resist dry etching using the top resist film 89 as a mask. Then, the photoresist film is entirely etched, until the intermediate silicon oxide film is exposed. At this stage, using this film as a mask, the remaining bottom resist film 87 is etched. This etching procedure is completed when the silicon oxide film 86 on the access gate transistor Q5 is exposed (FIG. 42).

Figure 42:
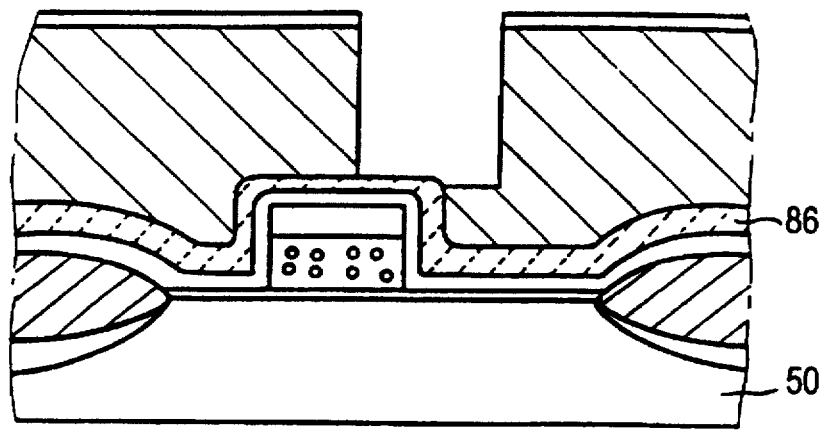

Following step of FIG. 42, the silicon oxide film on the sidewall of the gate electrode of the transistor Q5 is removed by HF-based wet etching. Using the bottom resist film 87 as a mask, an n type impurity region is formed in self-alignment beside the sidewall of the gate electrode. More specifically, an n type impurity region is formed by diffusion in the thermal treatment of a later process using, for example, arsenic ions, in an optimum manner to have an impurity concentration on the order of $10^{17}$ cm$^{-3}$14 $10^{20}$ cm$^{-3}$ (FIG. 43).

Figure 43:
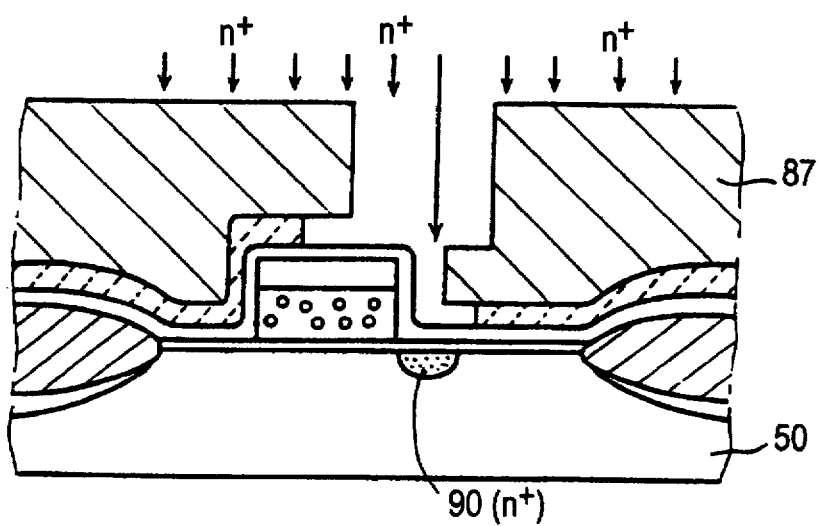
Figure 44:
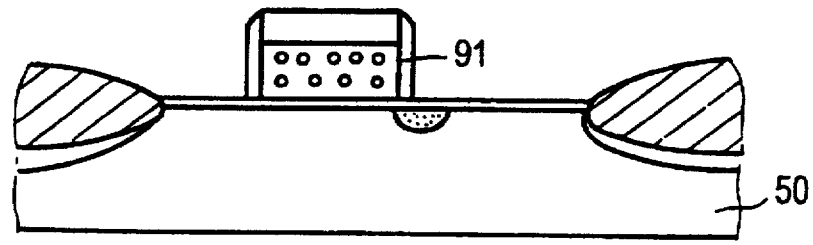
Figure 45:
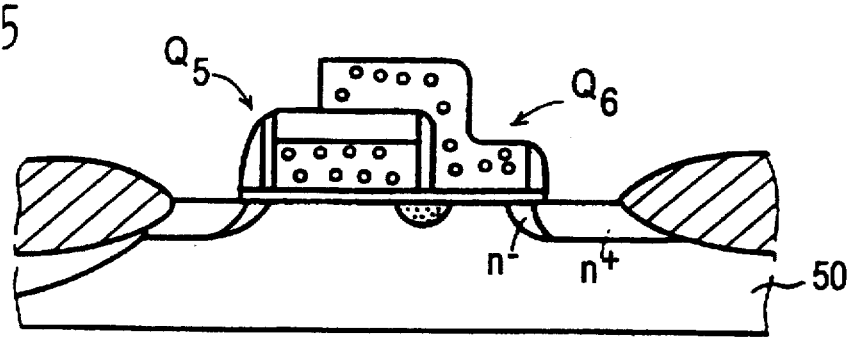

Following the step of FIG. 43, the bottom resist film 87 and the silicon oxide film 86 are removed. Then, a sidewall 91 of the silicon nitride film is formed by plasma etching of heavy directivity using $CF_4$, $CHF_3$ gas (FIG. 44). Following the step of FIG. 44, a process similar to that of other manufacturing methods is carried out to result in the access gate transistors Q5 and Q6 having the structure shown in FIG. 45.

Figure 46:
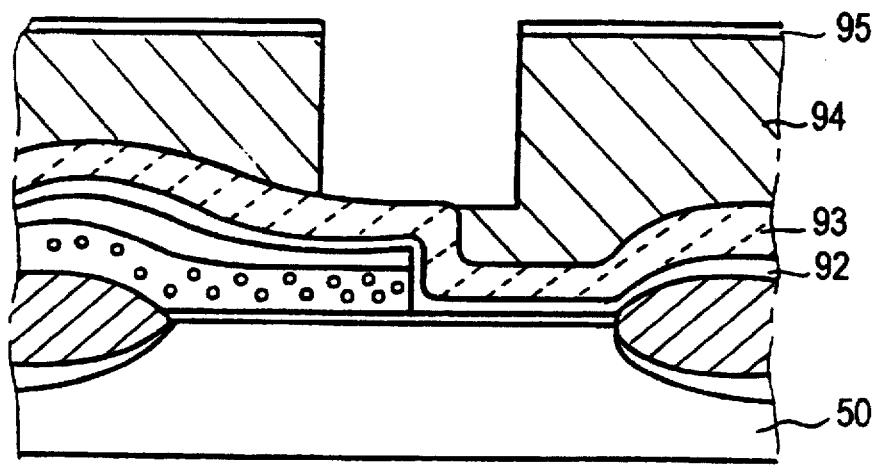
FIGS. 46-49 are sectional views of an access gate transistor showing the first-fourth steps of an eleventh manufacturing method.
Figure 49:
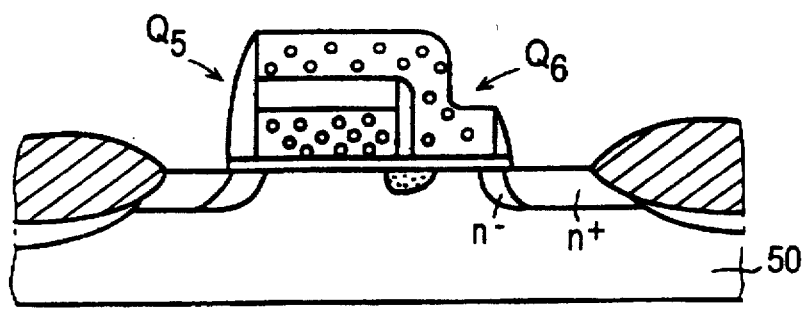

An eleventh manufacturing method for forming access gate transistors Q5 and Q6 is shown with reference to FIGS. 46 and 49. Referring to FIG. 49, as in the case shown in FIG. 32, the position of one end of the gate electrode of the access gate transistor Q5 is determined by etching, and a silicon nitride film 92 and a silicon oxide film 93 are deposited as shown in FIG. 46. Then, using a three layer resist process, photolithography, and resist dry etching, a bottom resist film 94 is etched so that the silicon oxide film 93 formed on top of the gate electrode is exposed (FIG. 46).

Figure 47:
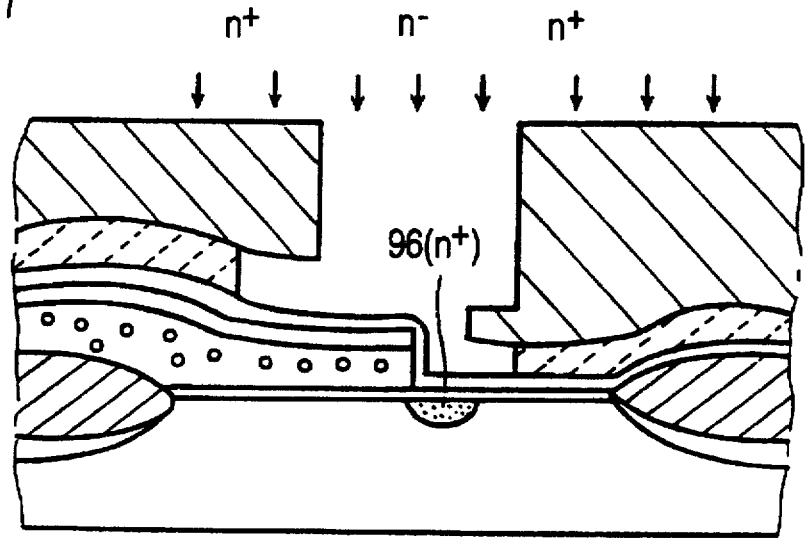
Figure 48:
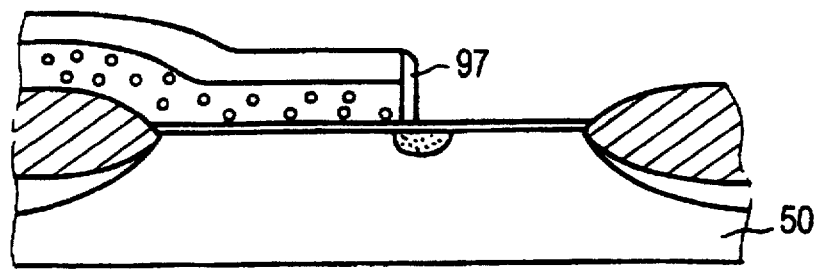

Following the step of FIG. 46, the silicon oxide film 93 is etched by HF-based wet etching. Similar to the case of the tenth manufacturing method, an n type impurity region is formed in self-alignment at the side of the gate electrode so that the impurity concentration after the thermal treatment is on the order of $10^{17}$–$10^{20}$ cm$^{-3}$ (FIG. 47). Then, as in the above-described tenth manufacturing method, a sidewall 97 of a silicon nitride film is formed as shown in FIG. 48, followed by a process similar to the other manufacturing method. Thus, the access gate transistors Q5 and Q6 having the structure shown in FIG. 9 are obtained.

The tenth and eleventh manufacturing methods can be applied in the case where the gate electrode of the transistor Q5 has a polycide structure, or in the case where a gate oxide film of the transistor Q6 is newly formed, resulting in similar effects.

Various manufacturing methods for forming two access gate transistors Q5 and Q6 have been described above. In the following, a manufacturing method of one memory cell will be described with reference to the layout diagrams of FIGS. 51–54.

Figure 51:
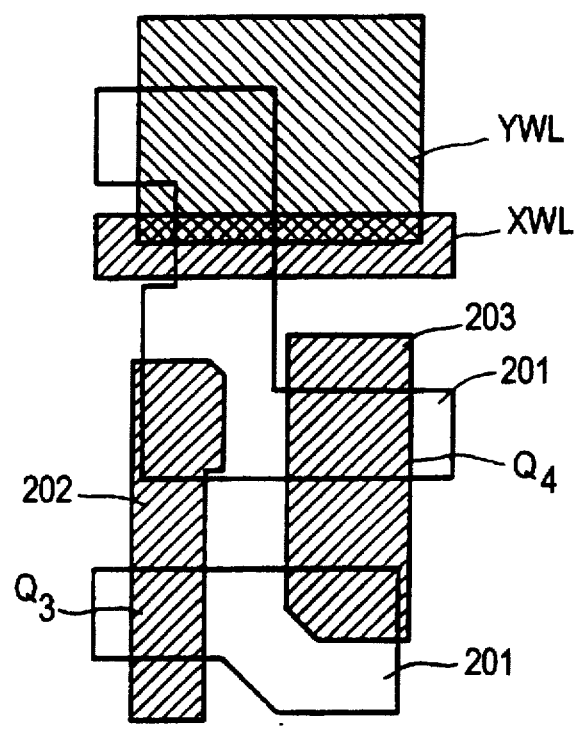
FIGS. 51-54 are layout diagrams of the memory cell of FIG. 2 showing the first-fourth steps of the manufacturing method thereof.

Referring to FIG. 51, activation region 201 is formed following the formation of an element isolation region. By a first polycrystalline silicon layer, a gate electrode 202 of the driver transistor Q and a gate electrode 203 of the access gate transistor Q5 are respectively formed. The first polycrystalline silicon layer forming the gate electrode 203 of the transistor Q5 also forms the word line XWL. Then, the gate electrode of the access gate transistor Q6, i.e. the word line YWL, is formed by the second polycrystalline silicon layer.

Figure 52:
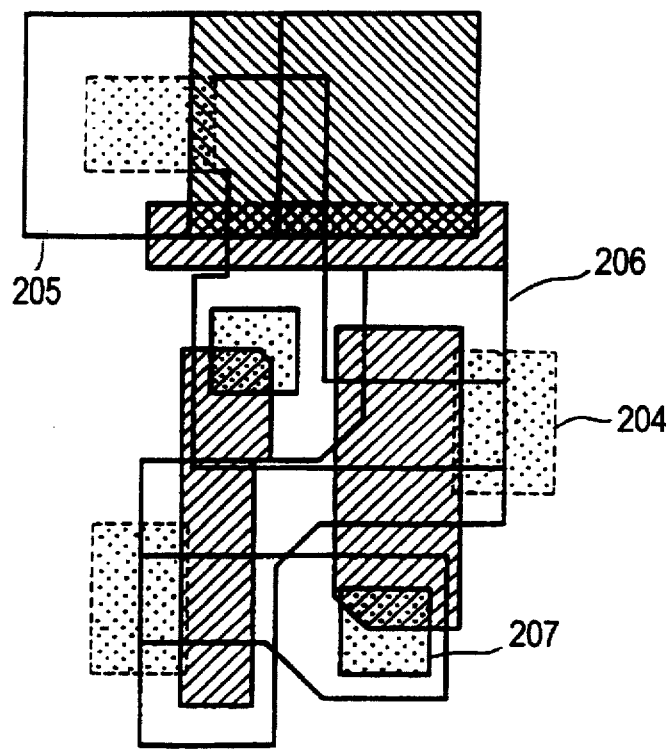

Referring to FIG. 52, a first direct contact 204 is opened by self-alignment. A contact pad 205 and a ground line 206 are formed by a third polycrystalline silicon layer, followed by the formation of a second direct contact 207.

Figure 53:
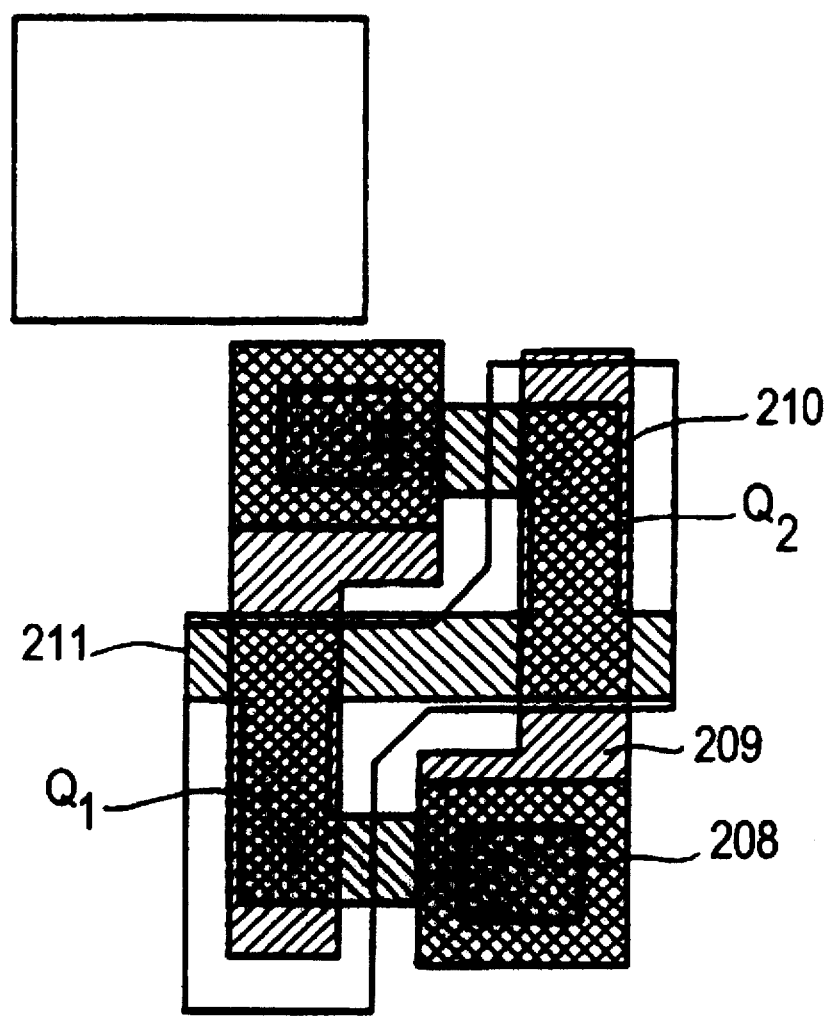

Referring to FIG. 53, thin film polysilicon transistors, i.e. TFT Q1 and Q2 are formed by fourth and fifth polycrystalline silicon layers and a third direct contact 208. A channel 210 of the polysilicon transistor and a VDD line 211 are respective formed by the fifth polycrystalline silicon layer. A gate electrode 209 of the polysilicon transistor is formed by the fourth polycrystalline silicon layer.

Figure 54:
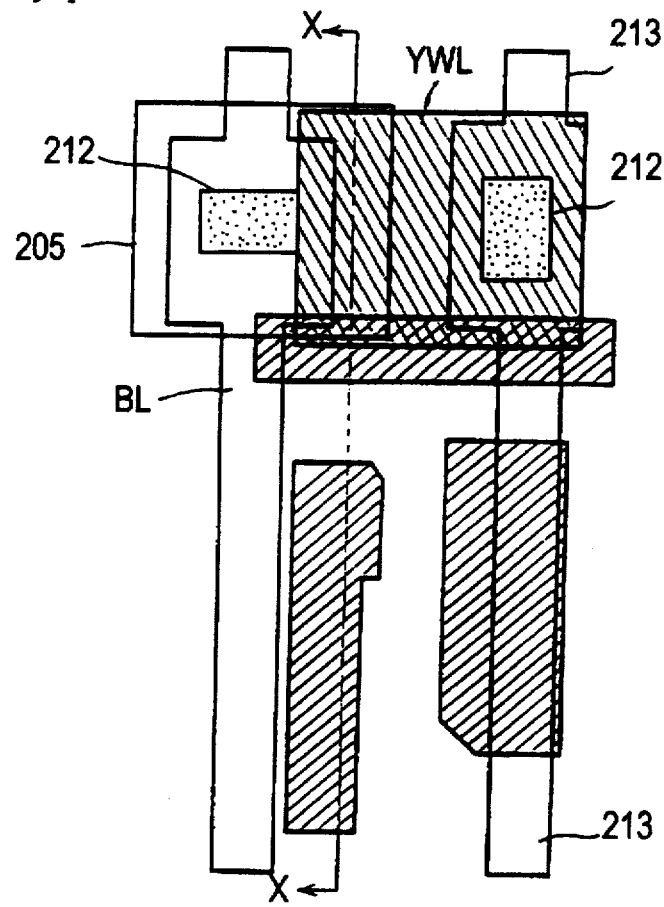
Figure 55:
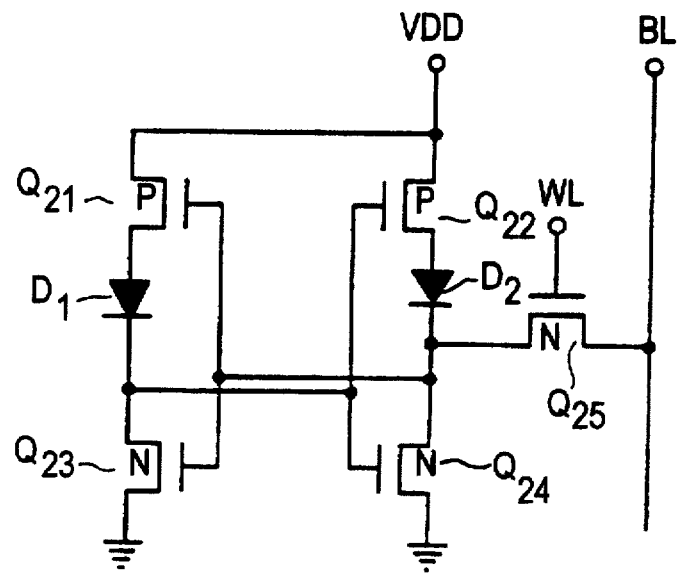
FIG. 55 is a circuit diagram of a conventional memory cell of a SRAM having a single bit line configuration.

Referring to FIG. 54, an aluminum contact 212 is formed on a contact pad 205 of the third polycrystalline silicon layer or on the word line YWL of the second polycrystalline silicon layer. By the first aluminum interconnection layer, the bit line BL, the word line YWL, and a selecting line 213 are respectively formed.

Figure 50:
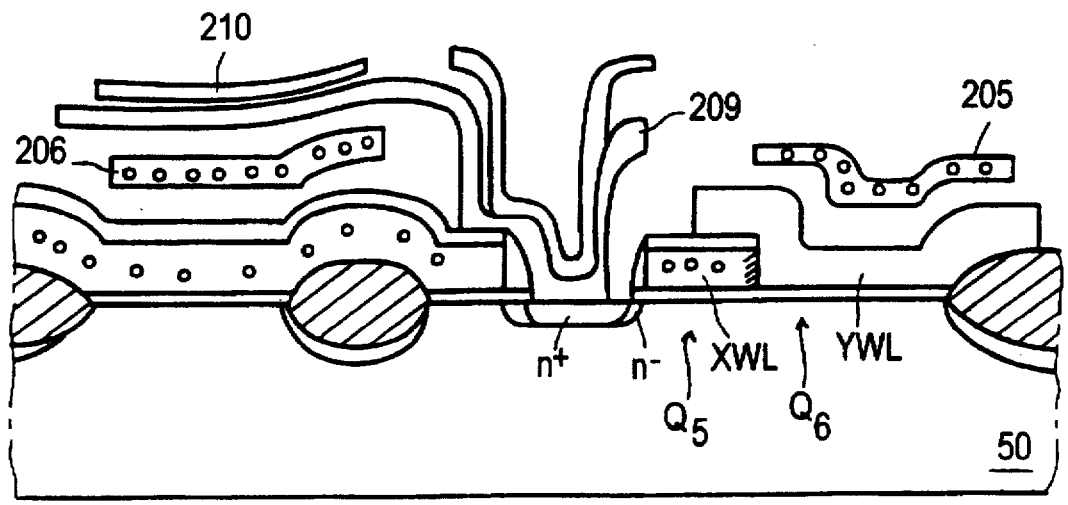
FIG. 50 is a sectional structure view of the portion taken along line X—X of FIG. 54.

A sectional view taken along line X—X of FIG. 54 is shown in FIG. 50. Referring to FIG. 50, the first polycrystalline silicon layer forming the gate electrode of the access gate transistor Q5 is shared as the word line XWL. The second polysilicon layer forming the gate electrode of the transistor Q6 is also used as the word line YWL. By the fourth and fifth polycrystalline silicon layers 209 and 210, a transistor Q1 forming a TFT is formed.

Improvements for carrying out data reading and writing more speedily will be described hereinafter. The SRAMs 100, 200 and 300 shown in FIGS. 1, 12 and 14, respectively have the data signal stored in the memory cell selected by row and column address signals is provided to one bit line. The data signal on the bit line is provided to the sense amplifier 9 via the Y gate circuit 10. Although not particularly mentioned in the above description, the sense amplifier 9 amplifies one input signal (i.e. a signal applied from one bit line). In the following embodiments, a SRAM employing a differential sense amplifier will be described for carrying out data reading at a high speed.

Figure 57:
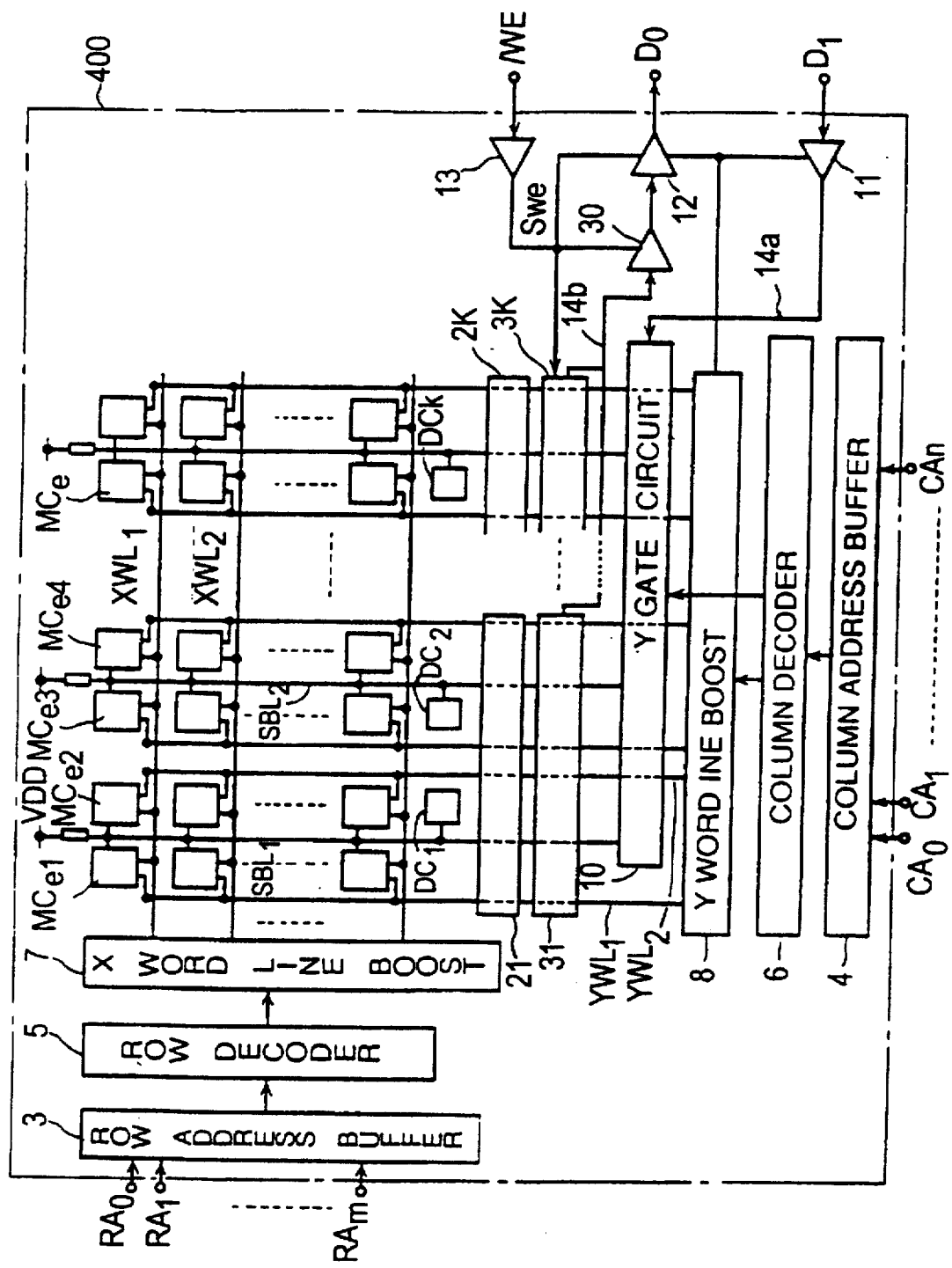
FIG. 57 is a block diagram of a SRAM showing yet another embodiment of the present invention.

FIG. 57 is a block diagram of a SRAM showing another embodiment of the present invention. Referring to FIG. 57, the SRAM 400 includes a plurality of memory cells MCe arranged in rows and columns. As the SRAM 200 shown in FIG. 12, the SRAM 400 is provided with one shared bit line SBL1, SBL2, . . . for every two columns of memory cells. For example, two memory cells MCe1 and MCe2 adjacent in the first and second columns are connected to one shared bit line SBL1. The two adjacent memory cells MCe3 and MCe4 in the third and fourth columns are connected to the shared bit line SBL2.

Dummy cells DC1, DC2, . . . identical in number to the shared bit lines are connected to corresponding bit lines SBL1, SBL2, . . . Each of dummy cell control circuits 21–2$k$ is provided for every two shared bit lines. For example, the dummy cell control circuit 21 is provided for the two shared bit lines SBL1 and SBL2 to control the activation of dummy cells DC1 and DC2 in response to Y word line signals YWL1–YWL4.

Each of differential amplifiers (or differential sense amplifiers) 31–3$k$ is provided for every two shared bit lines to amplify differentially the voltage between corresponding two shared bit lines. The data signal amplified by the differential amplifiers 31–3$k$ is provided to the differential sense amplifier 30 via a data line pair 14$b$ for transmission of read out data.

Figure 58:
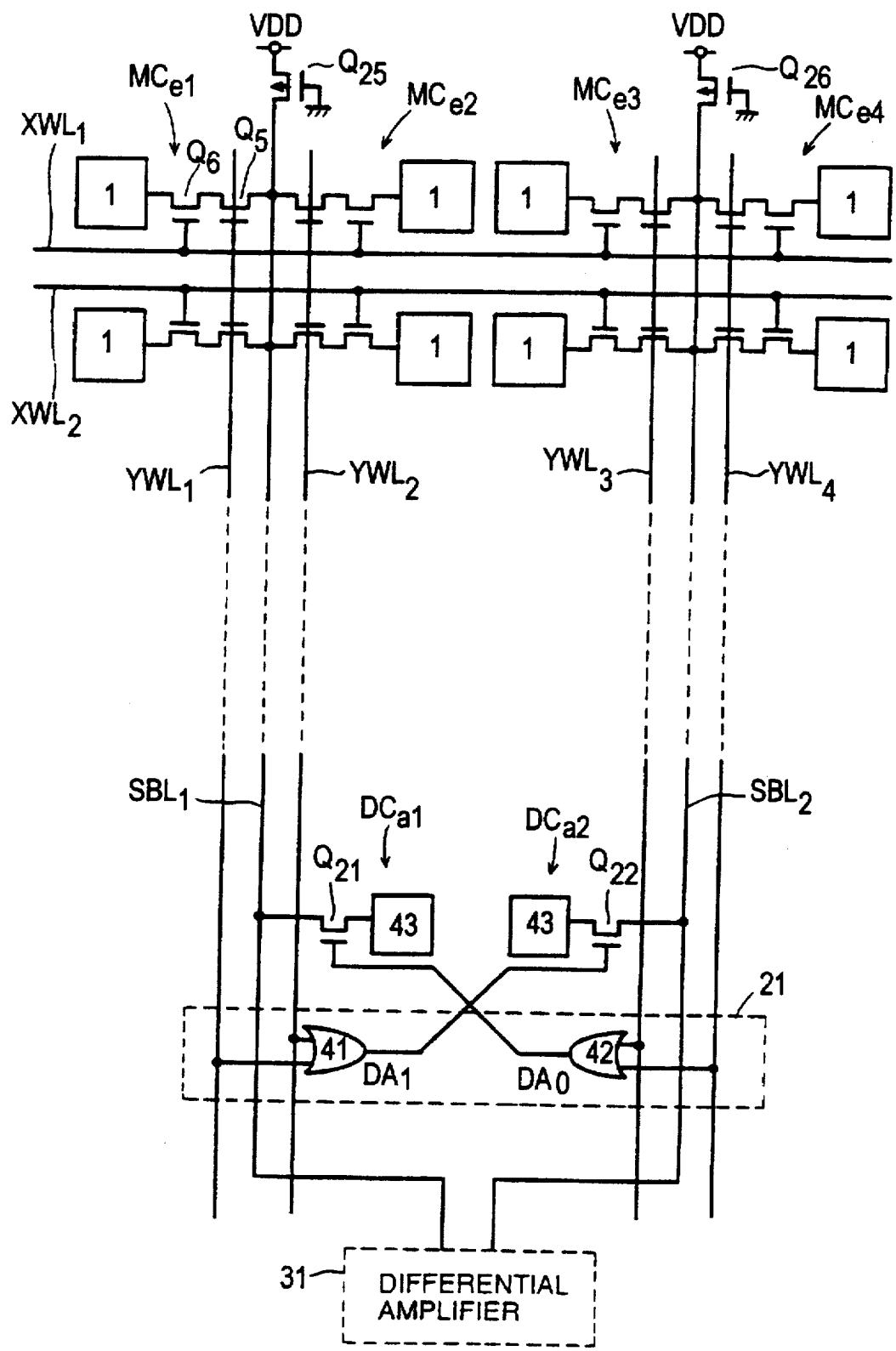
FIG. 58 is a circuit diagram of a dummy cell control circuit shown in FIG. 57.

FIG. 58 is a circuit diagram of one dummy cell control circuit 21 shown in FIG. 57. Referring to FIG. 58, a dummy cell DCa1 includes a transistor circuit 43 (the details will be described afterwards) connected to the shared bit line SBL1 via an NMOS transistor Q21. Similarly, a dummy cell DCa2 includes a transistor circuit 44 connected to the shared bit line SBL2 via an NMOS transistor Q22. The dummy cell control circuit 21 includes an OR gate 41 connected to Y word lines YWL1 and YWL2, and an OR gate 42 connected to Y word lines YWL3 and YWL4. The output signal DA1 of the OR gate 41 is applied to the gate of the transistor Q22. The output signal DA0 of the OR gate 42 is applied to the gate of the transistor Q21. The differential amplifier 31 amplifies the voltages between the shared bit lines SBL1 and SBL2.

Figure 59:
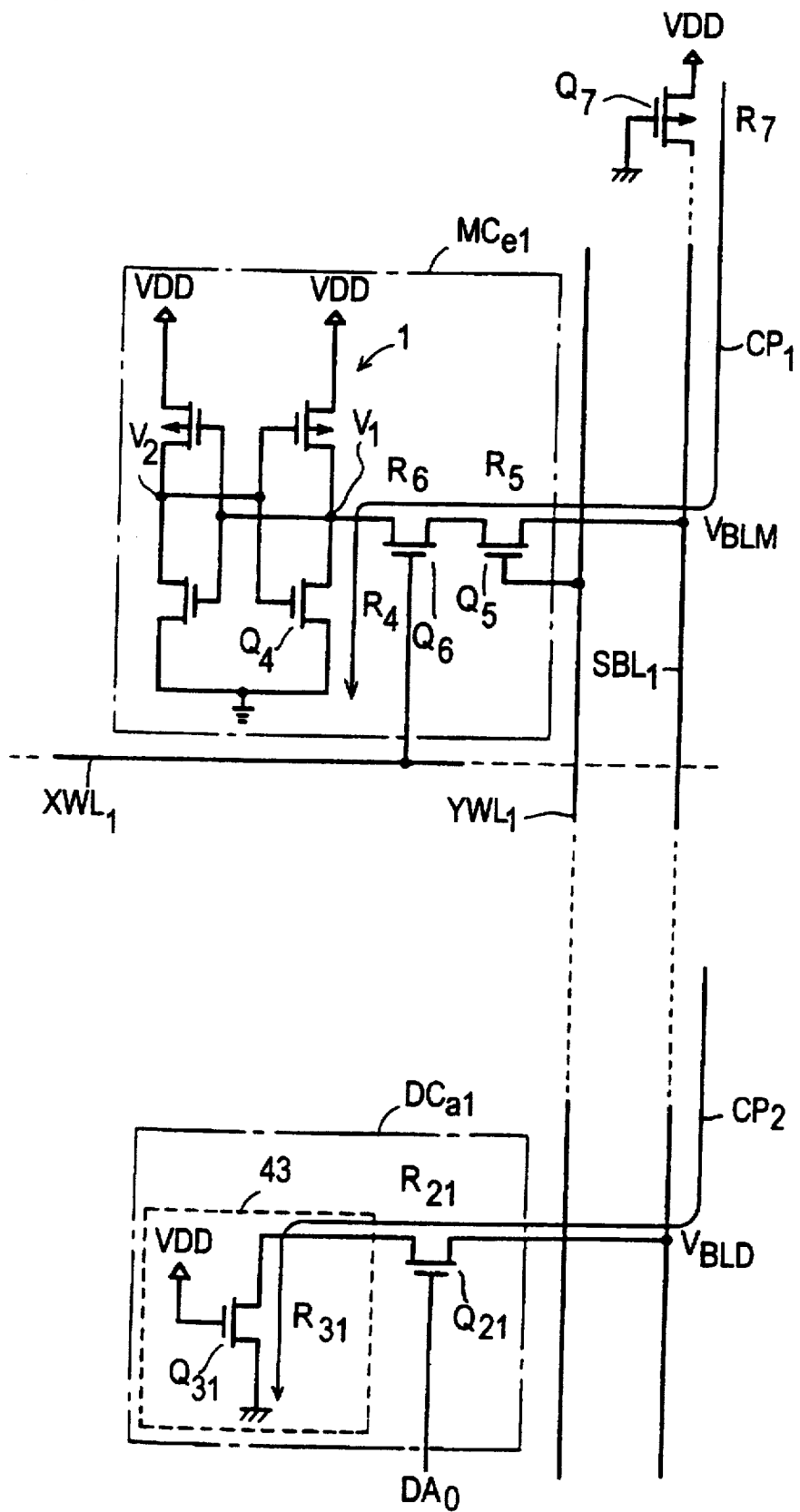
FIG. 59 is a circuit diagram showing an example of a dummy cell of FIG. 58.

FIG. 59 is a circuit diagram showing an example of a dummy cell DCa1 of FIG. 58. Referring to FIG. 59, the dummy cell DCa1 includes NMOS transistors Q21 and Q31 connected in series between the shared bit line BL1 and ground potential. The transistor Q21 has the gate connected to receive the output signal DA0 of the OR gate 42 shown in FIG. 58. Transistor 31 has the gate connected to the supply voltage VDD. The transistor Q31 is equivalent to the transistor circuit 43 shown in FIG. 58. Transistors Q21 and Q31 forming the dummy cell DCa1 are designed as follows so that the differential amplifying operation of the differential amplifier 31 is carried out preferably.

It is assumed that the ON resistances of transistors Q4, Q5, Q6, Q7, Q21 and Q31 of FIG. 59 are R4, R5, R6, R7, R21, and R31, respectively. It is also assumed that the memory cell MCe1 stores a data signal V1 of a low level. Therefore, the transistor Q4 conducts in this Case. When word line signals XWL1 and YWL1 of high levels are applied at a data read out operation, transistors Q5 and Q6 will conduct. Therefore, a current path CP1 is formed from the supply potential VDD to ground potential. As a result, the potential $V_{BLM}$ of the shared bit line SBL1 is expressed as follows.

$$V_{BLM} = \frac{R4 + R5 + R6}{R4 + R5 + R6 + R7} \cdot VDD \quad (11)$$

When an enabling signal DA0 of high level is applied to the dummy cell DCa1, the transistor Q21 conducts so that a current path CP2 is formed from the supply potential VDD towards ground potential. As a result, the potential $V_{BLD}$ of the shared bit line SBL1 is expressed by the following equation.

$$V_{BLD} = \frac{R12 + R31}{R7 + R21 + R31} \cdot VDD \quad (12)$$

In order to realize preferable differential amplification by the differential amplifier 31, the following relationship is established between potentials $V_{BLM}$ and $V_{BLD}$. In other words, the transistors forming the memory cell MCe1 and the dummy cell DCa1 are designed to satisfy the following relationship.

$$V_{BLM} < V_{BLD} \quad (13)$$

The relationship represented by equations (11) and (12) and inequality (13) is established between all the memory cells and dummy cells shown in FIG. 57. Therefore, the amplifying operation by the differential amplifier 31 is carried out as follows.

Figure 60:
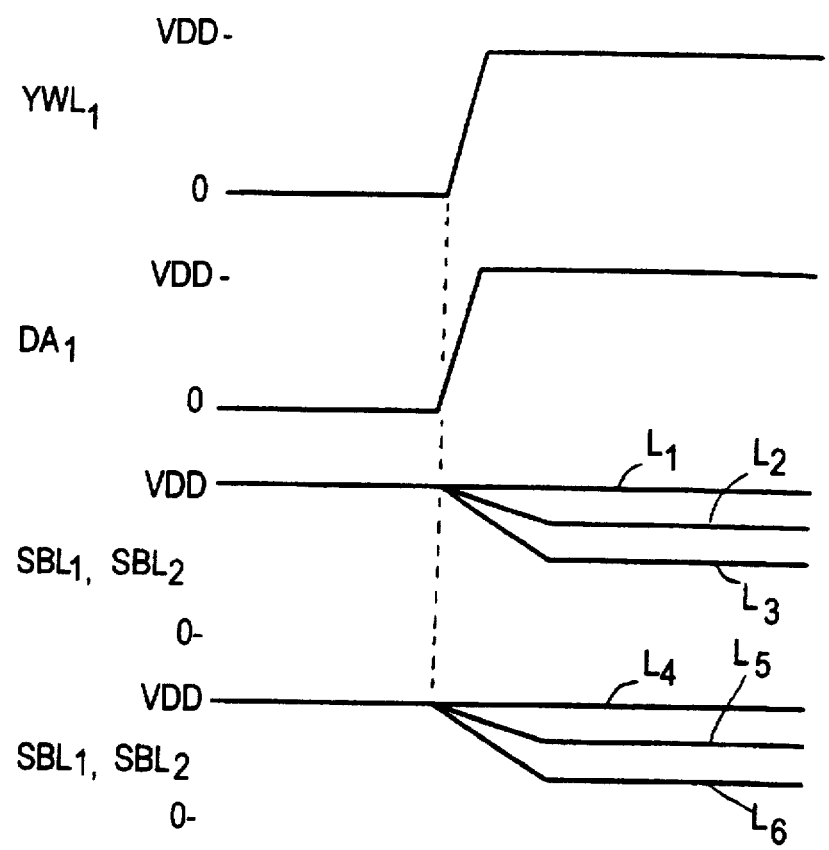
FIG. 60 is a timing chart for describing the operation of the circuit of FIG. 58.

FIG. 60 is a timing chart for describing the operation of the circuit of FIG. 58. Referring to FIGS. 58 and 60, the operation of reading out the data stored in the memory cell MCe1 will be described. Word line signals XWL1 and YWL1 of high levels are applied to select the memory cell MCe1. Therefore, the data signal V1 stored in the data storage circuit 1 is applied to the shared bit line SBL1 until transistors Q5 and Q6 in the memory cell MCe1 are turned off. Therefore, the shared bit line SBL1 is brought to a potential indicated by lines L1 or L3 according to the stored data signal V1.

The OR gate 41 responds to a high level word line signal YWL1 to output a dummy cell enabling signal DA1. The transistor Q22 in the dummy cell DCa2 conducts, whereby the potential of the shared bit line SBL2 changes as shown in line L2. More specifically, all dummy cells are designed so as to apply a voltage intermediate of the voltages represented by lines L1 and L3, i.e. a voltage indicated by line L2, to the shared bit line.

The differential amplifier 31 amplifies the voltage between the shared bit lines SBL1 and SBL2. More specifically, if a data signal V1 of a high level is stored, the differential amplifier 31 amplifies the voltage difference between the lines L1 and L2. If a data signal V2 of high level is stored, the differential amplifier 31 amplifies the voltage difference of the lines L2 and L3.

The case of reading out a data signal stored in the memory cell MCe3 instead of the memory cell MCe1 will be described. Because the two access gate transistors in the memory cell MCe3 conducts, the potential of the shared bit line SBL2 changes as shown by lines L4 and L6 according to the stored data signal. The OR gate 42 responds to a word line signal YWL3 of a high level to provide a high level dummy cell enabling signal DA0. The transistor Q21 is turned on to enable the dummy cell DCa1. As a result, the potential of the shared bit line SBL1 changes as shown by the line L5.

The differential amplifier 31 amplifies the voltage difference between lines L4 and L5, or lines L5 and L6. It is to be noted that the data signals amplified by the differential amplifier 31 are inverted with respect to each other even if the same data signals are stored in memory cells MCe1 and MCe3. Therefore, a data signal according to a same logic can be read out by inverting the data signal read out via the shared bit line SBL2 of an even number order using an inverting circuit not shown.

Figures 61A, 61B:
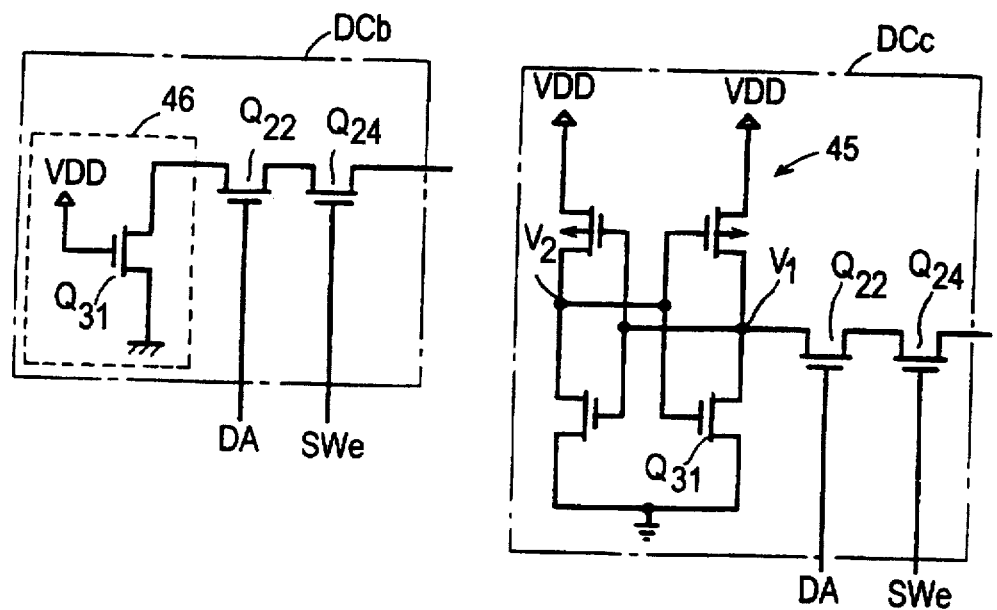
FIGS. 61A-61B are circuit diagrams showing another example of the dummy cell of FIG. 58.

FIG. 61 is circuit diagram showing another example of the dummy cell of FIG. 58. Referring to FIG. 61(a), the dummy cell DCb includes NMOS transistors Q24, Q22 and Q31 connected in series between a shared bit line (not shown) and the ground potential. The transistor Q22 has the gate connected to receive the dummy cell enabling signal DA. The transistor Q24 has the gate connected to receive the write enable signal Swe. The dummy cell DCb has the transistor designed to satisfy the relationship of the above-described inequality (13) assuming that the sum of the ON resistances of transistors Q22 and Q24 is R21.

The dummy cell DCc of FIG. 61(b) has a circuit configuration identical to that of a normal memory cell. However, the dummy cell DCc has the transistor designed to satisfy inequality (13) assuming that the sum of the ON resistances of transistors Q22 and Q24 is R21. Therefore, an amplifying operation by the differential amplifier 31 such as that shown in FIG. 60 can be carried out by using any of dummy cells DCb and DCc shown in FIGS. 61(a) and (b).

Figure 62:
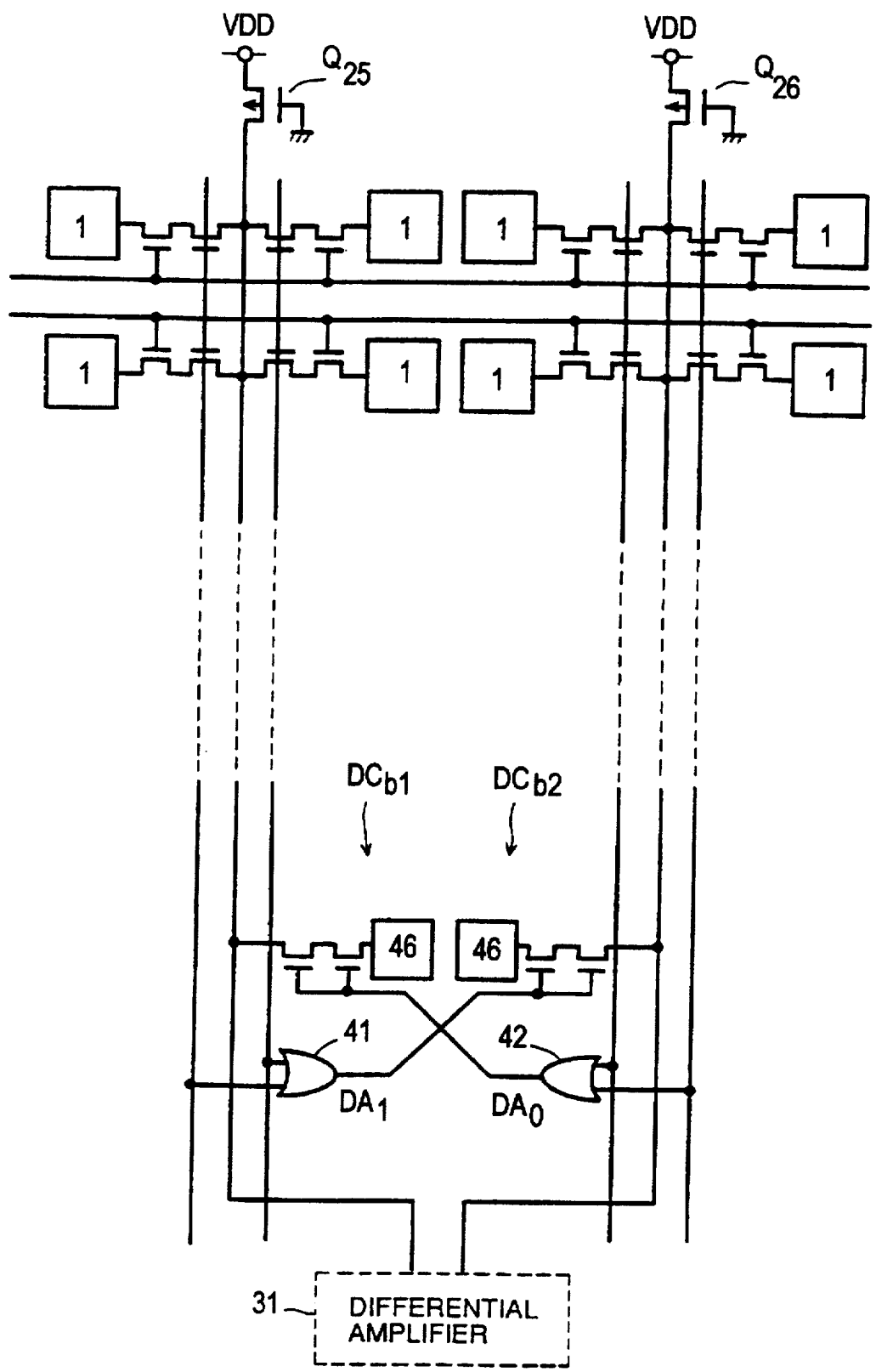
FIGS. 62-65 are circuit diagrams of a dummy cell control circuit showing yet a still further embodiment of the present invention.

FIG. 62 is a circuit diagram of a dummy cell control circuit showing another embodiment of the present invention. Referring to FIG. 62, the dummy cell circuit DCb shown in FIG. 61(a) is employed as each of dummy cells DCb1 and DCb2. Dummy cell enabling signals DA0 and DA1 are applied to the gate electrodes of the two access gate transistors in each of dummy cells DCb1 and DCb2 from the OR gates 42 and 41, respectively. Because the number of access gate transistors in an ordinary memory cell and a dummy cell are identical in the embodiment of FIG. 62, common structural characteristics can be obtained to facilitate the design.

Figure 63:
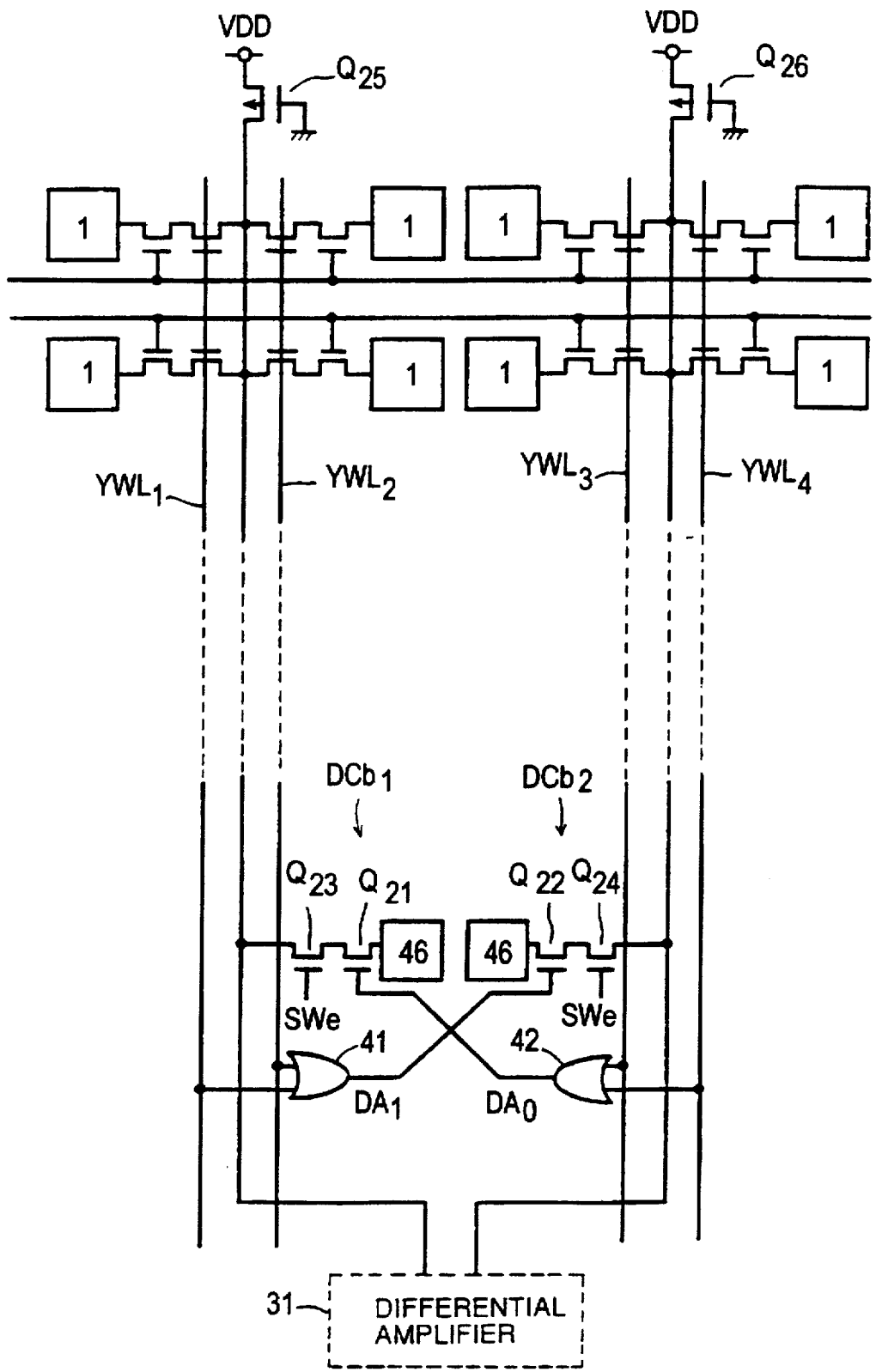

FIG. 63 is a circuit diagram showing a dummy cell control circuit according to a further embodiment of the present invention. Referring to FIG. 63, two access gate transistors Q21 and Q23, and Q22 and Q24 are employed in each of dummy cells DCb1 and DCb2. Dummy cell enabling signals DA0 and DA1 are applied to the gates of transistors Q21 and Q22, respectively. A write enable signal Swe is applied to the gates of transistors Q23 and Q24.

In data reading operation, a signal Swe of high level is applied to turn on transistors Q23 and Q24. Therefore, an operation basically similar to that of the circuit shown in FIG. 58 is carried out. In data writing operation, a signal Swe of low level is applied to turn off transistors Q23 and Q24. Therefore, a current path will not be formed via dummy cells DCb1 and DCb2 even if signals YWL1-YWL4 of a high level are applied to prevent consumption of unnecessary power.

Figure 64:
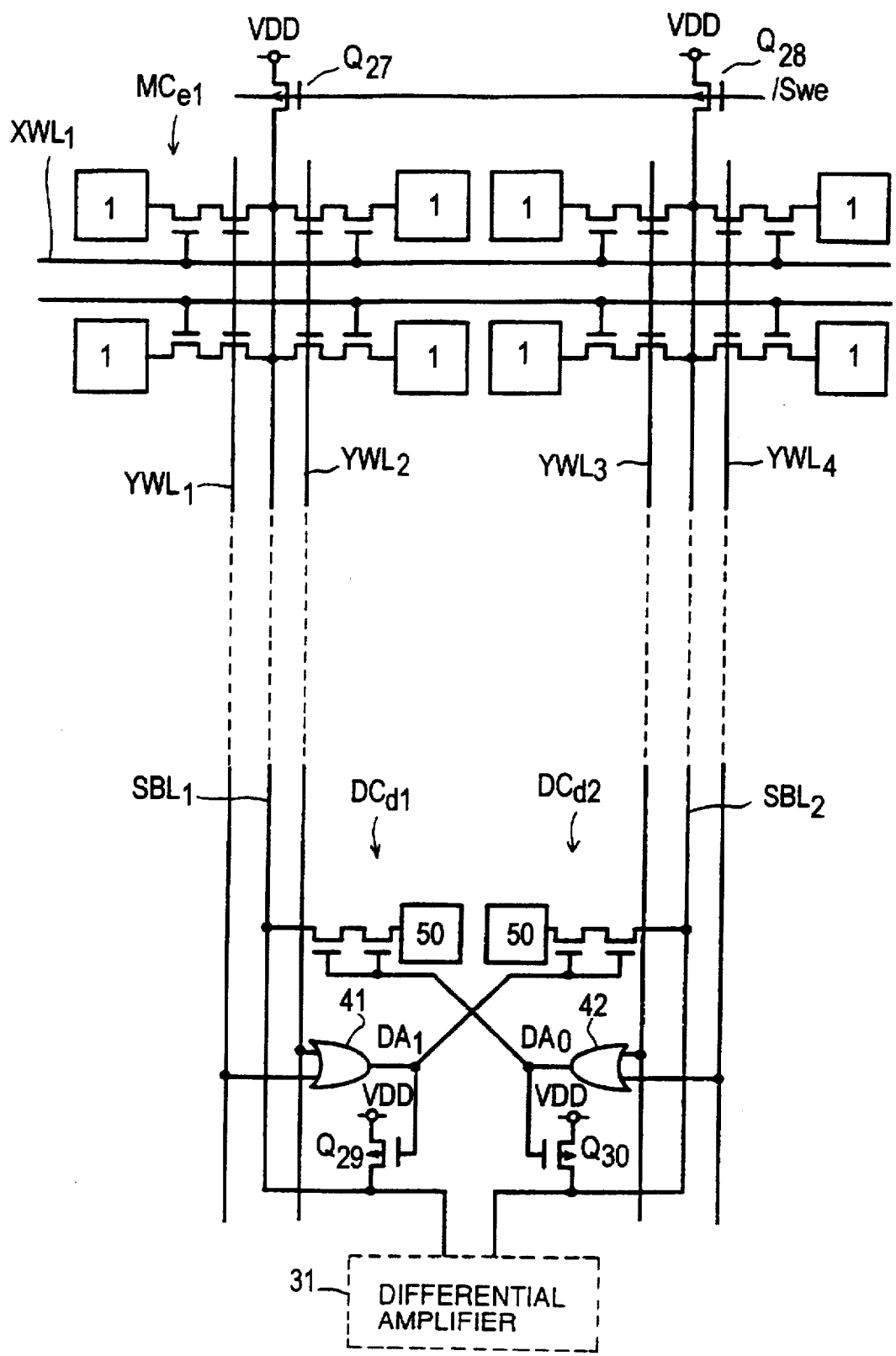

FIG. 64 is a circuit diagram of a dummy cell control circuit Showing yet another embodiment of the present invention. Referring to FIG. 64, PMOS transistors Q27 and Q28 as bit line loads are connected between the supply potential VDD and shared bit lines SBL1 and SBL2. Transistors Q27 and Q28 have their gates connected to receive a write enable signal /Swe. Because a signal /Swe of a low level is applied in data reading operation, transistor Q27 and Q28 function as bit line loads. At the time of data writing, a signal /SWE of high level is provided, so that transistors Q27 and Q28 are turned off.

Each of dummy cells DCd1 and DCd2 has circuit characteristics similar to that of an ordinary memory cell MCe1. That is to say, in the embodiment of FIG. 64, the aforementioned relationship represented by equations (11) and (12) and inequality (13) is not established between an ordinary memory cell and a dummy cell. Instead of these relationships, the following improvements are applied to realize a differential amplifying operation by the differential amplifier 31.

As additional bit line loads, PMOS transistors Q29 and Q30 are connected between the supply potential VDD and the shared bit lines SBL1 and SBL2. The gate of the transistor Q29 receives an output signal DA1 of the OR gate 41. The gate of the transistor Q30 receives an output signal DA0 of the OR gate 42.

Reading out the data stored in the memory cell MCe1 will be described hereinafter. In response to word line signals XWL1 and YWL1 of high level, the data signal stored in the memory cell MCe1 is provided to the shared bit line SBL1. The OR gate 41 responds to a signal YWL1 of a high level to provide a signal DA1 of high level. Therefore, transistor Q29 is turned off and the two access gate transistors of the dummy cell DCd2 are turned on. Because the OR gate 42 provides a signal DA0 of a low level, the transistor Q30 is turned on.

Therefore, although the bit line load of the shared bit line SBL1 is only the transistor Q27, the bit line load of the shared bit line SBL2 is added to transistors Q28 and Q30. As a result, the potential of the shared bit line SBL2 is brought to an intermediate potential indicated by the line L2 in FIG. 60. More specifically, bit line load transistors Q27, Q28, Q29 and Q30 are designed to apply an intermediate potential shown by the line L2 of FIG. 60 to the shared bit lines SBL1 and SBL2. Thus, a preferable differential amplifying operation by the differential amplifier 31 can be realized.

When none of the memory cells shown in FIG. 64 is accessed, the OR gates 41 and 42 provide output signals DA1 and DA0 of low level. Therefore, transistors Q27 to Q30 act as the bit line loads of the shared bit lines SBL1 and SBL2. This contributes to stabilized the potential of the shared bit line connected to the memory cells that are not accessed.

Figure 65:
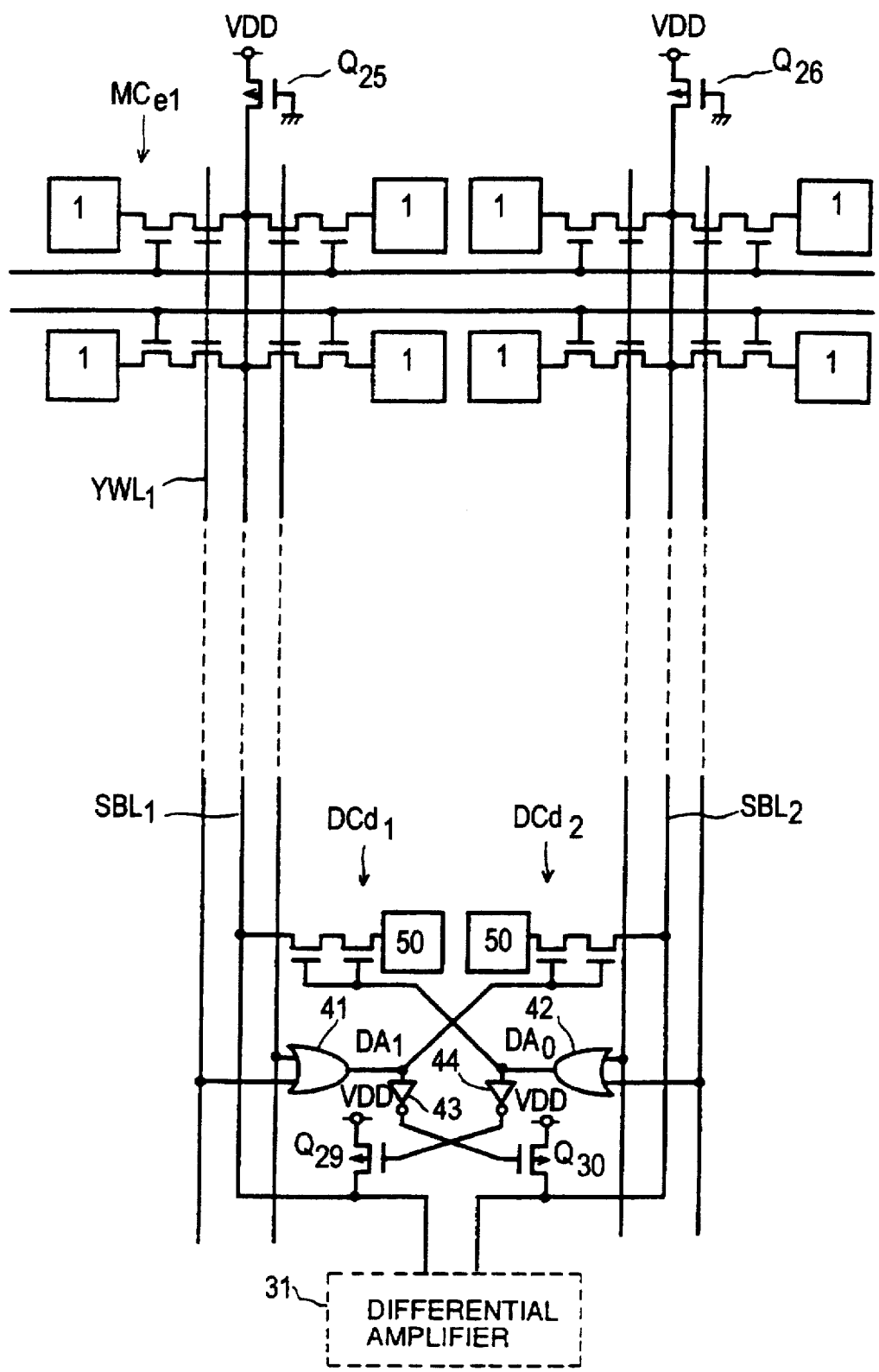

FIG. 65 is a circuit diagram of a dummy cell control circuit showing another embodiment of the present invention. Referring to FIG. 65, the bit line load transistors Q25 and Q26 have their gates grounded. The gate of the added bit line load transistor Q29 receives a signal /DA0 inverted by an inverter 44. The gate of the added load transistor Q30 receives a signal /DA1 inverted by an inverter 43. Each of dummy cells DCd1 and DCd2 in this embodiment has circuit characteristics identical to that of a normal memory cell.

When the memory cell MCe1 is accessed in data read out operation, the OR gate 41 provides a signal DA1 of a high level. The transistor Q30 is turned on in response to a signal /DA1 of a low level. More specifically, the transistor Q30 conducts in response to a word line signal YWL1 of a high level. Therefore, the present embodiment has the bit line load of the shared bit line SBL2 added, so that the potential of the shared bit line SBL2 can be changed to that shown by the line L2 of FIG. 60. Thus, a preferable differential amplifying operation by the differential amplifier 31 can be carried out.

Figure 66:
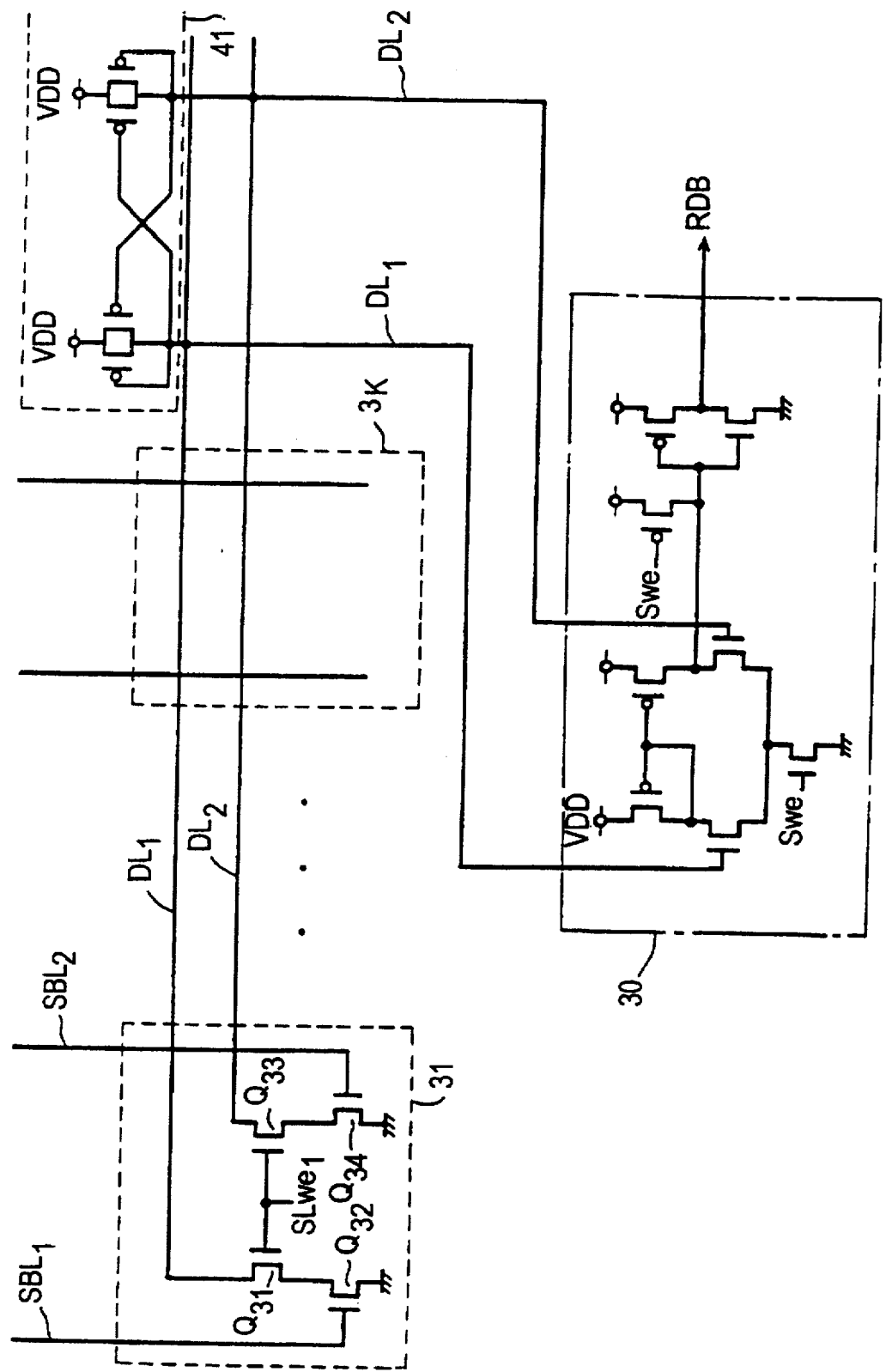
FIG. 66 is a circuit diagram of a differential amplifier and a sense amplifier of FIG. 57.

FIG. 66 is a circuit diagram of the differential amplifier 31 and the sense amplifier 30 shown in FIG. 57. Referring to FIG. 66, the circuit 31 includes NMOS transistors Q31 and Q32 connected in series between a data transmission line DL1 and ground potential, and NMOS transistor Q33 and Q34 connected in series between a data transmission line DL2 and ground potential. Transistors Q32 and Q34 have their gates connected to shared bit lines SBL1 and SBL2, respectively. Transistors Q31 and Q33 are connected so as to receive a control signal SLwe1 for enabling the differential amplifier 31. The control signal SLwe1 is generated from a logic circuit not shown using the signal Swe for activating the sense amplifier 30 and a row address signal.

The data transmission lines DL1 and DL2 are connected to each of differential amplifiers 31 to 3k. The shared circuit 40 is shared by circuits 31-3k via data transmission lines DL1 and DL2. For example, when a signal SLwe1 of high level is provided, the differential amplification between the shared bit lines SBL1 and SBL2 is carried out by a combination of circuits 31 and 40.

The sense amplifier 30 of the succeeding stage is activated in response to a sense amplifier activation signal Swe of high level to amplify differentially the data signal applied via the data transmission lines DL1 and DL2. When a signal Swe of low level is provided, i.e. in writing operation, the sense amplifier 30 provides a signal RDB of a low level.

Figure 67:
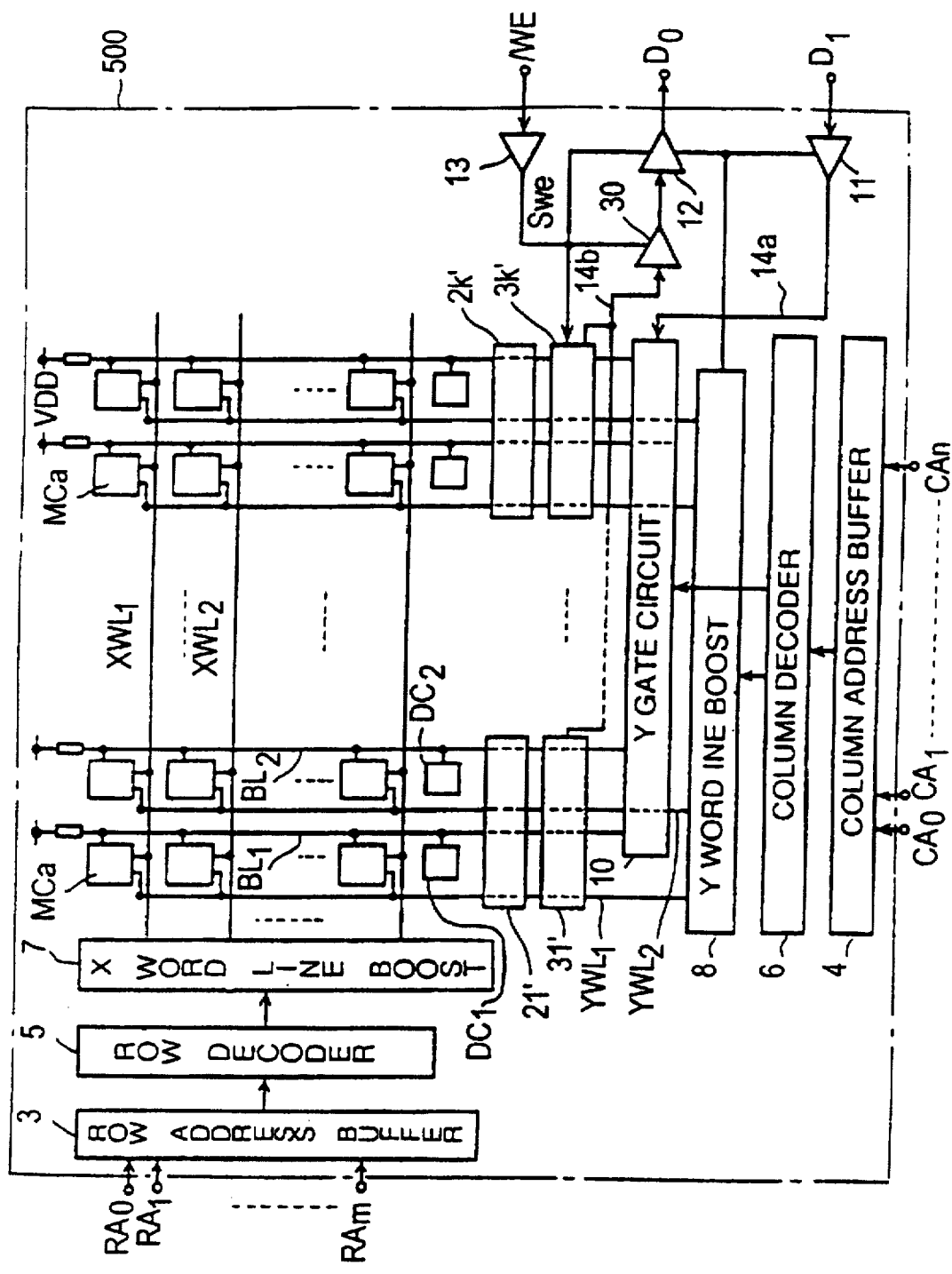
FIG. 67 is a block diagram of a SRAM showing another embodiment of the present invention.

FIG. 67 is a block diagram showing a SRAM according to another embodiment of the present invention. The SRAM 500 of FIG. 67 differs from the SRAM 400 in FIG. 57 having shared bit lines SBL1, SBL2, . . . in that a similar improvement is applied without sharing the bit line. More specifically, dummy cells DC1, DC2, . . . are connected to each bit lines BL1, BL2, . . . , respectively. A dummy cell control circuit 21' is provided for every two bit lines BL1 and BL2. The differential amplifier 31' is provided for every two bit lines BL1 and BL2 to amplify differentially the voltage between bit lines BL1 and BL2.

Figure 68:
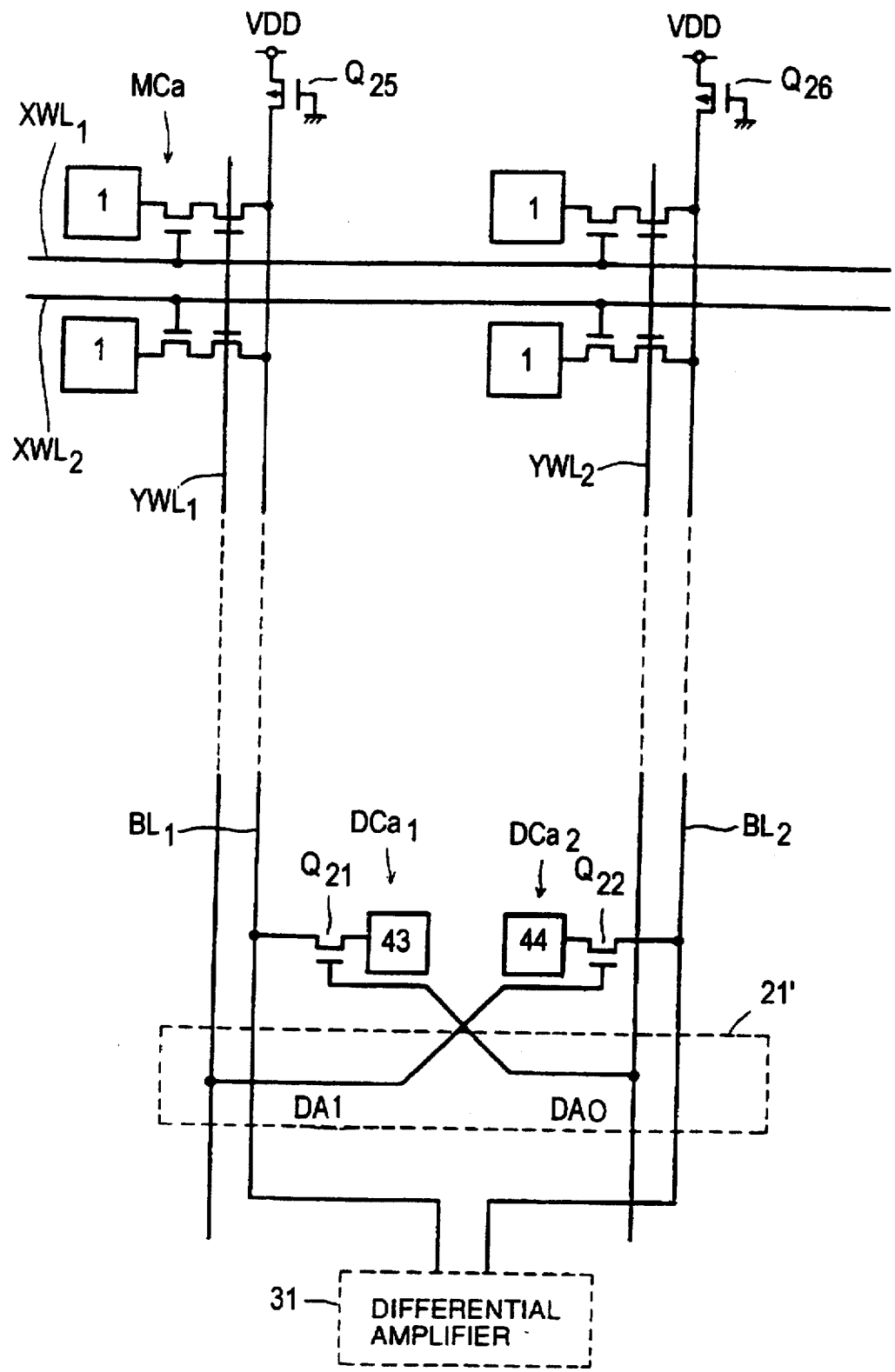
FIG. 68 is a circuit diagram of a dummy cell control circuit of FIG. 67.

FIG. 68 is a circuit diagram of one dummy cell control circuit 31' shown in FIG. 67. The circuit shown in FIG. 68 basically operates as that of the circuit shown in FIG. 58, and will not be repeated.

The embodiments shown in FIGS. 57–68 are described for improving the speed in data readout operation. In the following, improvement for increasing the speed in data writing will be described.

Referring to FIG. 2 again, PMOS transistors Q1 and Q2 have a low mutual conductance because they are respectively formed of a TFT. In other words, transistor Q1 and Q2 have a low current applying capability (or current driving capability). When transistor Q1 and Q2 begin to conduct, the inversion of the data storage state of the data storage circuit 1 is time consuming since the current flowing to transistors Q1 and Q2 is low. Driving transistors Q3 and Q4 have a mutual conductance or a current providing capability greater than that of the TFTs Q1 and Q2 because they are respectively formed of a normal NMOS transistor (i.e. a bulk transistor formed within the semiconductor substrate).

In data writing operation, when a data signal of high level is provided from the bit line BL via transistors Q6 and Q5, the transistor Q3 is quickly turned on. Therefore, the voltage V2 rapidly attains a low level. Therefore, in this case, the data storage state of the data storage circuit 1 can be changed rapidly.

The following problem is encountered when a data of low level is provided from the bit line BL via transistors Q6 and Q5. The TFT Q1 begins to conduct in response to a voltage V1 of low level. However, the change of the voltage V2 from a low level to a high level is time consuming since the current providing capability of the transistor Q1 is low as described before. In other words, the voltage V2 cannot rapidly change to a high level. This means that the data writing time is increased in a writing operation of a data signal of low level. The following improvement is proposed to solve this problem.

The transistor Q1 is designed to have a mutual conductance (or current providing capability, current driving capability) higher than that of the transistor Q2. The parameter β representing the current driving capability of a MOS transistor is generally expressed by the following equation.

$$\beta = \frac{\mu \cdot \epsilon}{Tox} \cdot \frac{W}{L} \quad (14)$$

where W is the channel width, L the channel length of the MOS transistor, μ the surface mobility in the channel, ε the permittivity of the gate insulation film, and Tox the thickness of the gate oxide film.

Because μ·ε/Tox is determined by the process conditions in the manufacturing of a MOS transistor, the current driving capability, i.e. β can be increased by increasing the ratio W/L. However, if the ratio W/L of the transistor Q2 is also increased as the transistor Q1, there is a possibility of the occupying area of the memory cell on the semiconductor substrate being increased. Therefore, transistors Q1 and Q2 are designed to satisfy the following relationship in order to increase the current driving capability of the transistor Q1 without increasing the occupying area of the memory cell.

$$W1/L1 > W2/L2 \quad (15)$$

where W1 and L1 are the channel length and channel width, respectively, of the transistor Q1, and W2 and L2 are the channel width and channel length of the transistor Q2, respectively.

According to another improvement for reducing the time required for writing a data signal of low level, the threshold voltage Vth4 of the transistor Q4 is designed to a low value. The precision in manufacturing large scaled integrated circuits have come to the level of submicron regions, so that the threshold voltage of a MOS transistor is affected by the channel width and channel length of a short channel effect and/or a strong channel effect. In general, the threshold voltage Vth is reduced as the channel length L of a MOS transistor becomes smaller, and the threshold voltage Vth is increased as the channel width W becomes smaller.

Therefore, the channel width W4 of the transistor Q4 is increased, and/or the channel length L4 of the transistor Q4 is decreased to reduce the threshold voltage Vth4 of the transistor Q4. However, if the channel width W3 is increased or the channel length L3 decreased in the transistor Q3 as in the transistor Q4, there is a possibility of the occupying area of the memory cell being increased. Therefore, in order to prevent increase in the occupying area of the memory cell, transistors Q3 and Q4 are designed to satisfy the following relationship.

$$W3 < W4 \quad (16)$$

or $$L3 > L4 \quad (17)$$

$$\therefore Vth3 > Vth4 \quad (18)$$

Transistors Q3 and Q4 are designed to satisfy both of inequalities (16) and (17). Therefore, although the relationship expressed by the inequality (18) is provided to transistors Q3 and Q4, decrease in the threshold voltage of the transistor Q4 improves the data writing operation speed as follows.

Figure 69:
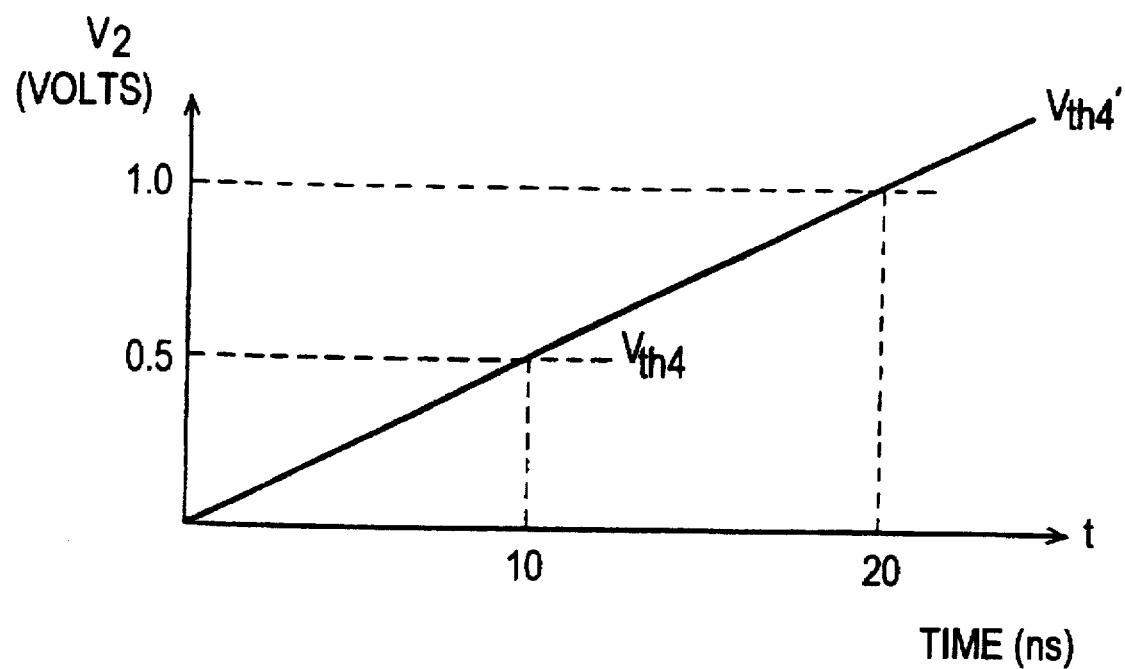
FIG. 69 is a graph showing the relationship between voltage V2 and time in a memory cell circuit of FIG. 2.

FIG. 69 is a graph showing the relationship between the voltage V2 and the elapse of time in the memory cell circuit MCa of FIG. 2. Referring to FIG. 69, the ordinate represents a change in the voltage V2 (volts) and the abscissa indicates the elapse of time t (ns). It is assumed that a current of 0.5 μA flows when the transistor Q1 is conductive. It is also assumed that the common connection node (i.e. node V2) of transistors Q1 and Q3 has a capacitance of 10 fF. The graph of FIG. 69 shows the rise in the voltage of the node V2 since the transistor Q1 conducts.

It can be appreciated from FIG. 69 that the voltage V2 attains 0.5 volts when a time of 10 ns elapses. The voltage V2 is 1.0 volts at the time of 20 ns. Therefore, assuming that the threshold voltage Vth4' of the transistor Q4 is 1.0 volts, a time period of 20 ns is required for the transistor Q4 to conduct. If the threshold voltage Vth4 of the transistor Q4 is set to a lower voltage of 0.5 volts, only 10 ns is required for the transistor Q4 to conduct. This means that the time required for inverting the data storage state in the data storage circuit 1 can be reduced by 10 ns by setting the threshold voltage of the transistor Q4 to a lower value by 0.5 volts.

Figure 70:
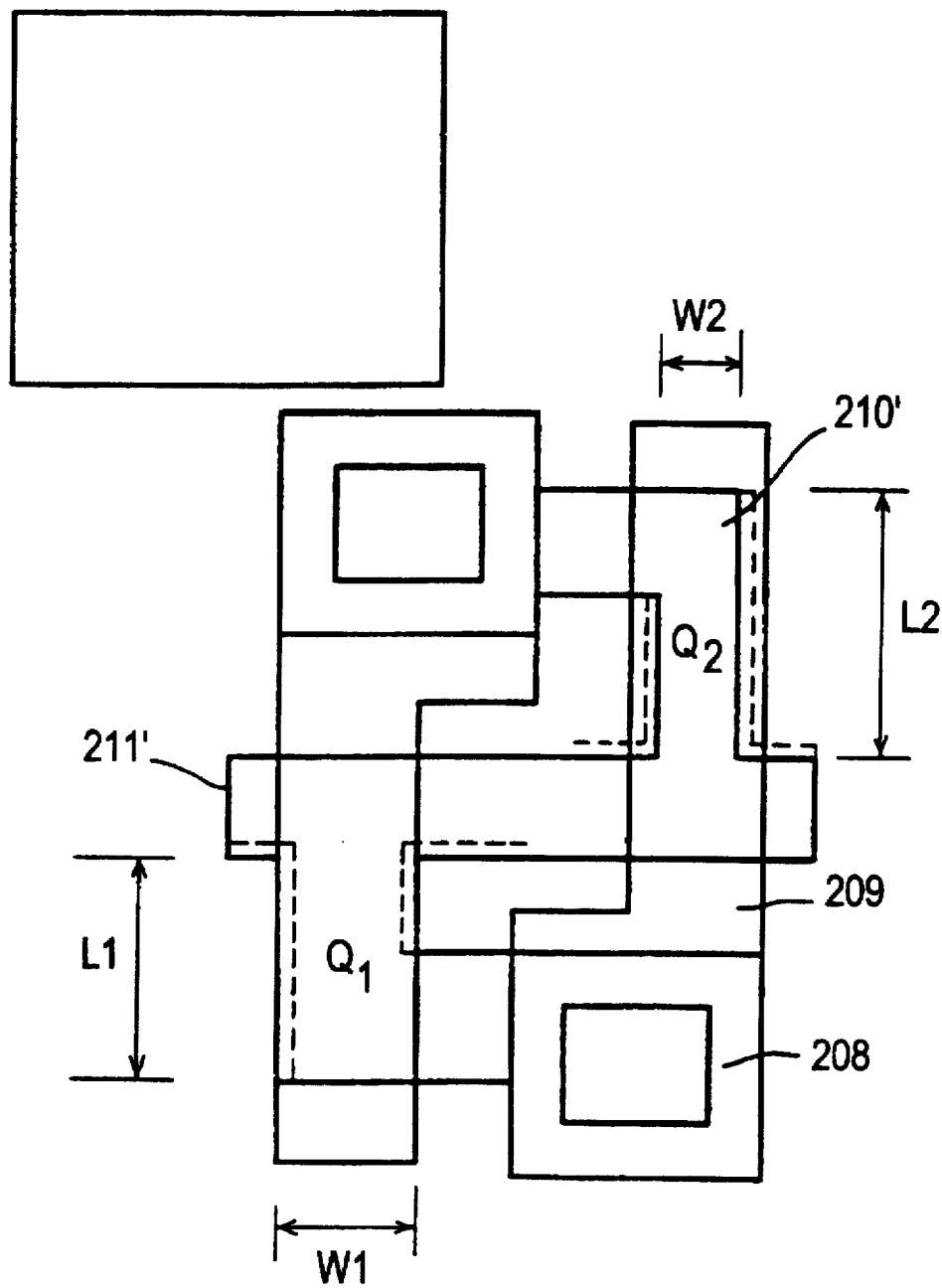
FIG. 70 is a layout diagram showing an example of designs of transistors and Q2 satisfying inequality (15).

FIG. 70 is a layout diagram showing a design example of transistors Q1 and Q2 satisfying inequality (15). The layout shown in FIG. 70 corresponds to that of the already described FIG. 53. In FIG. 70, the layout shown in FIG. 53 is indicated by a broken line.

Figure 71:
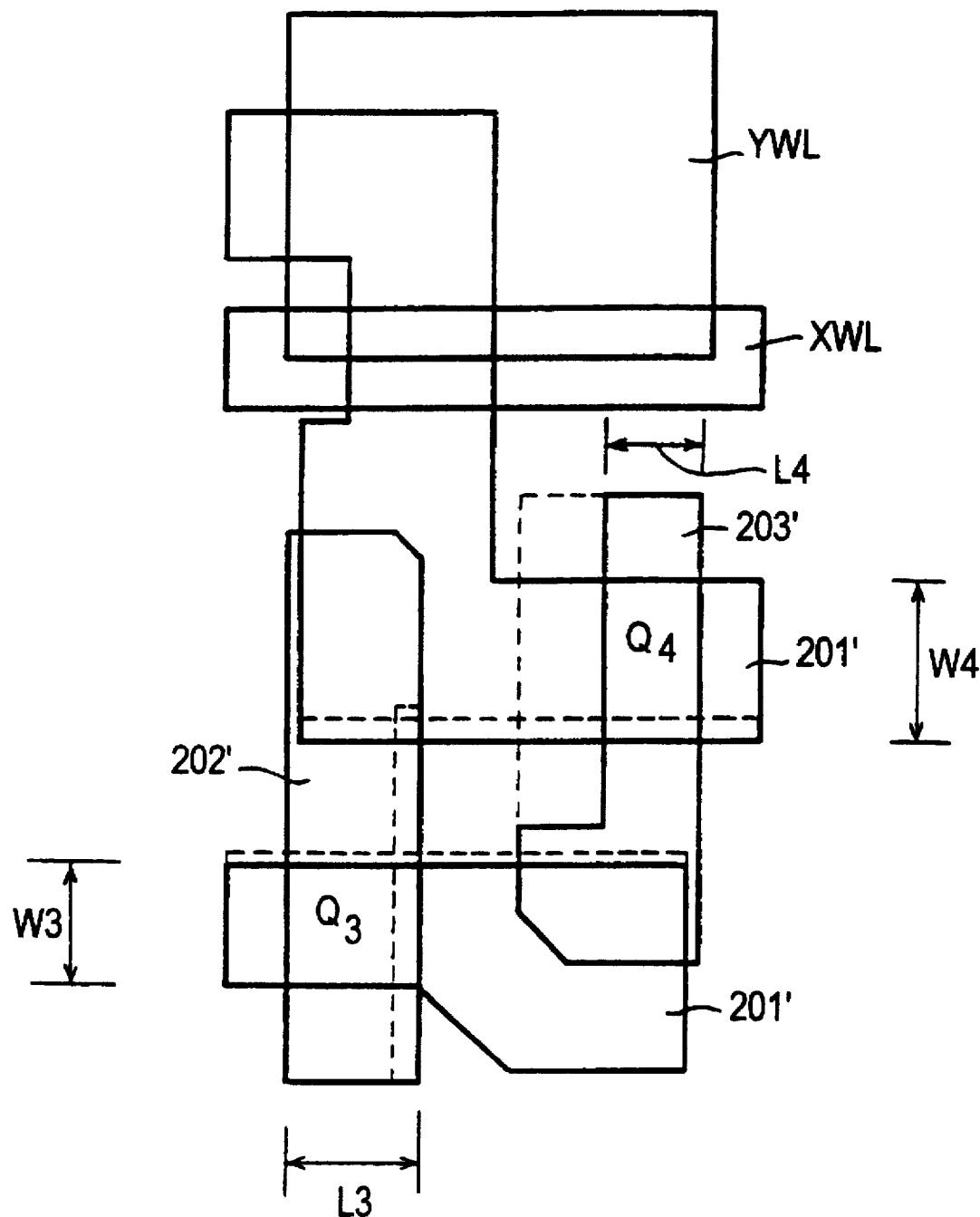
FIG. 71 is a layout diagram showing an example of designs of transistors Q3 and Q4 satisfying inequalities (16) and (17).

FIG. 71 is a layout diagram showing a design example of transistors Q3 and Q4 satisfying inequalities (16) and (17). The layout shown in FIG. 71 corresponds to the layout already described in FIG. 51. In FIG. 71, the layout shown in FIG. 51 is indicated by a broken line.

Thus, by applying the memory cells shown in FIGS. 2, 11, 13 and 15 to a SRAM having a single bit line configuration, a SRAM can be obtained that carries out data writing only in the desired memory cells. That is to say, each memory cell includes two access gate transistors provided between a single bit line and a data storage circuit 1, whereby the gate voltage of the two access gate transistors of a desired memory cell is raised in a writing operation. Therefore, data writing is carried out with respect to only the desired memory cell. Particularly, the beta ratio βr between the driver transistor Q4 of the data storage circuit i and the access gate transistor equivalent to a combination of two access gate transistors Q5 and Q6 is designed to satisfy the relationship of 0.2≦βr≦1.0, so that the characteristics shown in FIG. 7 are provided to each memory cell. More specifically, each memory cell is brought to a stable data storing state when data reading is carried out, and brought to an unstable state when data writing is carried out.

Because the two access gate transistors provided in each memory cell can be formed in close proximity on a semiconductor substrate 50 as shown in FIG. 20, a memory cell having a structure suitable for larger scale integration can be obtained as shown in FIG. 50. The two access gate transistors can be formed by any of the first–eleventh manufacturing methods, as described above.

Furthermore, the embodiments shown in FIGS. 57–68 are provided with a sense amplifier circuit that amplifies differentially the voltage difference between shared bit lines or bit lines, so that the speed of the data reading operation can be further improved. The embodiments shown in FIGS. 70 and 71 have transistors Q1 to Q4 designed to satisfy the inequalities of (15)–(18), so that the speed of the data writing operation can be carried out at a higher speed.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A static random access memory device, comprising:
   a memory cell array including a plurality of memory cells arranged in a plurality of rows and columns,
   a plurality of bit lines, each being provided in a corresponding column in said memory cell array and connected to a memory cell in said corresponding column,
   wherein each of said memory cells comprises
      data storage means having a single input/output node for storing a data signal provided via said input/output node,
      switching means connected between a bit line of a corresponding column and said input/output node for conducting in response to row and column address signals,
   a plurality of dummy cells, each being connected to one corresponding bit line of said plurality of bit lines,
   a plurality of differential sense amplifier means, each being provided for every two adjacent columns in said memory cell array and connected between two corresponding bit lines of said plurality of bit lines,
   a plurality of dummy cell enabling means, each being provided for every two adjacent columns in said memory cell array and responsive to a column address signal selecting one of said two corresponding bit lines of said plurality of bit lines for enabling a dummy cell connected to the other of said two corresponding bit lines.

2. A static random access memory device, comprising:
   a memory cell array including a plurality of memory cells arranged in a plurality of rows and columns,
   a plurality of shared bit lines, each being provided for every two corresponding columns in said memory cell array and connected to a memory cell in said corresponding two columns,
   wherein each of said memory cells comprises
      data storage means having a single input/output node for storing a data signal provided via said input/output node,
      switching means connected between a shared bit line in two corresponding columns and said input/output node for conducting in response to row and column address signals,
   a plurality of dummy cells, each being connected to a corresponding one of said plurality of shared bit lines,
   a plurality of differential sense amplifier means, each being provided for every four adjacent columns in said memory cell array and connected between corresponding two shared bit lines of said plurality of shared bit lines,
   a plurality of dummy cell enabling means, each being provided for every four adjacent columns in said memory cell array and responsive to a column address signal selecting one of two corresponding shared bit lines of said plurality of shared bit lines for enabling a dummy cell connected to the other of said two corresponding shared bit lines.

* * * * *

UNITED STATES PATENT AND TRADEMARK OFFICE
CERTIFICATE OF CORRECTION

PATENT NO.  :  5,694,354
DATED       :  December 2, 1997
INVENTOR(S) :  Kenji ANAMI, et al It is certified that error appears in the above-identified patent and that said Letters Patent is hereby corrected as shown below:

```
     Assignee:
     On the cover page, at [75], after "Kojiro
Yuzuriha," insert --Tadato Yamagata,--.
```

Signed and Sealed this

Tenth Day of March, 1998

Attest:

BRUCE LEHMAN

*Attesting Officer*    *Commissioner of Patents and Trademarks*